(12) United States Patent
Miyachi et al.

(10) Patent No.: US 12,160,144 B2
(45) Date of Patent: Dec. 3, 2024

(54) ELECTRONIC DEVICE COMPRISING SEMICONDUCTOR MODULE

(71) Applicant: DENSO CORPORATION, Kariya (JP)

(72) Inventors: Syuhei Miyachi, Kariya (JP); Atsushi Saitou, Kariya (JP); Toshihiro Fujita, Kariya (JP); Noboru Nagase, Kariya (JP)

(73) Assignee: DENSO CORPORATION, Kariya (JP)

( * ) Notice: Subject to any disclaimer, the term of this patent is extended or adjusted under 35 U.S.C. 154(b) by 274 days.

(21) Appl. No.: 17/660,001

(22) Filed: Apr. 20, 2022

(65) Prior Publication Data

US 2022/0247283 A1 Aug. 4, 2022

Related U.S. Application Data

(63) Continuation of application No. PCT/JP2020/040004, filed on Oct. 23, 2020.

(30) Foreign Application Priority Data

Oct. 25, 2019 (JP) .................................. 2019-194218
Oct. 15, 2020 (JP) .................................. 2020-174268

(51) Int. Cl.
*H05K 1/18* (2006.01)
*H02K 9/22* (2006.01)
*H02K 11/33* (2016.01)
*B62D 5/04* (2006.01)

(52) U.S. Cl.
CPC .............. *H02K 11/33* (2016.01); *H02K 9/22* (2013.01); *H05K 1/181* (2013.01); *B62D 5/04* (2013.01); *H05K 2201/1009* (2013.01)

(58) Field of Classification Search
CPC .......... H02K 11/33; H02K 9/22; H05K 1/181; H05K 2201/1009; B62D 5/04
See application file for complete search history.

(56) References Cited

U.S. PATENT DOCUMENTS

| 5,657,284 | A | * | 8/1997 | Beffa | G11C 29/50 365/201 |
| 8,963,315 | B2 | * | 2/2015 | Fukuoka | H01L 21/56 257/691 |
| 2004/0012064 | A1 | * | 1/2004 | Yoshizaki | H01L 25/072 257/E23.101 |
| 2018/0201302 | A1 | * | 7/2018 | Sonoda | H02K 11/33 |
| 2020/0023886 | A1 | * | 1/2020 | Yatsugi | B62D 5/0406 |

FOREIGN PATENT DOCUMENTS

JP WO 2010067725 A1 * 6/2010 ........... H05K 1/0203

OTHER PUBLICATIONS

English translation of WO 2010067725 (Year: 2010).*

* cited by examiner

*Primary Examiner* — Mukundbhai G Patel
(74) *Attorney, Agent, or Firm* — MASCHOFF BRENNAN

(57) ABSTRACT

An electronic device includes: a wiring board; an electric connection wiring connected to a power supply; motor connection wirings arranged on a peripheral side of the wiring board and connected to the electric motor; and semiconductor modules having semiconductor elements and a resin mold. The semiconductor modules are arranged at a position on the electric connection wiring or on the peripheral side of the electric connection wiring and on a center side of the motor connection wiring. At least a part of electrodes of the plurality of semiconductor modules is mounted on the electric connection wiring.

18 Claims, 28 Drawing Sheets

ELECTRONIC DEVICE COMPRISING SEMICONDUCTOR MODULE

CROSS REFERENCE TO RELATED APPLICATION

The present application is a continuation application of International Patent Application No. PCT/JP2020/040004 filed on Oct. 23, 2020, which designated the U.S. and claims the benefit of priority from Japanese Patent Applications No. 2019-194218 filed on Oct. 25, 2019 and No. 2020-174268 filed on Oct. 15, 2020. The entire disclosures of all of the above applications are incorporated herein by reference.

TECHNICAL FIELD

The present disclosure relates to an electronic device including a semiconductor module.

BACKGROUND

A conceivable technique teaches a wiring board including two systems of electric power conversion circuits for driving and controlling an electric motor in an electric power steering device. The two systems of the electric power conversion circuits are arranged substantially symmetrically with respect to the center line of the wiring board, and are arranged adjacent to each other so as to provide a positive electrode side power supply path on the center side and a negative electrode side power supply path on the peripheral side. Further, a terminal portion is arranged on the peripheral edge thereof.

SUMMARY

According to an example, an electronic device may include: a wiring board; an electric connection wiring connected to a power supply; motor connection wirings arranged on a peripheral side of the wiring board and connected to the electric motor; and semiconductor modules having semiconductor elements and a resin mold. The semiconductor modules are arranged at a position on the electric connection wiring or on the peripheral side of the electric connection wiring and on a center side of the motor connection wiring. At least a part of electrodes of the plurality of semiconductor modules is mounted on the electric connection wiring.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
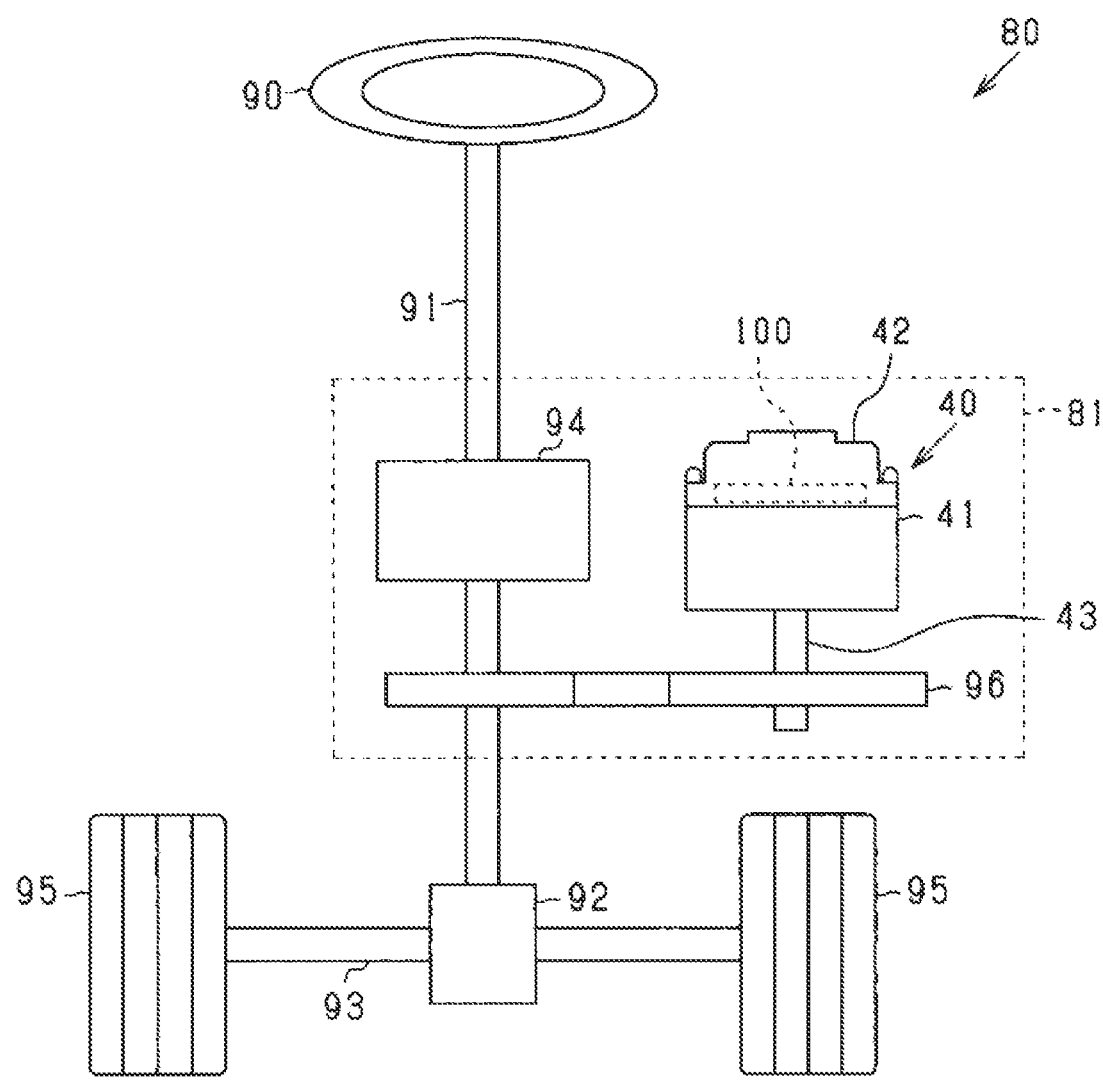
FIG. 1 is a schematic diagram showing an example of an electric power steering system to which the electronic device according to the first embodiment is applied.

In the wiring board of the conceivable technique, the high potential side MOSFET, the low potential side MOSFET, and the phase relay MOSFET, which are installed as switching elements constituting the power conversion circuit, are individually packaged in three semiconductor modules. Therefore, in order to connect the three semiconductor modules, it is necessary to arrange a wiring around the semiconductor modules, and the impedance and inductance are increased by the wiring. In addition, it is necessary to secure a space for arranging the wiring on the wiring board.

In view of the above, a technique is provided for simplifying a wiring and the like for connecting semiconductor modules provided on a wiring board in an electronic device applied to an electric motor.

The present embodiments provide an electronic device applied to an electric motors This electronic device includes: a wiring board; an electric connection wiring arranged substantially in the center of the wiring board; a plurality of motor connection wirings arranged on the peripheral side of the wiring board with respect to the electric connection wiring and connected to the electric motor; and a plurality of semiconductor modules having a plurality of semiconductor elements and a resin mold for integrally sealing the plurality of semiconductor elements. The plurality of semiconductor modules are arranged at positions on the electric connection wiring or on the peripheral side of the electric connection wiring and on the center side of the motor connection wiring, and at least a part of the electrode in the plurality of semiconductor modules is mounted on the electric connection wiring.

According to the electronic device of the present embodiments, a plurality of semiconductor modules in which a plurality of semiconductor elements are integrally sealed in a resin mold are disposed on the electric connection wiring or on the peripheral side thereof and on the center side of the motor connection wiring. By integrally enclosing a plurality of semiconductor elements in a resin mold, it is possible to simplify the wiring for connecting the semiconductor elements arranged on the wiring board to each other. Further, by mounting at least a part of electrodes of a plurality of semiconductor modules on the electric connection wiring, at least a part of the semiconductor modules and the electric connection wiring can be arranged so as to overlap each other, and the arrangement area of the wiring around the semiconductor module can be reduced. Therefore, it is possible to reduce the arrangement areas of the wiring from the motor connection wiring to the electric connection wiring and the wiring arranged around the semiconductor module. As a result, in the wiring board, it is possible to simplify a plurality of motor connection wirings and the wiring for connecting a plurality of semiconductor elements, so that the space for wiring is reduced, and the impedance and inductance of the wiring are reduced.

First Embodiment

The electronic device 100 according to the present embodiment can be applied to a drive circuit of an electric power steering system (EPS) 80 for a vehicle as shown in FIGS. 1 to 10. The EPS 80 includes a steering wheel 90, a steering shaft 91, a pinion gear 92, a rack shaft 93, and an EPS device 81. The steering shaft 91 is connected to the steering wheel 90. The pinion gear 92 is provided at a tip of the steering shaft 91. The pinion gear 92 is engaged with the rack shaft 93. Wheels 95 are rotatably connected to both ends of the rack shaft 93 through tie rods or the like. When a driver rotates the steering wheel 90, the steering shaft 91 rotates. The pinion gear 92 converts rotary motion of the steering shaft 91 to linear motion of the rack shaft 93, and the wheels 95 are steered to have a steering angle according to displacement of the rack shaft 93.

The EPS device 81 includes a torque sensor 94, a speed reducer 96, and an electric motor 40 integrated with mechanical and electrical equipment. The torque sensor 94 is provided on the steering shaft 91, and detects a steering torque Trq which is an output torque of the steering shaft 91. The electric motor 40 includes a rotary electric machine unit 41 and an energization circuit unit 42. The rotary electric machine unit 41 generates an assisting torque corresponding to the detected steering torque Trq and a steering direction of the steering wheel 90. The energization circuit unit 42 performs a drive control of the rotary electric machine unit 41. The speed reducer 96 transmits the assisting torque to the steering shaft 91 while reducing the rotation of a rotation shaft of a rotor of the rotary electric machine unit 41.

Figure 2:
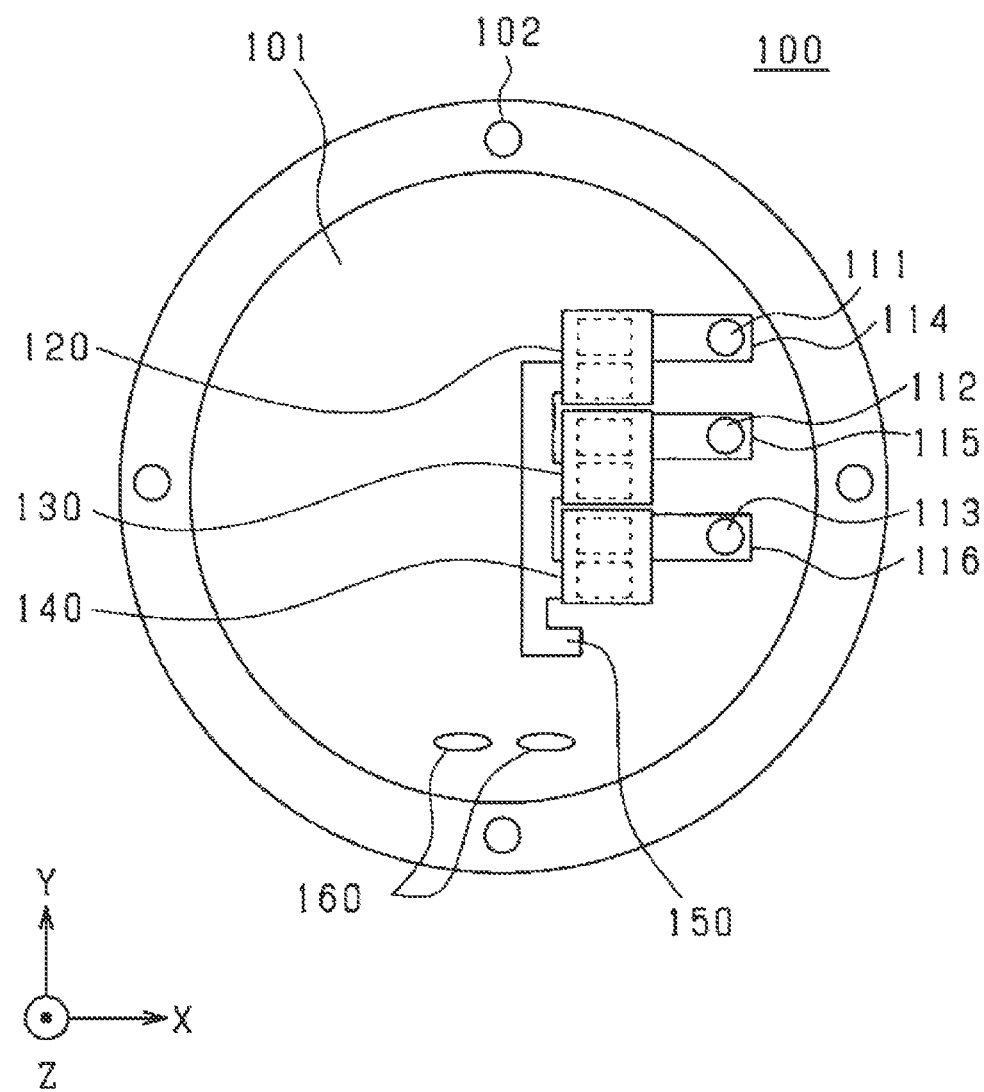
FIG. 2 is a cross-sectional view of the electronic device according to a first embodiment.

As shown in FIGS. 1 and 2, a substantially disk-shaped electronic device 100 is installed in the casing of the energization circuit unit 42. FIG. 2 is a view of the electronic device 100 as viewed from the rotary electric machine unit 41 side. The electronic device 100 includes a substantially circular wiring board 101 and a fixing portion 102 provided on the peripheral edge of the wiring board 101. The fixing portion 102 is provided with a hole portion to which the electronic device 100 can be fixed on the rotary electric machine unit 41 side by screwing a bolt therein.

The electronic device 100 further includes a first motor output terminal 111, a second motor output terminal 112, a third motor output terminal 113, a first motor connection wiring 114, a second motor connection wiring 115, and a third motor connection wiring 116, a first semiconductor module 120, a second semiconductor module 130, a third semiconductor module 140, an electric connection wiring 150, and a power supply terminal 160. These configurations are arranged on the surface of the wiring board 101 on the rotary electric machine unit 41 side.

As shown in FIG. 2, the electric connection wiring 150 is arranged at a position closer to the center in the x direction of the wiring board 101 in the positive direction (i.e., to the right in FIG. 2), and extends in the y direction. The electric connection wiring 150 is connected to the main battery that supplies electric power to the EPS 80 via the power supply terminal 160.

On the peripheral side of the wiring board 101 (i.e., on the positive direction side of the x-axis), from the positive direction side of the y-axis to the negative direction side, the first motor output terminal 111, the second motor output terminal 112, and the third motor output terminal 113 are arranged in this order. The first motor connection wiring 114 extends substantially linearly from the first motor output terminal 111 toward the center side (i.e., the negative direction side of the x-axis) of the wiring board 101 on which the electric connection wiring 150 is arranged. The second motor connection wiring 115 extends substantially linearly from the second motor output terminal 112 toward the center side (i.e., the negative direction side of the x-axis) of the wiring board 101 on which the electric connection wiring 150 is arranged. The third motor connection wiring 116 extends substantially linearly from the third motor output terminal 113 toward the center side (i.e., the negative direction side of the x-axis) of the wiring board 101 on which the electric connection wiring 150 is arranged. The wiring directions of the first motor connection wiring 114, the second motor connection wiring 115, and the third motor connection wiring 116 are in the direction toward the electric connection wiring 150 (i.e., the x direction), and the arrangement directions of the first motor connection wiring 114, the second motor connection wiring 115 and the third motor connection wiring 116 are a direction (i.e., the y direction) orthogonal to the wiring direction on the wiring board 101.

The first semiconductor module 120 is arranged between the first motor connection wiring 114 and the electric connection wiring 150. The second semiconductor module 130 is arranged between the second motor connection wiring 115 and the electric connection wiring 150. The third semiconductor module 140 is arranged between the third motor connection wiring 116 and the electric connection wiring 150.

Figure 3:
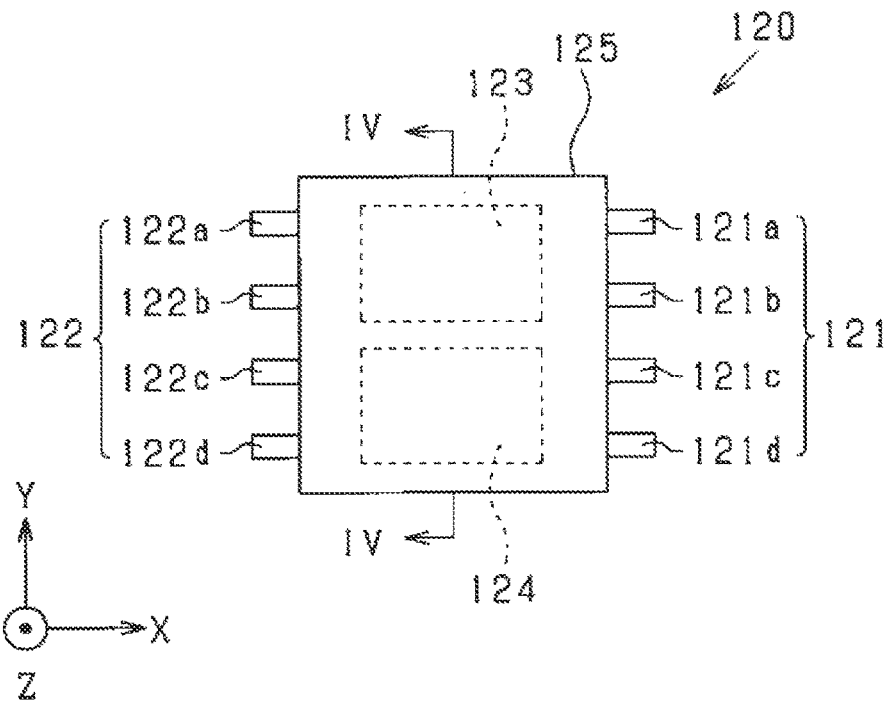
FIG. 3 is a plan view of a semiconductor module provided in the electronic device shown in FIG. 2.
Figure 4:
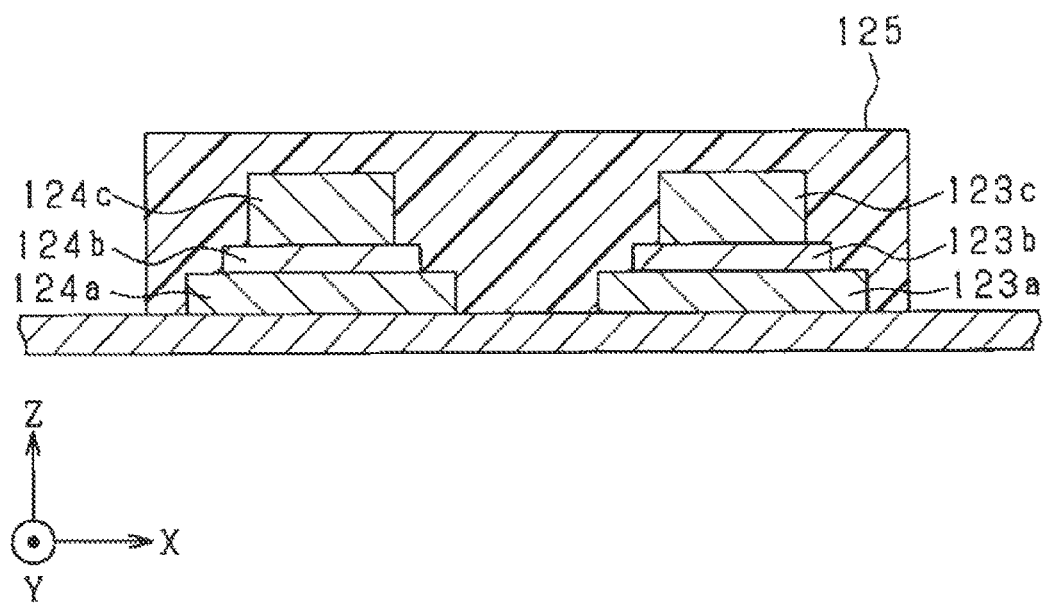
FIG. 4 is a cross-sectional view taken along line IV-IV of FIG. 3.

The first semiconductor module 120, the second semiconductor module 130, and the third semiconductor module 140 are semiconductor modules having the same structure, and as shown in FIGS. 3 and 4, have an appearance in which the shape when viewed from above has four external terminals 121 protruding in the positive direction of the x-axis and four external terminals 122 protruding in the negative direction of the x-axis from the substantially rectangular resin mold 125 having two opposing sides in the x direction and two opposing sides in the y direction. The first semiconductor module 120 is arranged so as to be substantially parallel to the wiring direction (i.e., the x direction) of the first motor connection wiring 114 when viewed from above. More specifically, when the first semiconductor module 120 is viewed from above, two opposing sides of the four sides of the upper surface having a substantially rectangular shape are substantially parallel to the wiring direction of the first motor connection wiring 114. Similarly, the second semiconductor module 130 and the third semiconductor module 140 are also arranged respectively when viewed from above so that two opposing sides are substantially parallel to the wiring direction (i.e., the x direction) of the second motor connection wiring 115 and the third motor connection wiring 116, respectively. More specifically, when the second semiconductor module 130 and the third semiconductor module 140 are viewed from above, the two opposing sides of the four sides of the upper surface having a substantially rectangular shape are substantially parallel to the wiring direction of the second motor connection wiring 115 and the third motor connection wiring 116, respectively.

The first semiconductor module 120 includes a first semiconductor element unit 123, a second semiconductor element unit 124, a resin mold 125, and external terminals 121 and 122. The first semiconductor element unit 123 includes a semiconductor element 123b, a first electrode 123c, and a second electrode 123a. The second semiconductor element unit 124 includes a semiconductor element 124b, a first electrode 124c, and a second electrode 124a. The resin mold 125 integrally seals the first semiconductor element portion 123 and the second semiconductor element portion 124.

Figure 5:
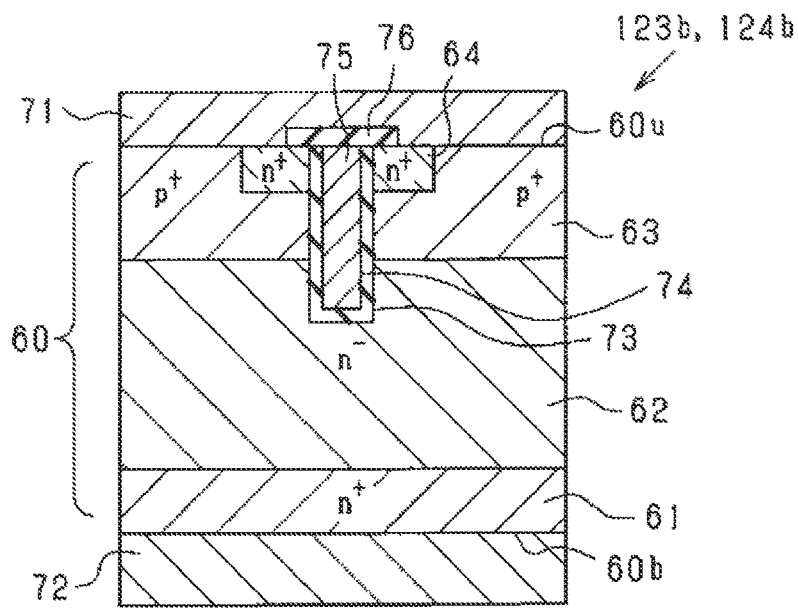
FIG. 5 is a cross-sectional view showing an element structure of a semiconductor element in the semiconductor module shown in FIG. 3.

The semiconductor elements 123b and 124b are vertical insulated gate semiconductor elements having the same element structure and having an element structure as shown in FIG. 5. More specifically, the semiconductor elements 123b, 124b are power MOSFETs (Metal-Oxide-Semiconductor Field-Effect Transistors: MOSFETs).

The semiconductor elements 123b and 124b include a semiconductor substrate 60, a source electrode 71, and a drain electrode 72. The source electrode 71 is formed in contact with an upper surface 60u of the semiconductor substrate 60. The drain electrode 72 is formed in contact with a lower surface 60b of the semiconductor substrate 60. The upper surface 60u corresponds to the first surface, and the lower surface 60b corresponds to the second surface. In the semiconductor substrate 60, an n+ region 61, an n– region 62, and a p+ region 63 are stacked on each other in this order from the lower surface 60b side. An n+ region 64 is formed in a part of the p+ region 63 on the upper surface side. A trench 73 is provided to penetrate from the upper surface 60u of the semiconductor substrate 60 through the n+ region 64 and the p+ region 63, and reaches an upper surface side of the n– region 62. A gate insulation film 74 is formed on an inner wall surface of the trench 73, and a gate electrode 75 is filled in the trench 73 in a state of being insulated from the semiconductor substrate 60 by the gate insulation film 74. An upper surface of the gate electrode 75 is covered with an insulation film 76, and the gate electrode 75 and the source electrode 71 are insulated from each other by the insulation film 76. A material of the semiconductor substrate 60 is not particularly limited, silicon (Si), silicon carbide (SiC), gallium nitride (GaN), or the like may be exemplified.

When a positive voltage is applied to the gate electrode 75 of each of the first semiconductor element 133 and the second semiconductor element 143, an n-type channel is provided in the p+ region 63 along the gate insulation film 74, and n-type carriers move from the source electrode 71 to the drain electrode 72 in the semiconductor substrate 60. As a result, a current flows from the drain electrode 72 to the source electrode 71. That is, in the semiconductor elements 123b and 124b, on/off control of the switching element related to the semiconductor elements 123b and 124b can be executed by controlling the gate voltage applied to the gate electrode 75. The source electrode 71 corresponds to a first electrode, and the source terminal electrically connected to the source electrode 71 among the external terminals corresponds to a first terminal. The drain electrode 72 corresponds to a second electrode, and a drain terminal electrically connected to the drain electrode 72 among the external terminals corresponds to a second terminal.

The semiconductor elements 123b and 124b are arranged so that the source electrode 71 is disposed on the rotary electric machine unit 41 side (i.e., the positive direction side of the z-axis) and the drain electrode is disposed on the opposite side (i.e., the negative direction side of the z-axis), respectively, and the longitudinal direction is directed to the x direction. The semiconductor element 123b and the semiconductor element 124b are integrally sealed in a state of being arranged side by side in the y-axis direction in the same direction. The gate pad of the semiconductor element 123b and the gate pad of the semiconductor element 124b are provided at the same position in each semiconductor element. Of the external terminals 121 and 122, the drain terminal of the semiconductor element 123b is the external terminal 121a and 121b connected to the second electrode 123a, and the source terminal is the external terminal 122b connected to the first electrode 123c. The gate terminal is an external terminal 122a. Further, the drain terminal of the semiconductor element 124b is an external terminal 122c or 122d connected to the second electrode 124a, the source terminal is an external terminal 121c connected to the first electrode 124c, and the gate terminal is an external terminal 121d.

The semiconductor elements 123b and 124b are arranged side by side in the y direction perpendicular to the wiring direction of the first motor connection wiring 114, the second motor connection wiring 115, and the third motor connection wiring 116 to have the longitudinal directions thereof in parallel to the x direction, which is the wiring directions of the first motor connection wiring 114, the second motor connection wiring 115, and the third motor connection wiring 116. The external terminals 121a and 121b, which are the drain terminals of the semiconductor element 123b, and the external terminal 121c, which is the source power terminal of the semiconductor element 124b, are bonded to each other on the first motor connection wiring 114 via solder. The external terminals 122c and 122d, which are the drain terminals of the semiconductor element 124b, are bonded on the electric connection wiring 150 via solder.

Similarly, the external terminal protruding in the positive direction of the x-axis of the second semiconductor module 130 is bonded on the second motor connection wiring 115 via solder. The external terminal protruding in the negative direction of the x-axis of the second semiconductor module 130 is bonded on the electric connection wiring 150 via solder. The external terminal protruding in the positive direction of the x-axis of the third semiconductor module 140 is bonded on the third motor connection wiring 116 via solder. The external terminal protruding in the negative direction of the x-axis of the third semiconductor module 140 is bonded on the electric connection wiring 150 via solder.

Figure 6:
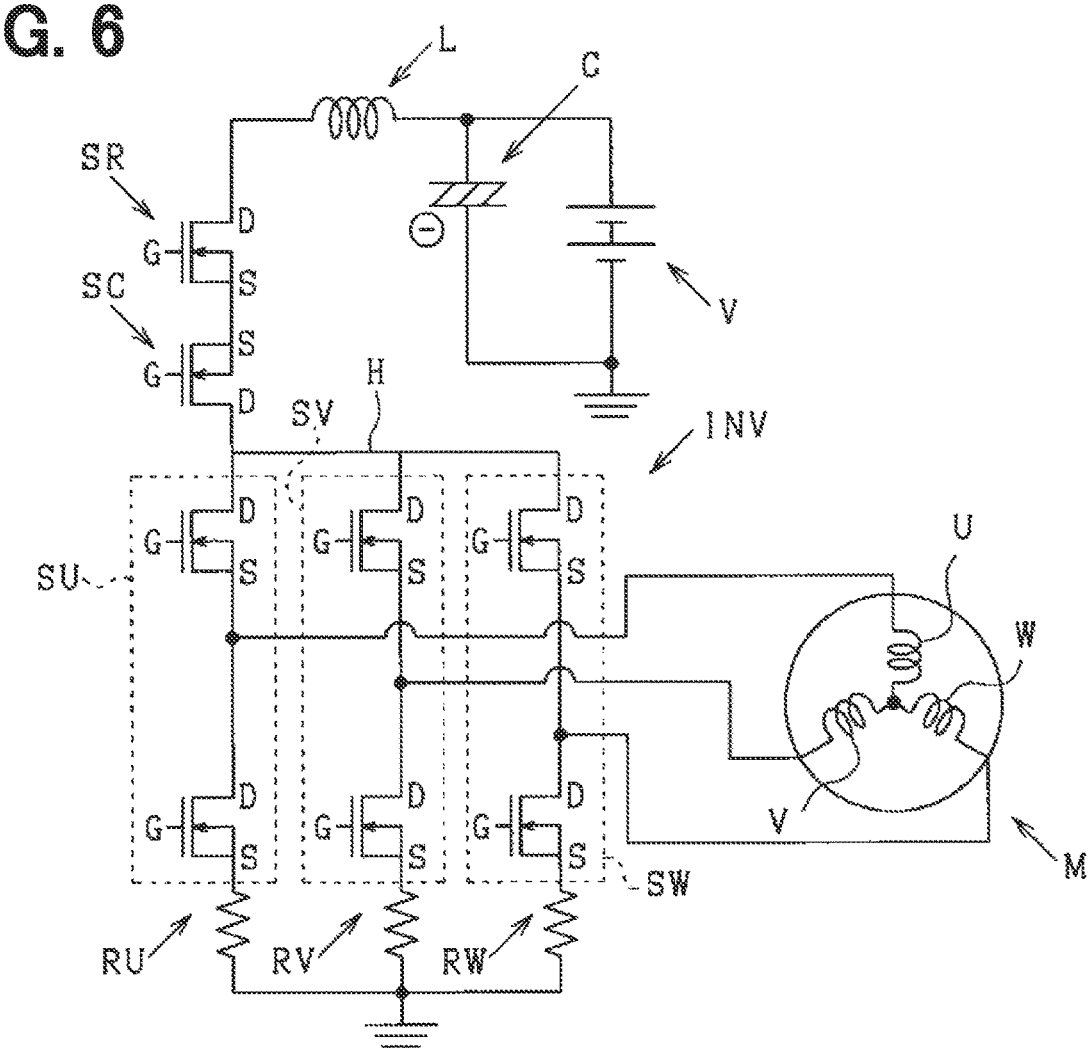
FIG. 6 is a diagram showing an example of a motor drive circuit to which the electronic device shown in FIG. 2 is applied.

The electronic device 100 is applied to the motor drive circuit shown in FIG. 6. As shown in FIG. 6, a permanent magnet field type or a winding field type can be used as the rotary electric machine unit 41. The stator of the rotary electric machine unit 41 includes a winding group M. The winding group M includes a U-phase winding U, a V-phase winding V, and a W-phase winding W, which are connected to each other in a star shaped manner. Respective first ends of the U-phase winding U, the V-phase winding V, and the W-phase winding W are connected to each other at a neutral point. The U, V, and W-phase wirings U, V, and W are shifted from one another by 120 degrees in terms of the electrical angle θe.

The energization circuit unit 42 includes an inverter INV as a power converter, a power supply relay SR, a reverse connection protection relay SC, and the like. The inverter INV includes a switch group SU, SV, and SW including a pair of upper arm switch and lower arm switch. The second end of the U-phase winding U is connected to the connection point between the upper arm switch and the lower arm switch of the switch group SU. The second end of the V-phase winding V is connected to the connection point between the upper arm switch and the lower arm switch of the switch group SV. The second end of the W-phase winding W is connected to the connection point between the upper arm switch and the lower arm switch of the switch group SW.

The high potential side terminal H of the upper arm switch of the switch group SU, SV, SW is connected to the positive electrode terminal of the battery V, which is a DC power supply, via the power supply relay SR, the reverse connection protection relay SC, and the inductor L. A bypass capacitor C is connected in parallel with the battery V. The negative electrode terminal of the battery V is connected to ground. The low potential side terminal of the lower arm switch of the switch group SU, SV, SW is connected to the ground via the resistor RU, RV, RW.

As the switching element constituting the switch group SU, SV, SW, MOSFETs as exemplified in the semiconductor elements 123b, 124b can be used. In each switch group SU, SV, SW, the source electrode of the MOSFET used as the upper arm switch and the drain electrode of the MOSFET used as the lower arm switch are connected in series.

The first semiconductor module 120 can be used as a semiconductor module in which the upper arm switch and the lower arm switch of the switch group SU are integrated. The second semiconductor module 130 can be used as a semiconductor module in which the upper arm switch and the lower arm switch of the switch group SV are integrated. The third semiconductor module 140 can be used as a semiconductor module in which the upper arm switch and the lower arm switch of the switch group SW are integrated. The first semiconductor module 120, the second semiconductor module 130, and the third semiconductor module 140 can be applied to the inverter INV.

As the switching element constituting the power supply relay SR and the reverse connection protection relay SC, MOSFETs as exemplified in the semiconductor elements 123b and 124b can be used. The power relay SR and the reverse connection protection relay SC are connected in series by connecting the source electrodes of the MOSFETs to each other.

When MOSFETs such as semiconductor devices 123b and 124b are used as switching elements, the body diodes can be used as freewheel diodes. Therefore, although a freewheel diode connected in reversely-parallel to each switch is not shown in FIG. 6, a freewheel diode may be connected to each switch.

The energization circuit unit 42 detects currents flowing through the resistors RU, RV, and RW and outputs the detected currents as a U-phase current Iur, a V-phase current Ivr, and a W-phase current Iwr.

The energization circuit unit 42 includes an ECU mainly configured by a microcomputer, and the ECU operates the switches of the inverter INV to control a torque of the rotary electric machine unit 41 to reach a torque command value Tr*. The torque command value Tr* is set based on, for example, a steering torque Trq detected by the torque sensor 94. The energization circuit unit 42 calculates an electric angle θe of the rotary electric machine unit 41 by the ECU based on an output signal of an angular sensor. As the angle sensor, for example, an angular sensor including a magnet which is a magnetic generation portion provided on a rotor side of the rotary electric machine unit 41 and a magnetic detection element provided close to the magnet can be exemplified. The functions provided by the ECU may be provided, for example, by software stored in a tangible memory device and a computer causing the software to be executed, hardware, or a combination of the software, the computer, and the hardware.

As described above, the electronic device 100 can be applied to the energization circuit unit 42 corresponding to the drive circuit of the EPS 80. Further, the first semiconductor module 120, the second semiconductor module 130, and the third semiconductor module 140 can be applied to the switches SU, SV, and SW of the inverter circuit shown as the inverter INV, respectively.

As described above, in the electronic device 100 according to the first embodiment, the electric connection wiring 150 is arranged substantially in the center of the first direction (i.e. the x direction) of the wiring board 101, and extends along the second direction (i.e, the y direction)

orthogonal to the first direction. The first motor connection wiring 114, the second motor connection wiring 115, and the third motor connection wiring 116 are arranged on the peripheral side of the wiring board 101 on the positive direction side of the x-axis with respect to the electric connection wiring 150. The first motor connection wiring 114, the second motor connection wiring 115, and the third motor connection wiring 116 are arranged in this order from the positive direction side to the negative direction side of the y-axis, and extend substantially parallel to the negative direction of the x-axis toward the electric connection wiring 150.

Further, between the electric connection wiring 150 and the first motor connection wiring 114, the second motor connection wiring 115, and the third motor connection wiring 116, the first semiconductor module 120, the second semiconductor module 130, and the third semiconductor module 140 are arranged, respectively. The first semiconductor module 120, the second semiconductor module 130, and the third semiconductor module 140 are semiconductor modules in which two semiconductor elements (i.e., MOSFETs) constituting the switch group SU, SV, and SW arranged between the electric connection wiring 150 and the first motor connection wiring 114, the second motor connection wiring 115, and the third motor connection wiring 116, respectively are integrally sealed in a resin mold. In the first semiconductor module 120, the second semiconductor module 130, and the third semiconductor module 140, the two semiconductor elements in the switch groups SU, SV, and SW are connected to each other in the resin mold, so that it is not necessary to arrange the wiring for connecting the two semiconductor elements on the wiring board 101 on the side (i.e., the xy plane direction) of the resin mold.

Further, the first semiconductor module 120, the second semiconductor module 130, and the third semiconductor module 140 are disposed on the peripheral side of the electric connection wiring 150, respectively, and on the center side of the first motor connection wiring 114, the second motor connection wiring 115, and the third motor connection wiring 116, and the electric connection wiring 150 is connected to the drain terminals of the first semiconductor module 120, the second semiconductor module 130, and the third semiconductor module 140, respectively. Therefore, at least a part of the first semiconductor module 120, the second semiconductor module 130, and the third semiconductor module 140 and the electric connection wiring 150 can be arranged so as to overlap each other, and the arrangement area of the wiring around the first semiconductor module 120, the second semiconductor module 130, and the third semiconductor module 140 can be reduced. As a result, in the wiring board 101, the wiring for connecting the configurations of the first semiconductor module 120, the second semiconductor module 130, the third semiconductor module 140, the first motor connection wiring 114, the second motor connection wiring 115, the third motor connection wiring 116, and the like is simplified, so that space for wiring can be reduced, and wiring impedance and inductance can be reduced.

Further, the first semiconductor module 120, the second semiconductor module 130, and the third semiconductor module 140 are arranged so as to be substantially parallel to the motor connection wiring connected thereto between the electric connection wiring 150, the first motor connection wiring 114, the second motor connection wiring 115, and the third motor connection wiring 116, respectively. Therefore, the length of the wiring from each motor output terminal 111 to 113 to the electric connection wiring 150 can be made substantially the shortest. Further, the first semiconductor module 120, the second semiconductor module 130, and the third semiconductor module 140 are arranged side by side so as to set the extending directions of the external terminals 121 and 122 to be in parallel to the x direction as the arrangement direction of the first motor connection wiring 114, the second motor connection wiring 115, and the third motor connection wiring 116. By arranging in this way, the first semiconductor module 120, the second semiconductor module 130, and the third semiconductor module 140 are easily arranged to be parallel to the first motor connection wiring 114, the second motor connection wiring 115, and the third motor connection wiring 116, respectively.

MODIFICATIONS EXAMPLES

In the first embodiment, the first semiconductor module 120, the second semiconductor module 130, and the third semiconductor module 140 are arranged so that the two semiconductor elements in the resin mold are substantially parallel to they direction. The feature may not be limited to this.

Figure 7:
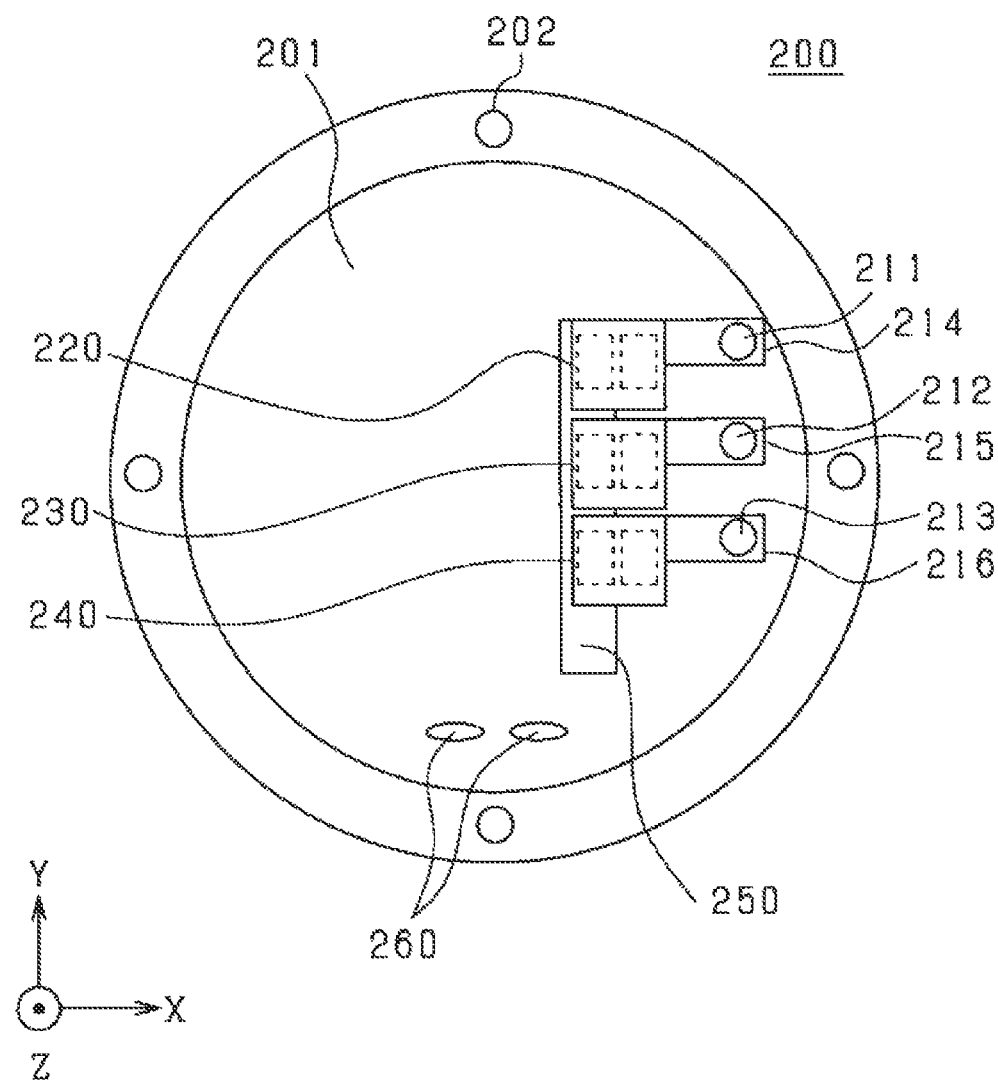
FIG. 7 is a plan view of an electronic device according to a modified example.

As in the first semiconductor module 220, the second semiconductor module 230, and the third semiconductor module 240 shown in FIG. 7, the two semiconductor elements in the resin mold may be arranged in a direction substantially parallel to the x direction. The first semiconductor module 220, the second semiconductor module 230, and the third semiconductor module 240 are semiconductor modules similar to the first semiconductor module 120 and the like, and are arranged with the orientation rotated by 90 degrees counterclockwise with respect to the direction shown in FIG. 2.

Further, the electric connection wiring 250 extends substantially linearly along the y direction, which is the arrangement direction of the first semiconductor module 220, the second semiconductor module 230, and the third semiconductor module 240. The electric connection wiring 250 is in contact with a drain pad provided on the lower surface of one of the semiconductor elements (i.e., the semiconductor element 124b on the upper arm side shown in FIGS. 3 and 6). Since the first semiconductor module 220, the second semiconductor module 230, and the third semiconductor module 240 are arranged on the electric connection wiring 250, the mounting area on the wiring board 201 can be reduced. Since the other configurations of the electronic device 200 are the same as those of the electronic device 100, the description will be omitted by replacing the reference numbers in the 100s with the 200s.

Figure 8:
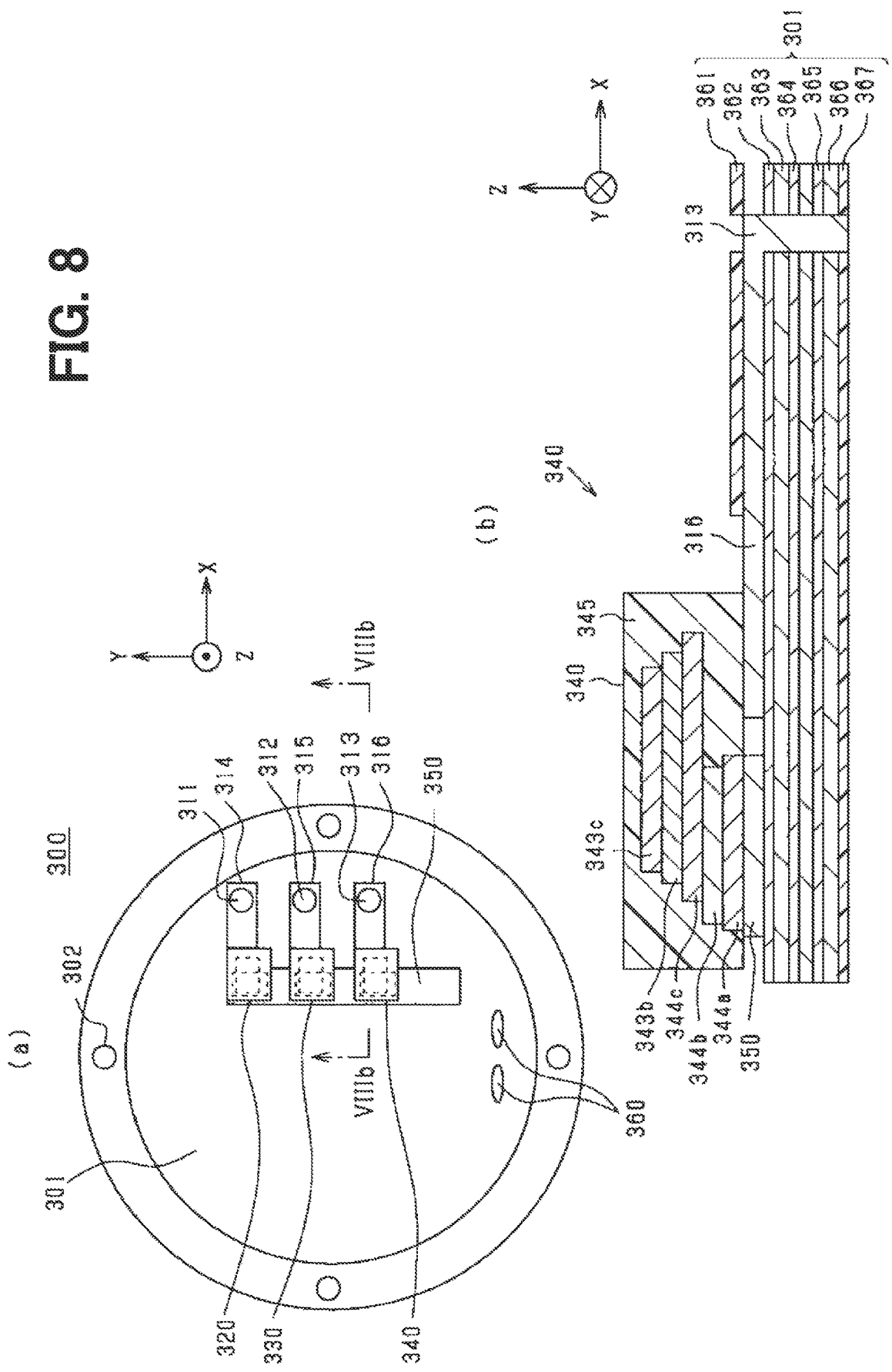
FIG. 8 is a plan view and a cross-sectional view of an electronic device according to a modified example.

Further, as in the first semiconductor module 320, the second semiconductor module 330, and the third semiconductor module 340 shown in FIG. 8, two semiconductor elements in the resin mold may be stacked in the thickness direction (i.e., the z direction) of the wiring substrate 301. The first semiconductor module 320, the second semiconductor module 330, and the third semiconductor module 340 are semiconductor modules having the same structure. Each configuration of the first semiconductor module 320 is applied to the second semiconductor module 330 or the third semiconductor module 340 by replacing the reference number 320 series with the 330 series or the 340 series.

As shown in (b) of FIG. 8, the wiring board 301 is a stacking substrate having a resist layer 361, a substrate layer 362, a wiring layer 363, a substrate layer 364, a wiring layer 365, a substrate layer 366 and a resist layer 367 stacked in this order on the surface on which the third semiconductor module 340 and the like are mounted. The substrate layer 362, 364 is an insulation layer made of an insulator defined as a core material, and the wiring layers 363 and 365 are made of an electrode material such as copper. The third motor connection wiring 316 and the electric connection wiring 350 are provided on the substrate layer 362, and the third motor output terminal 313 is connected to the third motor connection wiring 316 on the substrate layer 362. The resist layer 361 is formed on the third motor connection wiring 316 in a region from the vicinity of the arrangement surface of the third semiconductor module 340 to the front of the third motor output terminal 313, and the upper surface of the third motor output terminal 313 is not covered by the resist layer 361. The third motor output terminal 313 penetrates from the substrate layer 362 to the resist layer 367 in the thickness direction (i.e, the z-axis direction) of the wiring board 301, and the wiring layers 363 and 365 are electrically connected to the third motor output terminal 313.

Figure 9:
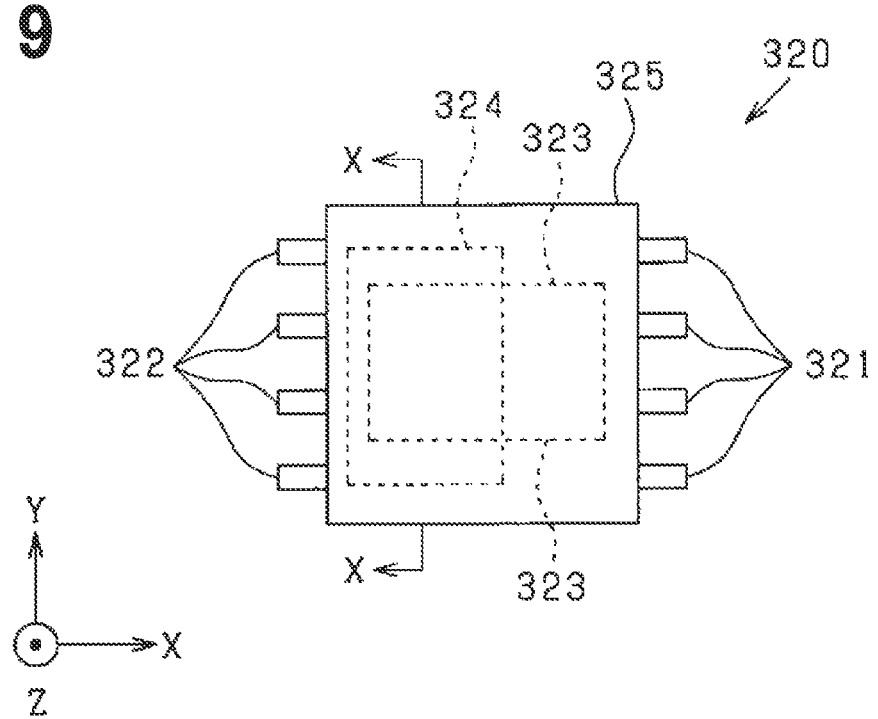
FIG. 9 is a plan view of a semiconductor module provided in the electronic device shown in FIG. 8.
Figure 10:
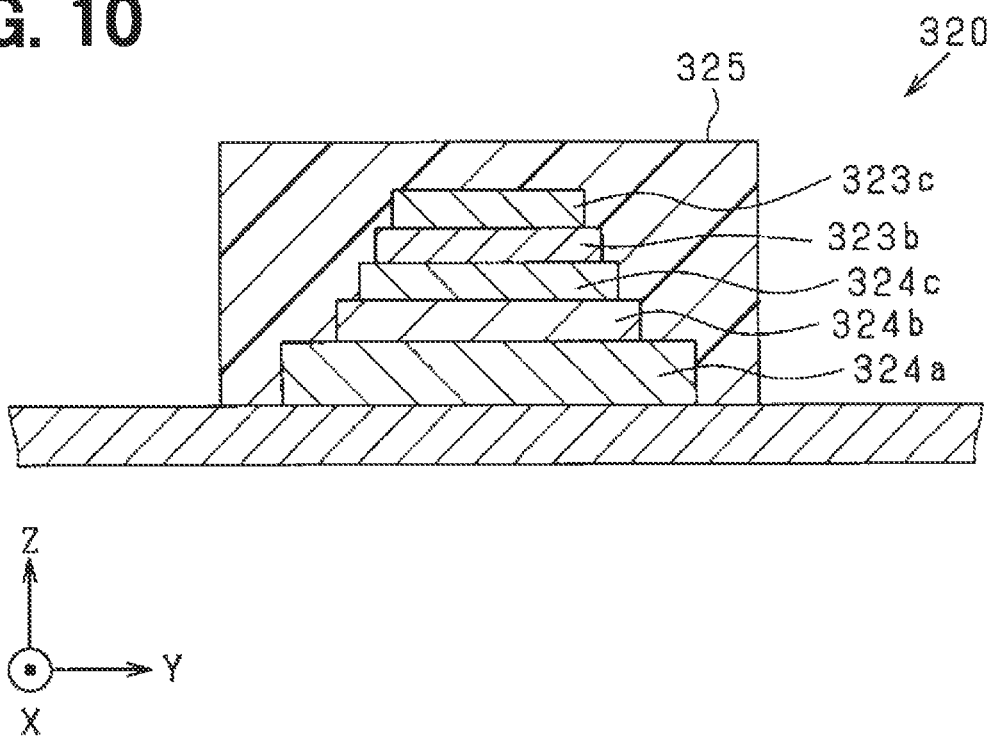
FIG. 10 is a cross-sectional view taken along a line X-X of FIG. 9.

As shown in FIGS. 9 and 10, the first semiconductor module 320 has a first semiconductor element unit 323 arranged on the positive side of the z-axis, a second semiconductor element unit 324 arranged on the negative side of the z-axis, a resin mold 325 and external terminals 321 and 322. The first semiconductor element unit 323 includes a semiconductor element 323b and a first electrode 323c. The second semiconductor element unit 324 includes a semiconductor element 324b, a first electrode 324c, and a second electrode 324a. The semiconductor elements 323b and 324b are MOSFETs having the same element structure as the semiconductor elements 123b and 124b, and are arranged so that the source electrode 71 side is on the positive direction side of the z-axis. The first electrode 324c is bonded to the surface of the semiconductor element 324b on the source electrode 71 side and bonded to the surface of the semiconductor element 323b on the drain electrode 72 side. The resin mold 325 integrally seals the first semiconductor element unit 323 and the second semiconductor element unit 324. The external terminal 321 is electrically connected to the semiconductor element 323b on the first semiconductor element unit 323 side. The external terminal 322 is electrically connected to the semiconductor element 324b on the second semiconductor element unit 324 side.

According to the electronic device 300 shown in FIG. 8, since the semiconductor elements 323b and 324b are stacked, the areas of the first semiconductor module 320, the second semiconductor module 330, and the third semiconductor module 340 in the plane direction (i.e., the xy direction) becomes smaller. As a result, the mounting area of each semiconductor module on the wiring board 301 can be made smaller.

Further, similarly to the electronic device 200 shown in FIG. 7, in the electronic device 300 shown in FIG. 8, the electric connection wiring 350 is arranged to extends in a substantially straight line along a y direction as the arrangement direction of the first semiconductor module 320, the second semiconductor module 330, and the third semiconductor module 340. Since the first semiconductor module 320, the second semiconductor module 330, and the third semiconductor module 340 are arranged on the electric connection wiring 350, and are in contact with the drain pad electrically connected to the drain electrode 72 of the semiconductor element 324b, the mounting area of the wiring substrate 301 can be reduced. Further, in the electronic device 300, the wiring board 301 includes wiring layers 363 and 365 in the inner layer of the board. Therefore, the wiring layers 363 and 365 can be used as the negative electrode side power supply path shown in FIG. 6. By arranging the wiring constituting the power supply path on the positive electrode side on the substrate surface of the wiring board 301, and arranging the wiring constituting the power supply path on the negative electrode side in the inner layer of the substrate, it is not necessary to arrange the power supply path on the positive electrode side and the power supply path on the negative electrode side on the same layer of the wiring board, so that the size of the board can be minimized. In addition, by arranging the power supply path on the negative electrode side in the inner layer of the board, the degree of freedom of arrangement is increased in each configuration arranged on the board, so that it is easy to arrange each configuration to reduce the wiring from the motor connection wiring to the electric connection wiring and the wiring distance arranged in the surroundings of the semiconductor module. Since the other configurations of the electronic device 300 are the same as those of the electronic device 100, the description will be omitted by replacing the reference numbers in the 100s with the 300s.

Second Embodiment

In the first embodiment, the semiconductor modules have been described as an example such that two semiconductor elements for constituting an upper arm and a lower arm of an inverter circuit in each of a plurality of semiconductor modules are integrated in a resin mold. The present embodiment may not be limited to this feature. As described in the second embodiment, each of the plurality of semiconductor modules may include three semiconductor elements.

Figure 11:
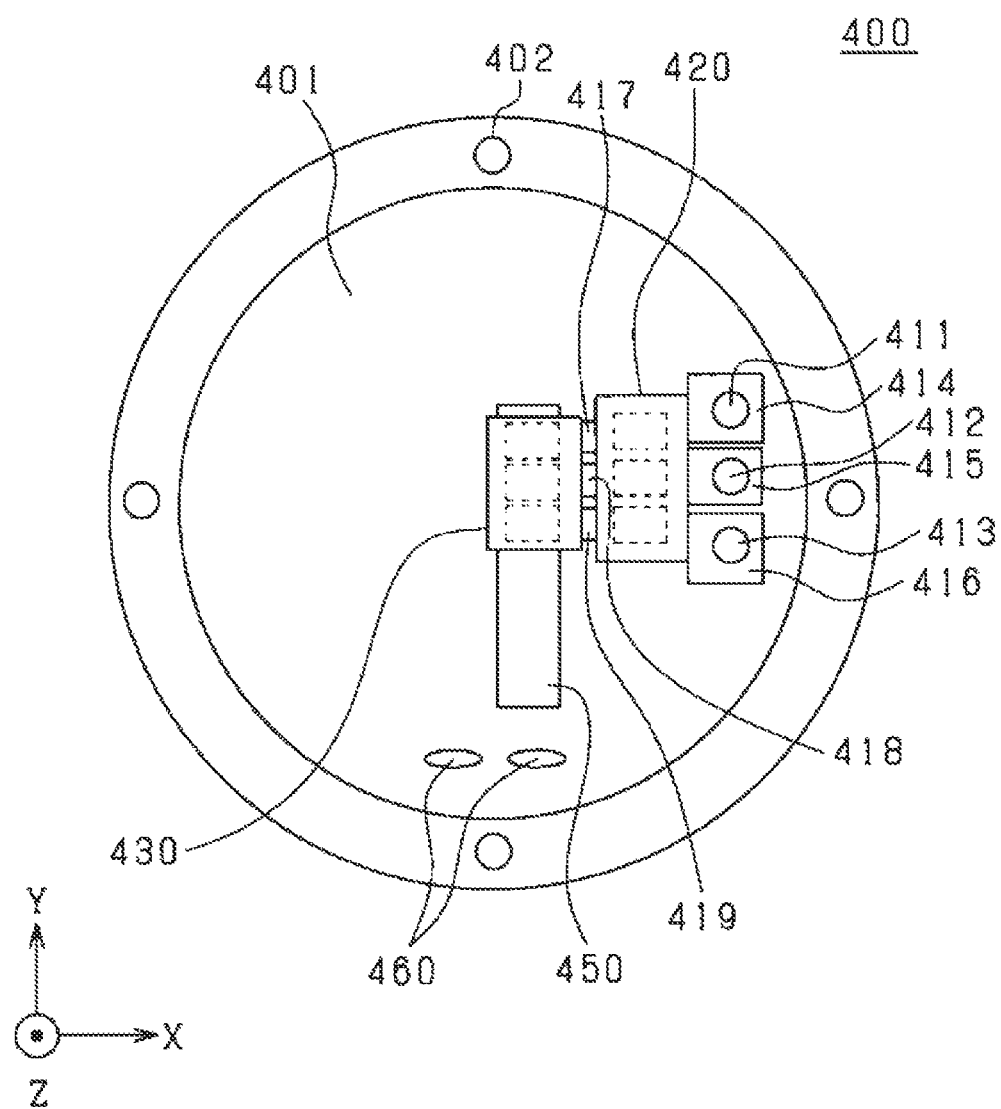
FIG. 11 is a plan view of the electronic device according to a second embodiment.

As shown in FIG. 11, in the electronic device 400, on the peripheral side (i.e, the positive direction side of the x-axis) of the wiring board 401, the first motor output terminal 411, the second motor output terminal 412, and the third motor output terminal 413 are arranged in this order from the positive direction side to the negative direction side of the y-axis. The first motor connection wiring 414 extends substantially linearly from the first motor output terminal 411 toward the center side (i.e., the negative direction side of the x-axis) of the wiring board 401 on which the electric connection wiring 450 is arranged. The second motor connection wiring 415 extends substantially linearly from the second motor output terminal 412 toward the center side (i.e., the negative direction side of the x-axis) of the wiring board 401 on which the electric connection wiring 450 is arranged. The third motor connection wiring 416 extends substantially linearly from the third motor output terminal 413 toward the center side (i.e., the negative direction side of the x-axis) of the wiring board 401 on which the electric connection wiring 450 is arranged.

The semiconductor modules 420 and 430 are arranged side by side in substantially parallel in the x direction between the first motor connection wiring 414, the second motor connection wiring 415, the third motor connection wiring 416, and the electrical connection wiring 450. The semiconductor module 420 is arranged over the first motor connection wiring 414, the second motor connection wiring 415, and the third motor connection wiring 416. The semiconductor module 430 is arranged on the electric connection wiring 450 extending substantially linearly in the y direction. The semiconductor module 420 and the semiconductor module 430 are connected by intermediate wirings 417, 418, and 419, respectively. The intermediate wirings 417, 418, and 419 are a part of the first motor connection wiring 414, the second motor connection wiring 415, and the third motor connection wiring 416, respectively. The semiconductor module 420 is arranged on the peripheral side of the electric connection wiring 450, and the semiconductor module 430 is arranged on the electric connection wiring 450. Further, the semiconductor modules 420 and 430 are arranged on the center side of the first motor connection wiring 414, the second motor connection wiring 415, and the third motor connection wiring 416. The drain terminal of the semiconductor module 430 is bonded to the electric connection wiring 450.

The semiconductor modules 420 and 430 are configured so that the semiconductor modules 420 and 430 have three semiconductor elements including the same semiconductor element as two semiconductor elements 123b and 124b in addition to two semiconductor elements 123b and 124b whereas the first semiconductor module 120 shown in FIGS. 3 and 4 includes two semiconductor elements 123b and 124b. The semiconductor modules 420 and 430 are arranged so that the three semiconductor elements are arranged substantially parallel to each other in the y direction. When the semiconductor modules 420 and 430 are viewed from above, the two opposing sides of the four sides of the upper surface having a substantially rectangular shape are arranged in parallel to the wiring direction of the first motor connection wiring 414, the second motor connection wiring 415, and the third motor connection wiring 416. The drain pads of the three semiconductor elements of the semiconductor module 420 are in contact with the first motor connection wiring 414, the second motor connection wiring 415, and the third motor connection wiring 416, respectively. The drain pads of the three semiconductor elements of the semiconductor module 430 are in contact with the electric connection wiring 450. External terminals that are electrically connected to the source electrodes 71 of the three semiconductor elements included in the semiconductor module 430 are connected to the intermediate wirings 417, 418, and 419. Although not shown, the external terminals of the semiconductor modules 420 and 430 protrude and are opposed to each other in the direction substantially parallel to the wiring directions of the first motor connection wiring 414, the second motor connection wiring 415, and the third motor connection wiring 416 to which they are connected.

Figure 12:
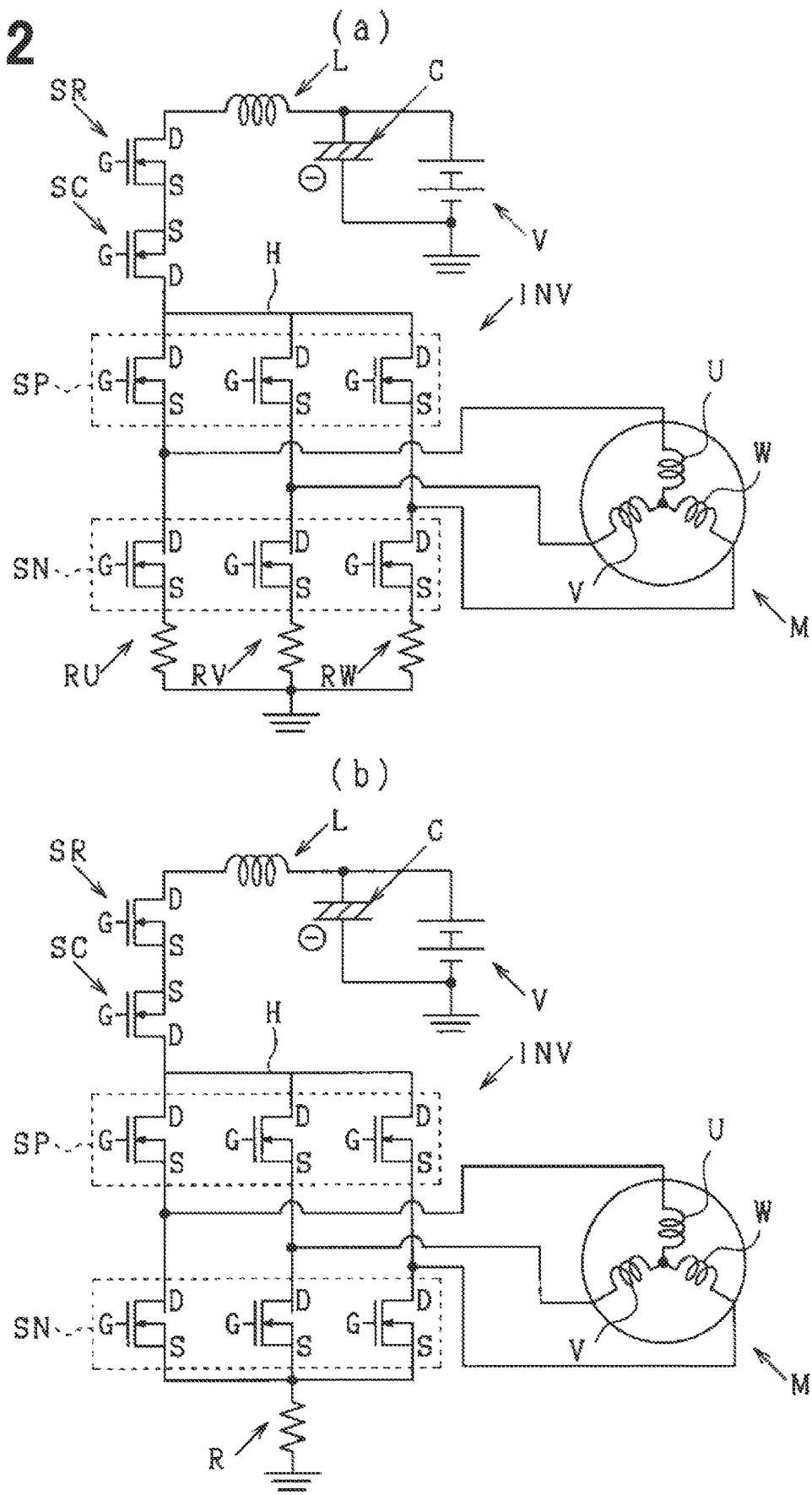
FIG. 12 is a diagram showing an example of a motor drive circuit to which the electronic device shown in FIG. 11 is applied.

The semiconductor modules 420 and 430 can be applied to an inverter circuit as a switching group SP including the entire upper arm and a switching group SN including the entire lower arm of each phase of the inverter circuit including three semiconductor elements, as shown in (a) and (b) of FIG. 12. More specifically, the semiconductor module 420 can be used as the switching group SN, and the semiconductor module 430 can be used as the switching group SP. The drive circuit shown in (a) of FIG. 12 is the same as the drive circuit shown in FIG. 6 except for the configuration of the switching group. Further, the drive circuit shown in (b) of FIG. 12 is different from (a) of FIG. 12 only in that the drive circuit is connected to the ground via one resistor R instead of the three resistors RU, RV, and RW, and other configurations are the same as in (a) of FIG. 12.

Third Embodiment

In the first embodiment, the electronic device 100 including only the semiconductor module having a plurality of semiconductor elements integrally sealed in the resin mold has been described as an example of the semiconductor module. The present embodiment may not be limited to this feature. As in the electronic device 500 shown in FIG. 13, in addition to the semiconductor module including a plurality of semiconductor elements integrally formed in the resin mold, a semiconductor module including one semiconductor element in the resin mold may be provided.

Figure 13:
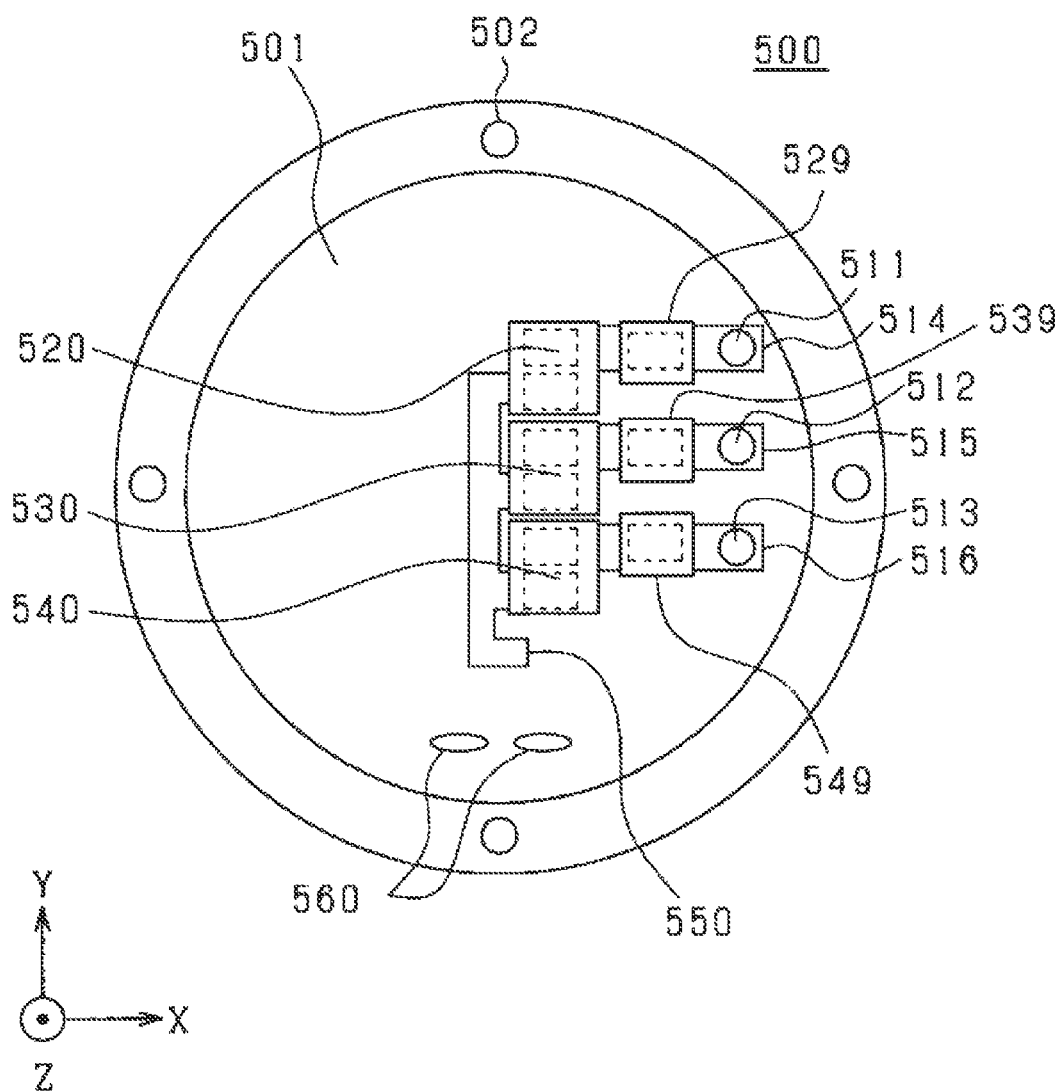
FIG. 13 is a plan view of the electronic device according to a third embodiment.

As shown in FIG. 13, in the electronic device 500, as in the first embodiment, the first semiconductor module 520 is arranged substantially parallel to the wiring direction of the first motor connection wiring 514 between the first motor connection wiring 514 and the electric connection wiring 550. In the electronic device 500, a semiconductor module 529 including one semiconductor element is further arranged on the first motor connection wiring 514.

Similarly, the second semiconductor module 530 is arranged between the second motor connection wiring 515 and the electric connection wiring 550 substantially parallel to the wiring direction of the second motor connection wiring 515. A semiconductor module 539 including one semiconductor element is arranged on the second motor connection wiring 515. The third semiconductor module 540 is arranged between the third motor connection wiring 516 and the electric connection wiring 550 substantially parallel to the wiring direction of the third motor connection wiring 516. A semiconductor module 549 including one semiconductor element is arranged on the third motor connection wiring 516. That is, the first semiconductor module 520, the second semiconductor module 530, and the third semiconductor module 540 are disposed on the peripheral side of the electric connection wiring 550, respectively, and on the center side of the first motor connection wiring 514, the second motor connection wiring 515, and the third motor connection wiring 516.

The semiconductor modules 529, 539, and 549 are semiconductor modules configured to include one semiconductor element whereas the first semiconductor module 120 shown in FIGS. 3 and 4 includes two semiconductor elements 123b and 124b. Although not shown, the external terminals of the first semiconductor module 520, the second semiconductor module 530, and the third semiconductor module 540 protrude and are opposed to each other in the direction parallel to the wiring direction of the first motor connection wiring 514, the second motor connection wiring 515, and the third motor connection wiring 516. The drain terminals of the first semiconductor module 520, the second semiconductor module 530, and the third semiconductor module 540 are bonded to the electric connection wiring 550. Since the other configurations of the electronic device 500 are the same as those of the electronic device 100, the description will be omitted by replacing the reference numbers in the 100s with the 500s.

Figure 14:
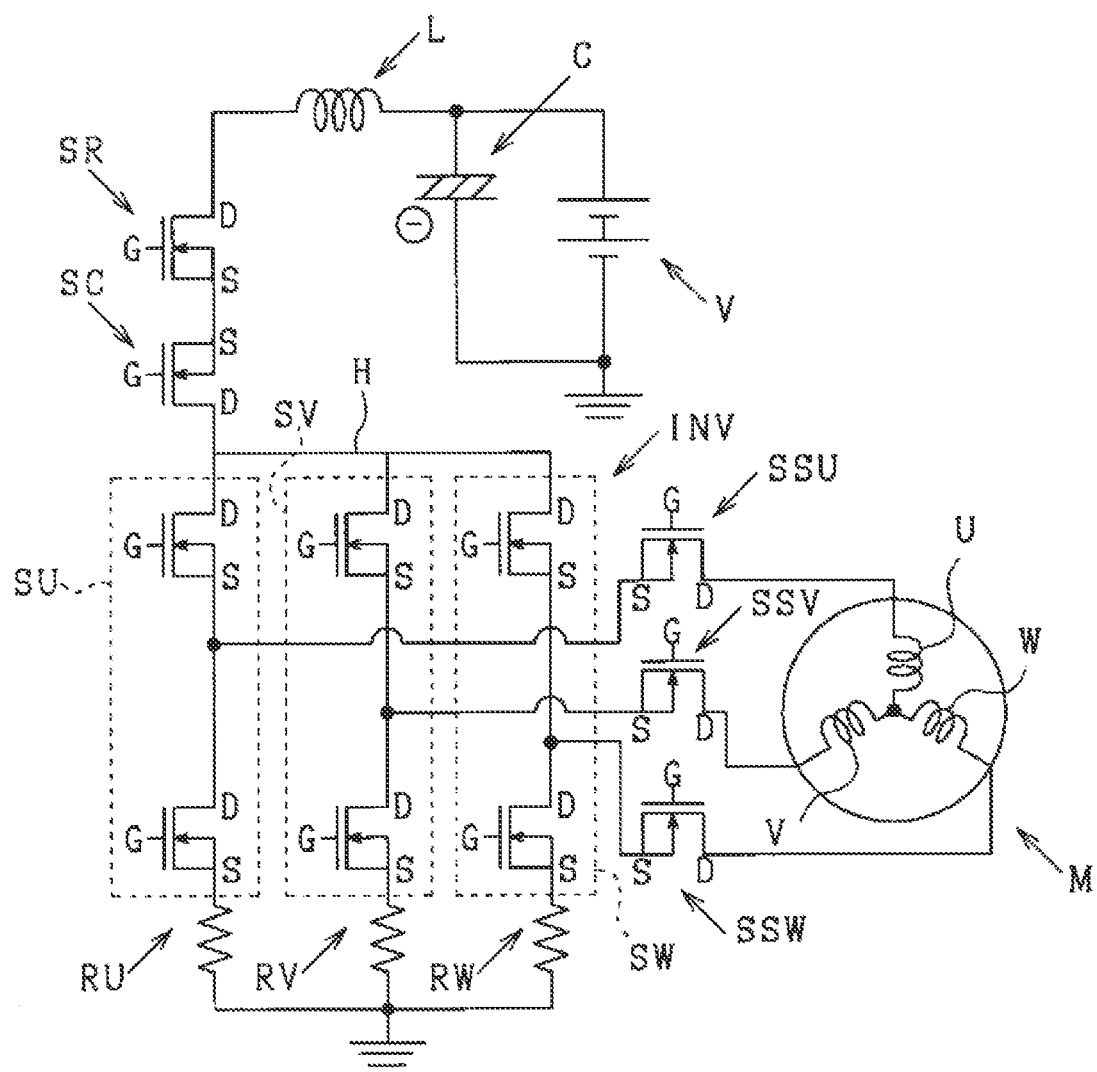
FIG. 14 is a diagram showing an example of a motor drive circuit to which the electronic device shown in FIG. 13 is applied.

The electronic device 500 can be applied to a drive circuit as shown in FIG. 14. The semiconductor modules 529, 539, and 549 are applied to an inverter circuit as the switch group SN, SV, SW and the switching group SN arranged between the U, V, and W phase windings U, V, W, respectively, as shown in FIG. 14. More specifically, the semiconductor module 420 can be used as a switch SSU, SSV, SSW. Here, the drive circuit shown in FIG. 14 is different from the drive circuit shown in FIG. 6 in that the switches SSU, SSV, and SSW are provided between the switch groups SU, SV, and SW and the U, V, and W phase windings U, V, and W, respectively. The other configurations are the same as those of the drive circuit shown in FIG. 6.

Fourth Embodiment

In the fourth embodiment, an electronic device 600 provided with a plurality of sets of the electric connection wiring, the motor connection wiring, and the semiconductor module arranged between them will be described.

Figure 15:
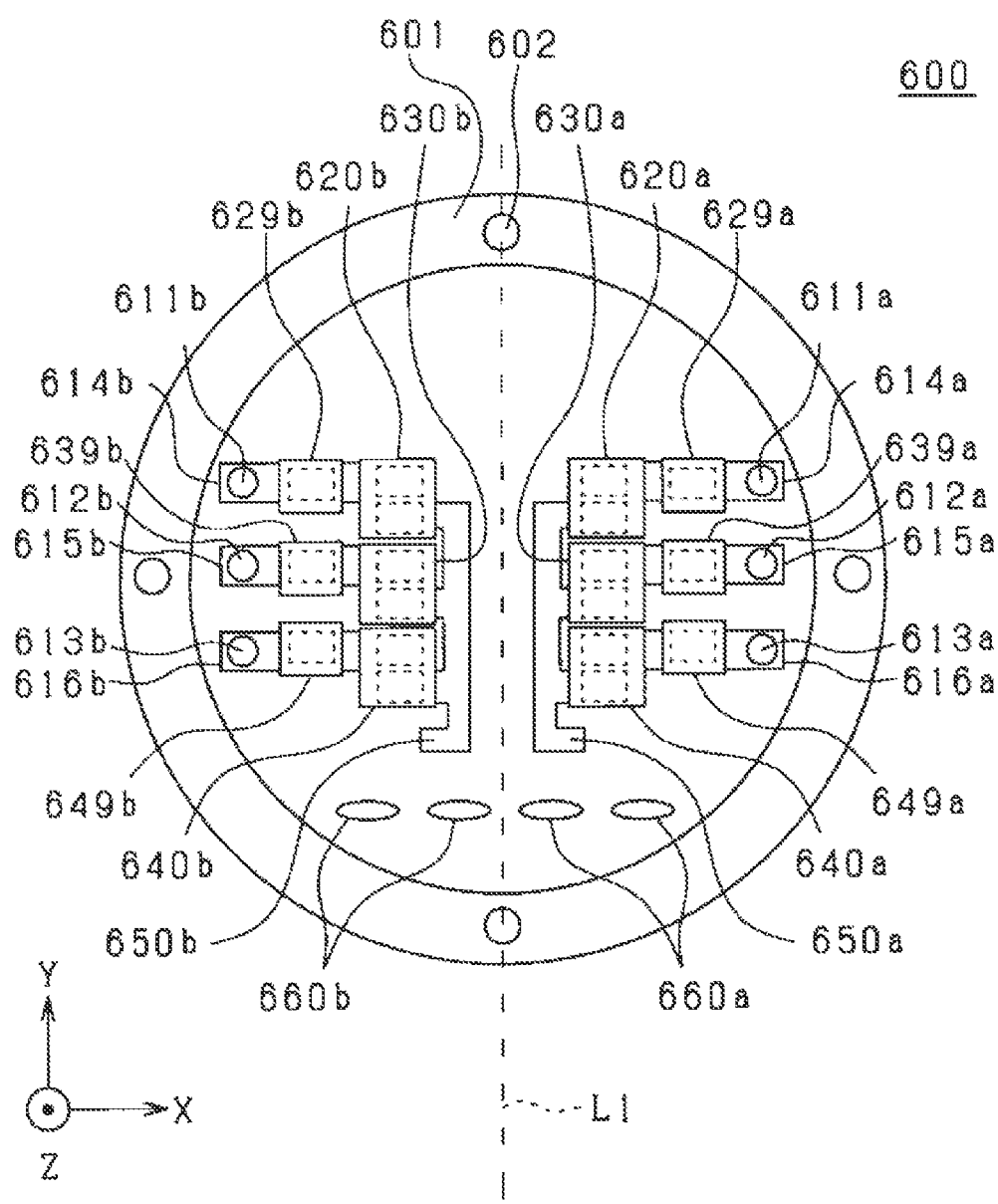
FIG. 15 is a plan view of the electronic device according to a fourth embodiment.

In the electronic device 600 shown in FIG. 15, there are two sets of the electric connection wiring, the motor connection wiring, and the semiconductor module so as to be substantially axisymmetric with respect to the center line L1 extending along the y direction of the wiring board 601 and passing through the x direction.

On the positive side of the axis from the center line L1 of the wiring board 601, the first motor output terminal 611a, the second motor output terminal 612a, the third motor output terminal 613a, the first motor connection wiring 614a, and the second motor connection wiring 615a, the third motor connection wiring 616a, the first semiconductor module 620a, the second semiconductor module 630a, the third semiconductor module 640a, the semiconductor modules 629a, 639a, 649a, the electric connection wiring 650, and the power supply terminal 660 are arranged. The arrangement position of the power supply terminal 660a is shifted in the positive direction of the x-axis with respect to the power supply terminal 560 shown in FIG. 13. Since the other configurations on the positive direction side of the axis from the center line L1 of the wiring board 601 are the same as the configurations on the wiring board 501 of the electronic device 500 shown in FIG. 13, the reference number in the 500 series is read as the 600 series with adding a subscript "a", and further, the description will be omitted.

On the negative side of the x-axis from the center line L1 of the wiring board 601, the first motor output terminal 611b, the second motor output terminal 612b, the third motor output terminal 613b, the first motor connection wiring 614b, the second motor connection wiring 615b, the third motor connection wiring 616b, the first semiconductor module 620b, the second semiconductor module 630b, the third semiconductor module 640b, the semiconductor modules 629b, 639b, 649b, the electric connection wiring 650, and the power supply terminal 660 are disposed. Other configurations on the negative direction side of the x-axis from the center line L1 of the wiring board 601 are equivalent to those in which each configuration on the positive direction side of the x-axis indicated by the subscript "a" is inverted with respect to the center line L1. Therefore, the description will be omitted by replacing the subscript "a" with the subscript "b".

As shown in FIG. 15, in the electronic device 600, a pair of electric connection wirings 650a and 650b are arranged on both sides of the center line L1 of the wiring board 601. A pair of first motor output terminals 611a, 611b, a pair of second motor output terminals 612a, 612b, and a pair of third motor output terminals 613a, 613b are arranged on the peripheral side of the wiring board 602 in the positive direction or the negative direction of the x-axis. The first motor connection wiring 614a, 614b, the second motor connection wiring 615a, 615b, and the third motor connection wiring 616a, 616b extending substantially linearly in the x direction are arranged between the electric connection wiring 650a and 650b and the first motor output terminal 611a and 611b, the second motor output terminal 612a and 612b, and the third motor output terminal 613a and 613b, respectively.

The first semiconductor modules 620a and 620b are arranged between the first motor connection wirings 614a and 614b and the electric connection wirings 650a and 650b, respectively, substantially parallel to the wiring direction of the first motor connection wirings 614a and 614b. The semiconductor modules 629a and 629b are arranged on the first motor connection wirings 614a and 614b, respectively. The second semiconductor modules 630a and 630b are arranged between the second motor connection wirings 615a and 615b and the electric connection wirings 650a and 650b, respectively, substantially parallel to the wiring direction of the second motor connection wirings 615a and 615b. The semiconductor modules 639a and 639b are arranged on the second motor connection wirings 615a and 615b, respectively. The third semiconductor modules 640a and 640b are arranged between the third motor connection wirings 616a and 616b and the electric connection wirings 650a and 650b, respectively, substantially parallel to the wiring direction of the third motor connection wirings 616a and 616b. The semiconductor modules 649a and 649b are arranged on the third motor connection wirings 616a and 616b, respectively.

That is, the first semiconductor module 620a, the second semiconductor module 630a, and the third semiconductor module 640a are disposed on the peripheral side of the electric connection wiring 650a, respectively, and on the center side of the first motor connection wiring 614a, the second motor connection wiring 615a, and the third motor connection wiring 616a. Further, the first semiconductor module 620b, the second semiconductor module 630b, and the third semiconductor module 640b are on the peripheral side of the electric connection wiring 650b, respectively, and on the center side of the first motor connection wiring 614b, the second motor connection wiring 615b, and the third motor connection wiring 616b.

Although not shown, the external terminals of the first semiconductor modules 620a, 620b, the second semiconductor modules 630a, 630b, and the third semiconductor modules 640a, 640b protrude to be opposed to each other in a direction substantially parallel to the wiring direction of the first motor connection wirings 614a, 614b, the second motor connection wirings 615a and 615b and the third motor connection wirings 616a and 616b, which are connected thereto, respectively. The drain terminals of the first semiconductor module 620a, the second semiconductor module 630a, and the third semiconductor module 640a are bonded to the electric connection wiring 650a. Further, the drain terminals of the first semiconductor module 620b, the second semiconductor module 630b, and the third semiconductor module 640b are bonded to the electric connection wiring 650b.

MODIFICATIONS EXAMPLES

Figure 16:
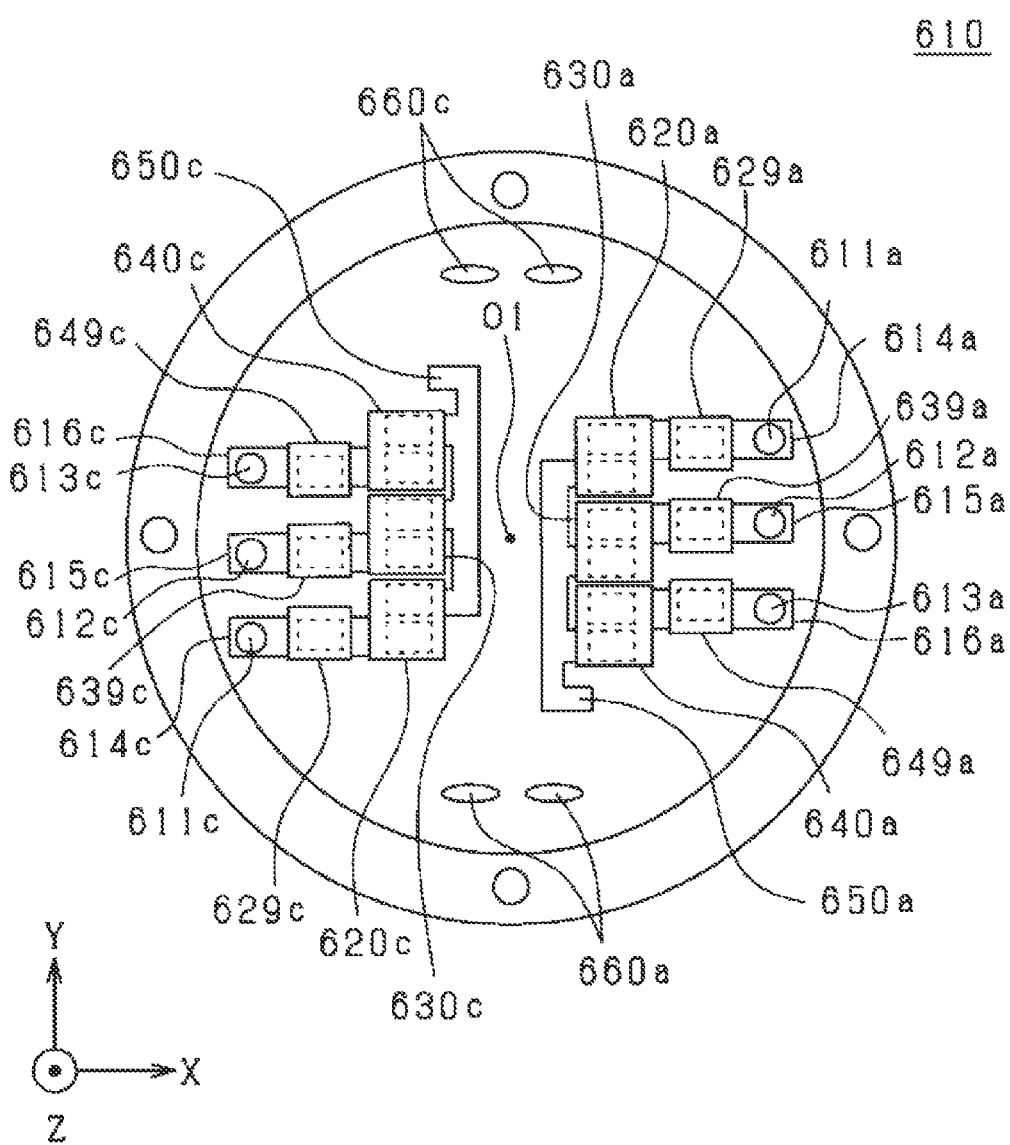
FIG. 16 is a plan view of an electronic device according to a modified example.

Like the electronic device 610 shown in FIG. 16, there may be two sets of electric connection wiring, the motor connection wiring, and the semiconductor module so as to be substantially point-symmetrical with respect to the center O1 in the x-direction and y-direction of the wiring board 601. Since each configuration indicated by the subscript "a" in FIG. 16 is the same as that of the electronic device 600 shown in FIG. 15, the description thereof will be omitted.

On the negative side of the x-axis from the center O1 of the wiring board 601, the first motor output terminal 611c, the second motor output terminal 612c, the third motor output terminal 613c, the first motor connection wiring 614c, and the second motor connection wiring 615c, the third motor connection wiring 616c, the first semiconductor module 620c, the second semiconductor module 630c, the third semiconductor module 640c, the semiconductor modules 629c, 639c, 649c, the electric connection wiring 650, and the power supply terminal 660 are disposed. For other configurations on the negative direction side of the x-axis from the center O1 of the wiring board 601, each configuration on the positive direction side of the x-axis indicated by the subscript "a" rotated 180 degrees on the xy plane with the center O1 as the axis is equivalent to the above, and therefore, the description is omitted by replacing the subscript "a" with the subscript "c".

Figure 17:
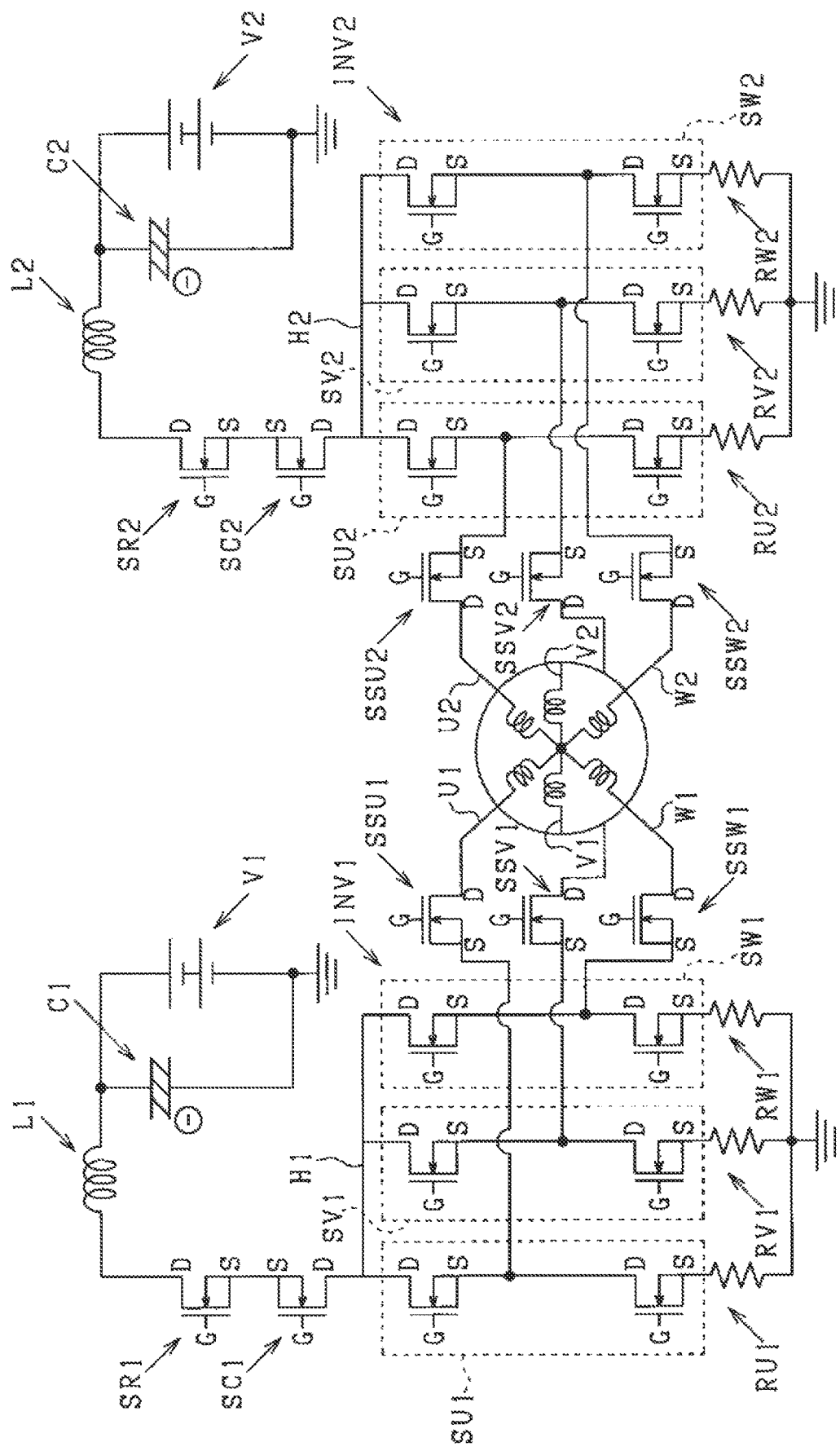
FIG. 17 is a diagram showing an example of a motor drive circuit to which the electronic device shown in FIGS. 15 and 16 is applied.

The electronic devices 600 and 610 can be applied to a drive circuit including two systems of three-phase inverters INV1 and INV2 as shown in FIG. 17. In the drive circuit shown in FIG. 17, the winding group M includes a pair of U, V, W phase windings U1, V1, W1 and U, V, W phase windings U2, V2, W2. Each configuration such as INV1 indicated by the subscript "1" on the left side of FIG. 17 is a circuit group 1 connected to the U, V, W phase windings U1, V1, W1 of the winding group M. Each configuration such as INV2 indicated by the subscript "2" on the right side of FIG. 17 is a circuit group 2 connected to the U, V, W phase windings U2, V2, W2 of the winding group M. Since the circuit configurations of the circuit groups 1 and 2 are the same as those of the drive circuit shown in FIG. 14, the description thereof will be omitted by adding the subscripts "1" or "2". Like the electronic devices 600 and 610, it can be applied to two or more systems of inverter circuits by being configured to include a plurality of sets of the electric connection wiring, the motor connection wiring, and the semiconductor modules arranged between them.

Fifth Embodiment

Figure 18:
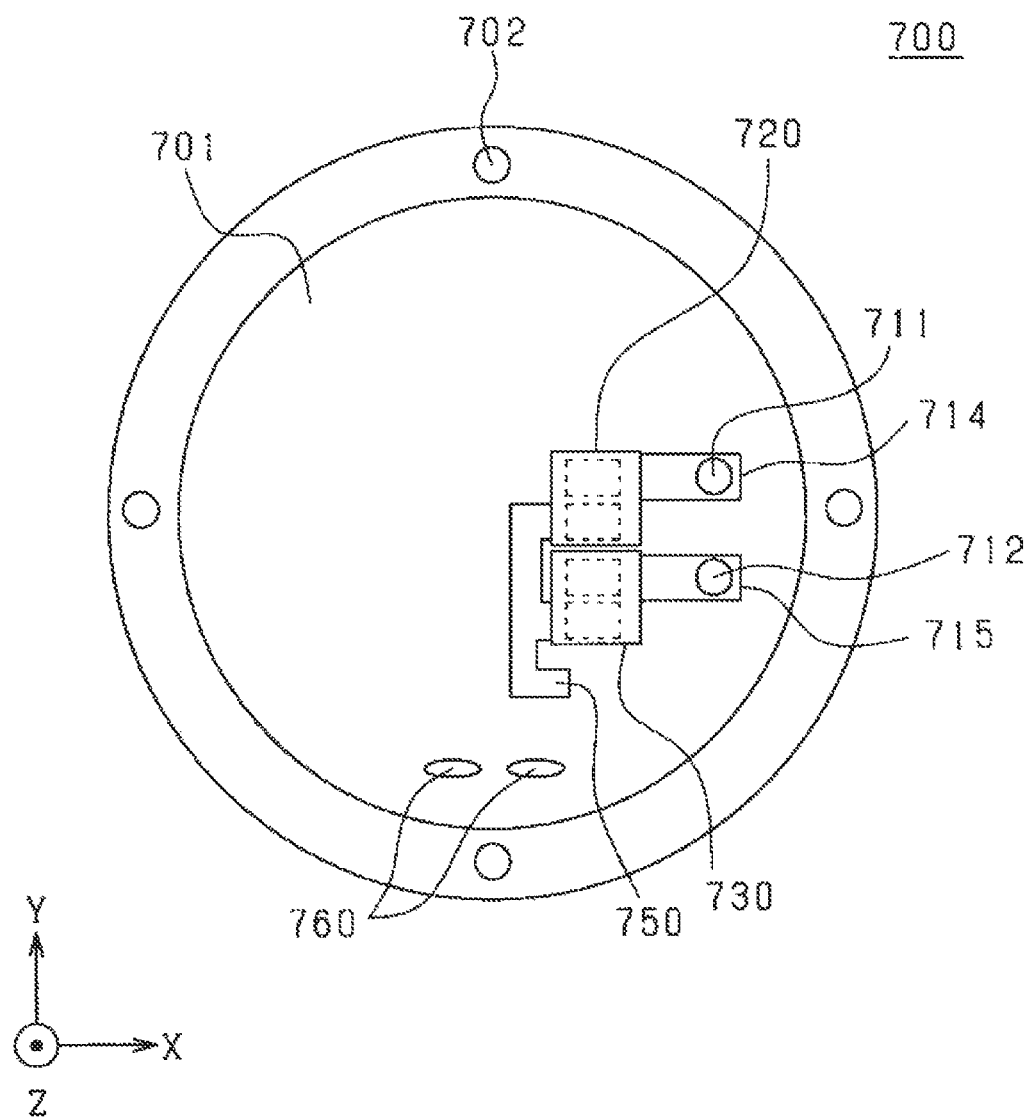
FIG. 18 is a plan view of the electronic device according to a fifth embodiment.
Figure 19:
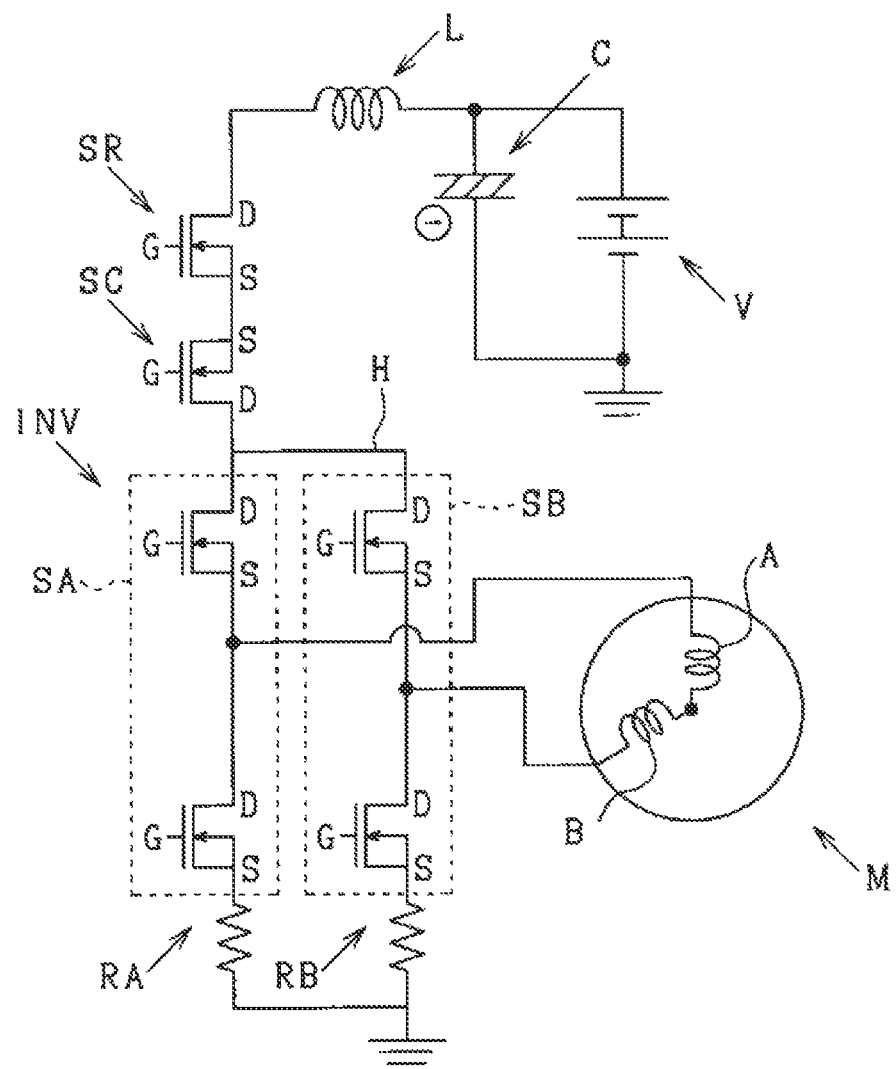
FIG. 19 is a diagram showing an example of a motor drive circuit to which the electronic device shown in FIG. 18 is applied.

As shown in FIGS. 18 and 19, the electronic device 700 may be applicable to one system of a H-bridge circuit. As shown in FIG. 18, the electronic device 700 has a first motor output terminal 711, a second motor output terminal 712, a first motor connection wiring 714, and a second motor connection wiring 715, a first semiconductor module 720, a second semiconductor module 730, an electric connection wiring 750, and a power supply terminal 760 on a wiring board 701. The first semiconductor module 720 is arranged between the first motor connection wiring 714 and the electric connection wiring 750 substantially parallel to the wiring direction of the first motor connection wiring 714. The second semiconductor module 730 is arranged between the second motor connection wiring 715 and the electric connection wiring 750 substantially parallel to the wiring direction of the second motor connection wiring 715. That is, the first semiconductor module 720 and the second semiconductor module 730 are arranged on the peripheral side of the electric connection wiring 750 and on the center side of the first motor connection wiring 714 and the second motor connection wiring 715, respectively.

Although not shown, the external terminals of the first semiconductor module 720 and the second semiconductor module 730 protrude and are opposed to each other in the direction substantially parallel to the wiring directions of the first motor connection wiring 714 and the second motor connection wiring 715 to which they are connected. The drain terminals of the first semiconductor module 720 and the second semiconductor module 730 are bonded to the electric connection wiring 750.

The drive circuit shown in FIG. 19 is different from FIG. 6 in that a drive circuit of the two-phase motor is replaced with the drive circuit of the three-phase motor shown in FIG. 6, and the other circuit configurations are the same. The winding group M includes an A-phase winding A and a B-phase winding B, and the first end of each winding is connected at a neutral point. The inverter INV includes a switch group SU, SV, and SW including a pair of upper arm switch and lower arm switch. The second end of the A-phase winding A is connected to the connection point between the upper arm switch and the lower arm switch of the switch group SA. The second end of the B-phase winding B is connected to the connection point between the upper arm switch and the lower arm switch of the switch group SB.

The high potential side terminal H of the upper arm switch of the switch group SA, SB is connected to the positive electrode terminal of the battery V, which is a DC power supply, via the power supply relay SR, the reverse connection protection relay SC, and the inductor L. A bypass capacitor C is connected in parallel with the battery V. The negative electrode terminal of the battery V is connected to ground. The low potential side terminal of the lower arm switch of the switch group SA and SB is connected to the ground via the resistors RA and RB.

The first semiconductor module 720 can be used as a semiconductor module in which the upper arm switch and the lower arm switch of the switch group SA are integrated. The second semiconductor module 730 can be used as a semiconductor module in which the upper arm switch and the lower arm switch of the switch group SB are integrated. The electronic device 700 can be applied to one system of the H-bridge circuit shown in FIG. 19.

Sixth Embodiment

Figure 20:
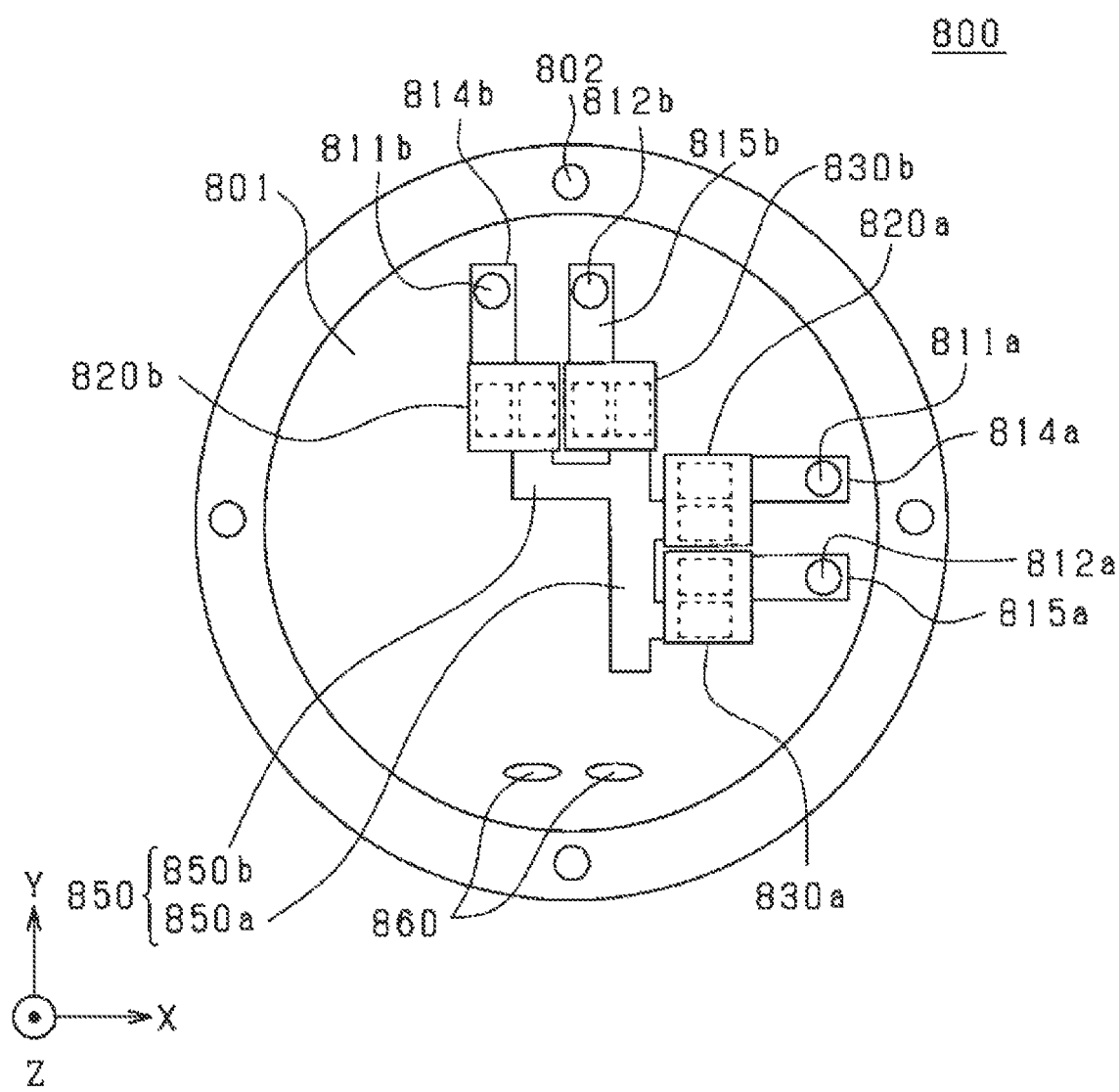
FIG. 20 is a plan view of the electronic device according to a sixth embodiment.

As shown in FIG. 20, it is also possible to provide an electronic device 800 applicable to two systems of H-bridge circuits. The electronic device 800 has the first motor output terminals 811a and 811b, the second motor output terminals 812a and 812b, the first motor connection wirings 814a and 814b, the second motor connection wirings 815a and 815b, the first semiconductor modules 820a and 820b, the second semiconductor modules 830a and 830b, the electric connection wiring 850, and the power supply terminal 860 on the wiring board 801.

The electronic device 800 includes a substantially L-shaped electric connection wiring 850 in the substantially center of the wiring board 801. The electric connection wiring 850 includes a first portion 850a extending in the y direction at the substantially center of the wiring board 801 in the x direction and a second portion 850b extending in the x direction at the substantially center of the wiring board 801 in the y direction. The first portion 850a and the second portion 850b are integrally formed.

The first motor output terminal 811a and the second motor output terminal 812a are arranged on the peripheral side of the wiring board 801 in the positive direction of the x-axis. The first motor connection wiring 814a and the second motor connection wiring 815a extending substantially linearly in the x direction are arranged between the first portion 850a of the electric connection wiring and the first motor output terminal 811a and the second motor output terminal 812a. The first semiconductor module 820a is arranged between the first motor connection wiring 814a and the first portion 850a of the electric connection wiring substantially parallel to the wiring direction of the first motor connection wiring 814a. The second semiconductor module 830a is arranged between the second motor connection wiring 815a and the first portion 850a of the electric connection wiring substantially parallel to the wiring direction of the second motor connection wiring 815a.

The first motor output terminal 811b and the second motor output terminal 812b are arranged on the peripheral side of the wiring board 801 in the positive direction of the y-axis. The first motor connection wiring 814b and the second motor connection wiring 815b extending substantially linearly in the y direction are arranged between the second portion 850b of the electric connection wiring and the first motor output terminal 811b and the second motor output terminal 812b. The first semiconductor module 820b is arranged between the first motor connection wiring 814b and the second portion 850b of the electric connection wiring substantially parallel to the wiring direction of the first motor connection wiring 814b. The second semiconductor module 830b is arranged between the second motor connection wiring 815b and the second portion 850b of the electric connection wiring substantially parallel to the wiring direction of the second motor connection wiring 815b. That is, the first semiconductor modules 820a and 820b and the second semiconductor modules 830a and 830b are disposed on the peripheral side of the electric connection wiring 850 and on the center side from the first motor connection wirings 814a and 814b and the second motor connection wirings 815a and 815b, respectively.

The first semiconductor modules 820a and 820b and the second semiconductor modules 830a and 830b are semiconductor modules having the same structure as the first semiconductor module 120 according to the first embodiment. The first semiconductor module 820a and the second semiconductor module 830a include two semiconductor elements in a resin mold, and the two semiconductor elements are arranged so as to be arranged substantially in parallel in the x direction in the same direction. The first semiconductor module 820b and the second semiconductor module 830b include two semiconductor elements in a resin mold, and the two semiconductor elements are arranged so as to be arranged substantially in parallel in the y direction in the same direction. Although not shown, the external terminals of the first semiconductor modules 820a and 820b and the second semiconductor modules 830a and 830b protrude to be opposed to each other in a direction substantially parallel to the wiring direction of the first motor connection wirings 814a and 814b and the second motor connection wirings 815a and 815b, which are connected thereto. The drain terminals of the first semiconductor module 820a and the second semiconductor module 830a are bonded to the electric connection wiring 850a. The drain terminals of the first semiconductor module 820b and the second semiconductor module 830b are bonded to the electric connection wiring 850b.

Figure 21:
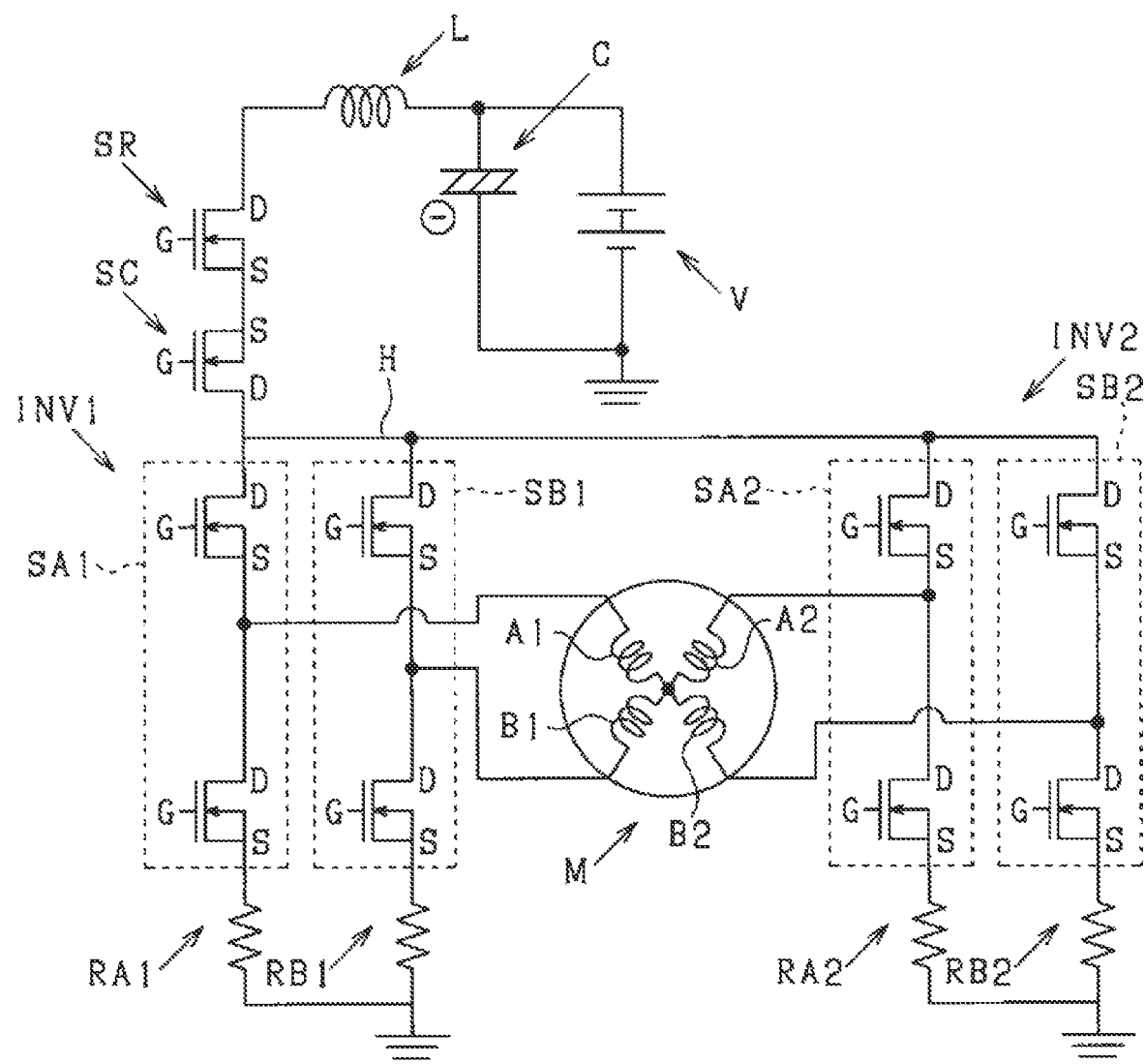
FIG. 21 is a diagram showing an example of a motor drive circuit to which the electronic device shown in FIG. 20 is applied.

The electronic device 800 can be applied to a drive circuit as shown in FIG. 21. The drive circuit shown in FIG. 21 is a two-system H-bridge circuit, and the winding group M includes a pair of A and B phase windings A1 and B1 and A and B phase windings A2 and B2. Each configuration such as INV1 indicated by the subscript "1" on the left side of FIG. 21 is a circuit group 1 connected to the A and B phase windings A1 and B1 of the winding group M. Each configuration such as INV2 indicated by the subscript "2" on the right side of FIG. 21 is a circuit group 2 connected to the A and B phase windings A2 and B2 of the winding group M.

The inverter INV1 includes a switch group SA1, SB1 including a pair of upper arm switch and lower arm switch. The inverter INV2 includes a switch group SA2, SB2 including a pair of upper arm switch and lower arm switch. The second end of the A-phase winding A1 is connected to the connection point between the upper arm switch and the lower arm switch of the switch group SA1. The second end of the B-phase winding B1 is connected to the connection point between the upper arm switch and the lower arm switch of the switch group SB1. The second end of the A-phase winding A2 is connected to the connection point between the upper arm switch and the lower arm switch of the switch group SA2. The second end of the B-phase winding B2 is connected to the connection point between the upper arm switch and the lower arm switch of the switch group SB2.

The high potential side terminal H of the upper arm switch of the switch group SA1, SB1, SA2, SB2 is connected to the positive electrode terminal of the battery V, which is a DC power supply, via the power supply relay SR, the reverse connection protection relay SC, and the inductor L. A bypass capacitor C is connected in parallel with the battery V. The negative electrode terminal of the battery V is connected to ground. The low potential side terminal of the lower arm switch of the switch group SA1 and SB1 is connected to the ground via the resistors RA1 and RB1. The low potential side terminal of the lower arm switch of the switch group SA2 and SB2 is connected to the ground via the resistors RA2 and RB2.

The first semiconductor module 820a can be used as a semiconductor module in which the upper arm switch and the lower arm switch of the switch group SA1 are integrated. The second semiconductor module 830a can be used as a semiconductor module in which the upper arm switch and the lower arm switch of the switch group SB1 are integrated. The first semiconductor module 820b can be used as a semiconductor module in which the upper arm switch and the lower arm switch of the switch group SA2 are integrated. The second semiconductor module 830b can be used as a semiconductor module in which the upper arm switch and the lower arm switch of the switch group SB2 are integrated. Like the electronic device 800, by connecting two sets of motor connection wiring and a semiconductor module to the same electric connection wiring, it can be applied to two system of H-bridge circuits.

MODIFICATIONS EXAMPLES

Figure 22:
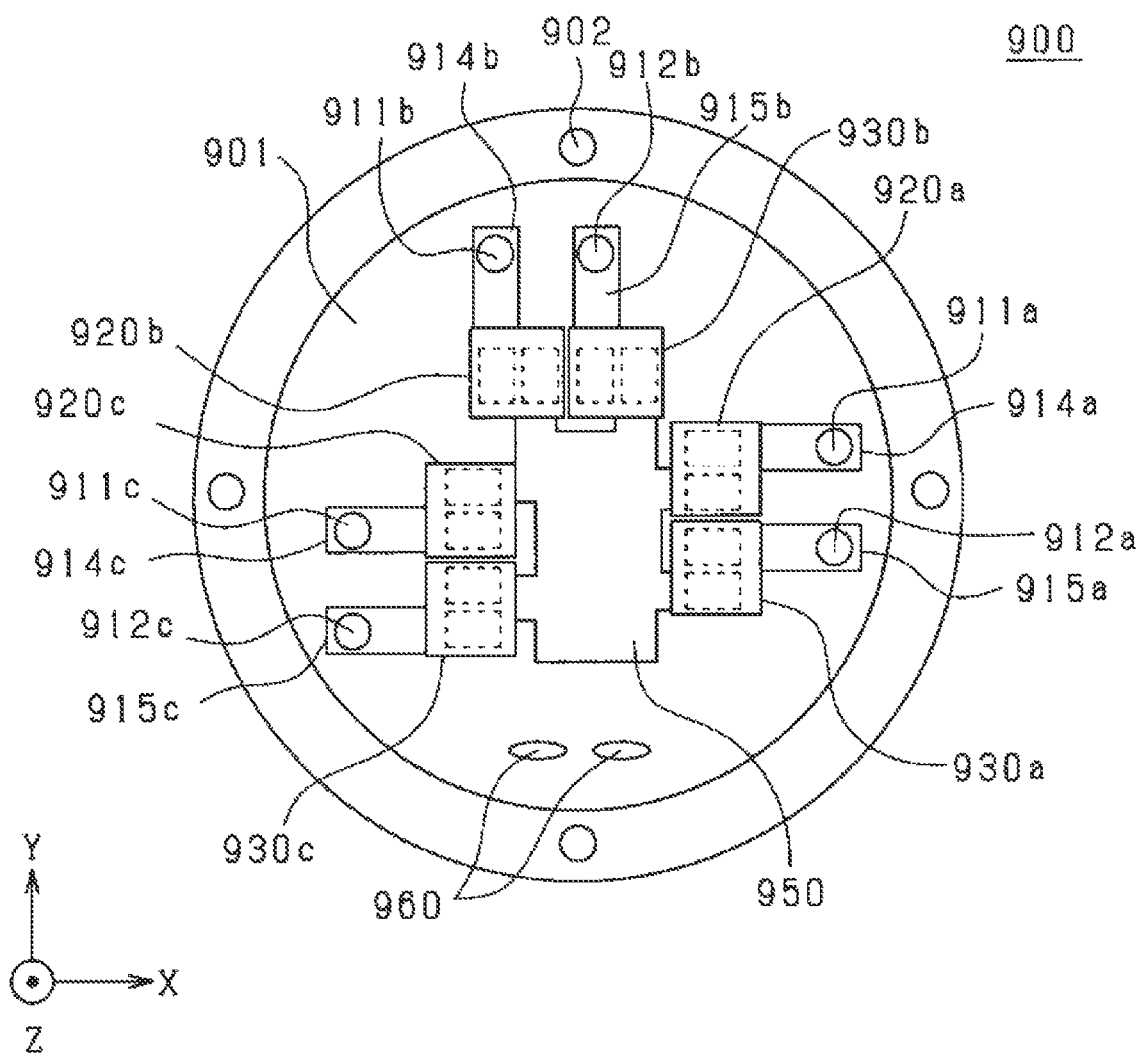
FIG. 22 is a plan view of an electronic device according to a modified example.

In the sixth embodiment, the two sets of the motor connection wiring and the semiconductor module are connected to the same electric connection wiring, but the present embodiment may not be limited to this feature. As in the electronic device 900 shown in FIG. 22, three or more sets of the motor connection wiring and the semiconductor module may be connected to the same electric connection wiring.

The electronic device 900 has the first motor output terminals 911a and 911b, the second motor output terminals 912a and 912b, the first motor connection wirings 914a and 914b, the second motor connection wirings 915a and 915b, the first semiconductor modules 920a and 920b, the second semiconductor modules 930a and 930b, the electric connection wiring 950, and the power supply terminal 960 on the wiring board 901. The electronic device 900 includes a substantially rectangular electric connection wiring 950 whose long side is in the y direction at the substantially center of the wiring board 901.

The first motor output terminal 911a and the second motor output terminal 912a are arranged on the peripheral side of the wiring board 901 in the positive direction of the x-axis. The first motor connection wiring 914a and the second motor connection wiring 915a extending substantially linearly in the x direction are arranged between the electric connection wiring 950 and the first motor output terminal 911a and the second motor output terminal 912a. The first semiconductor module 920a is arranged between the first motor connection wiring 914a and the the electric connection wiring 950 substantially parallel to the wiring direction of the first motor connection wiring 914a. The second semiconductor module 930a is arranged between the second motor connection wiring 915a and the electric connection wiring 950 substantially parallel to the wiring direction of the second motor connection wiring 915a.

The first motor output terminal 911b and the second motor output terminal 912b are arranged on the peripheral side of the wiring board 901 in the positive direction of the y-axis. The first motor connection wiring 914b and the second motor connection wiring 915b extending substantially linearly in the y direction are arranged between the electric connection wiring 950 and the first motor output terminal 911b and the second motor output terminal 912b. The first semiconductor module 920b is arranged between the first motor connection wiring 914b and the electric connection wiring 950 substantially parallel to the wiring direction of the first motor connection wiring 914b. The second semiconductor module 930b is arranged between the second motor connection wiring 915b and the electric connection wiring 950 substantially parallel to the wiring direction of the second motor connection wiring 915b.

The first motor output terminal 911c and the second motor output terminal 912c are arranged on the peripheral side of the wiring board 901 in the negative direction of the x-axis. The first motor connection wiring 914c and the second motor connection wiring 915c extending substantially linearly in the x direction are arranged between the electric connection wiring 950 and the first motor output terminal 911c and the second motor output terminal 912c. The first semiconductor module 920c is arranged between the first motor connection wiring 914c and the electric connection wiring 950 substantially parallel to the wiring direction of the first motor connection wiring 914c. The second semiconductor module 930c is arranged between the second motor connection wiring 915c and the electric connection wiring 950 substantially parallel to the wiring direction of the second motor connection wiring 915c.

The first semiconductor modules 920a, 920b and 920c and the second semiconductor modules 930a, 930b and 930c are semiconductor modules having the same structure as the first semiconductor module 120 according to the first embodiment. The first semiconductor module 920a and the second semiconductor module 930a include two semiconductor elements in a resin mold, and the two semiconductor elements are arranged so as to be arranged substantially in parallel in the x direction in the same direction. The first semiconductor module 920b and the second semiconductor module 930b include two semiconductor elements in a resin mold, and the two semiconductor elements are arranged so as to be arranged substantially in parallel in the y direction in the same direction. The first semiconductor module 920c and the second semiconductor module 930c include two semiconductor elements in a resin mold, and the two semiconductor elements are arranged so as to be arranged substantially in parallel in the x direction in the same direction. Although not shown, the external terminals of the first semiconductor modules 920a, 920b and 920c and the second semiconductor modules 930a, 930b and 930c protrude to be opposed to each other in a direction substantially parallel to the wiring direction of the first motor connection wirings 914a, 914b and 914c and the second motor connection wirings 915a, 915b and 915c, which are connected thereto.

Figure 23:
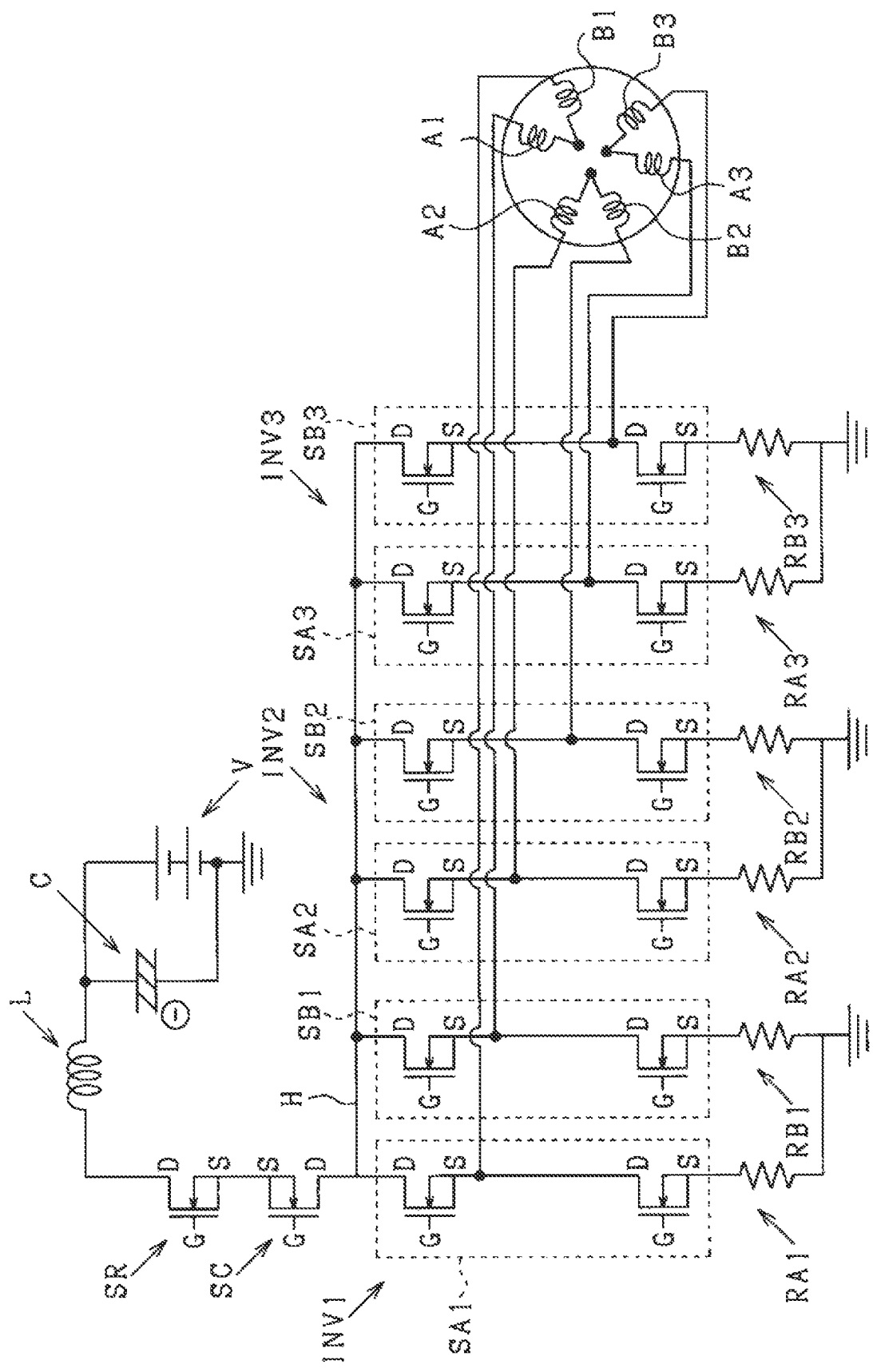
FIG. 23 is a diagram showing an example of a motor drive circuit to which the electronic device shown in FIG. 22 is applied.

The electronic device 900 can be applied to three systems of the H-bridge circuit shown in FIG. 23. The winding group M includes A and B phase windings A1 and B1, A and B phase windings A2 and B2, and A and B phase windings A3 and B3. Each configuration such as INV1 indicated by the subscript "1" of FIG. 23 is a circuit group 1 connected to the A and B phase windings A1 and B1 of the winding group M. Each configuration such as INV2 indicated by the subscript "2" of FIG. 23 is a circuit group 2 connected to the A and B phase windings A2 and B2 of the winding group M. Each configuration such as INV3 indicated by the subscript "3" of FIG. 23 is a circuit group 3 connected to the A and B phase windings A3 and B3 of the winding group M.

The inverter INV1 includes a switch group SA1, SB1 including a pair of upper arm switch and lower arm switch. The inverter INV2 includes a switch group SA2, SB2 including a pair of upper arm switch and lower arm switch. The inverter INV3 includes a switch group SA3, SB3 including a pair of upper arm switch and lower arm switch. The second end of the A-phase winding A1 is connected to the connection point between the upper arm switch and the lower arm switch of the switch group SA1. The second end of the B-phase winding B1 is connected to the connection point between the upper arm switch and the lower arm switch of the switch group SB1. The second end of the A-phase winding A2 is connected to the connection point between the upper arm switch and the lower arm switch of the switch group SA2. The second end of the B-phase winding B2 is connected to the connection point between the upper arm switch and the lower arm switch of the switch group SB2. The second end of the A-phase winding A3 is connected to the connection point between the upper arm switch and the lower arm switch of the switch group SA3. The second end of the B-phase winding B3 is connected to the connection point between the upper arm switch and the lower arm switch of the switch group SB3.

The high potential side terminal H of the upper arm switch of the switch group SA1, SB1, SA2, SB2, SA3 and SB3 is connected to the positive electrode terminal of the battery V, which is a DC power supply, via the power supply relay SR, the reverse connection protection relay SC, and the inductor L. A bypass capacitor C is connected in parallel with the battery V. The negative electrode terminal of the battery V is connected to ground. The low potential side terminal of the lower arm switch of the switch group SA1 and SB1 is connected to the ground via the resistors RA1 and RB1. The low potential side terminal of the lower arm switch of the switch group SA2 and SB2 is connected to the ground via the resistors RA2 and RB2. The low potential side terminal of the lower arm switch of the switch group SA3 and SB3 is connected to the ground via the resistors RA3 and RB3.

The first semiconductor module 920a can be used as a semiconductor module in which the upper arm switch and the lower arm switch of the switch group SA1 are integrated. The second semiconductor module 930a can be used as a semiconductor module in which the upper arm switch and the lower arm switch of the switch group SB1 are integrated. The first semiconductor module 920b can be used as a semiconductor module in which the upper arm switch and the lower arm switch of the switch group SA2 are integrated. The second semiconductor module 930b can be used as a semiconductor module in which the upper arm switch and the lower arm switch of the switch group SB2 are integrated. The first semiconductor module 920c can be used as a semiconductor module in which the upper arm switch and the lower arm switch of the switch group SA3 are integrated. The second semiconductor module 930c can be used as a semiconductor module in which the upper arm switch and the lower arm switch of the switch group SB3 are integrated.

According to the embodiments described above, the following effects can be obtained. The first semiconductor module 920c can be used as a semiconductor module in which the upper arm switch and the lower arm switch of the switch group SA3 are integrated. The second semiconductor module 930c can be used as a semiconductor module in which the upper arm switch and the lower arm switch of the switch group SB3 are integrated.

Seventh Embodiment

In the seventh embodiment, an electronic device 1000 provided with a plurality of sets of the electric connection wiring, the motor connection wiring, and the semiconductor module arranged between them will be described, similar to the fourth embodiment.

Figure 24:
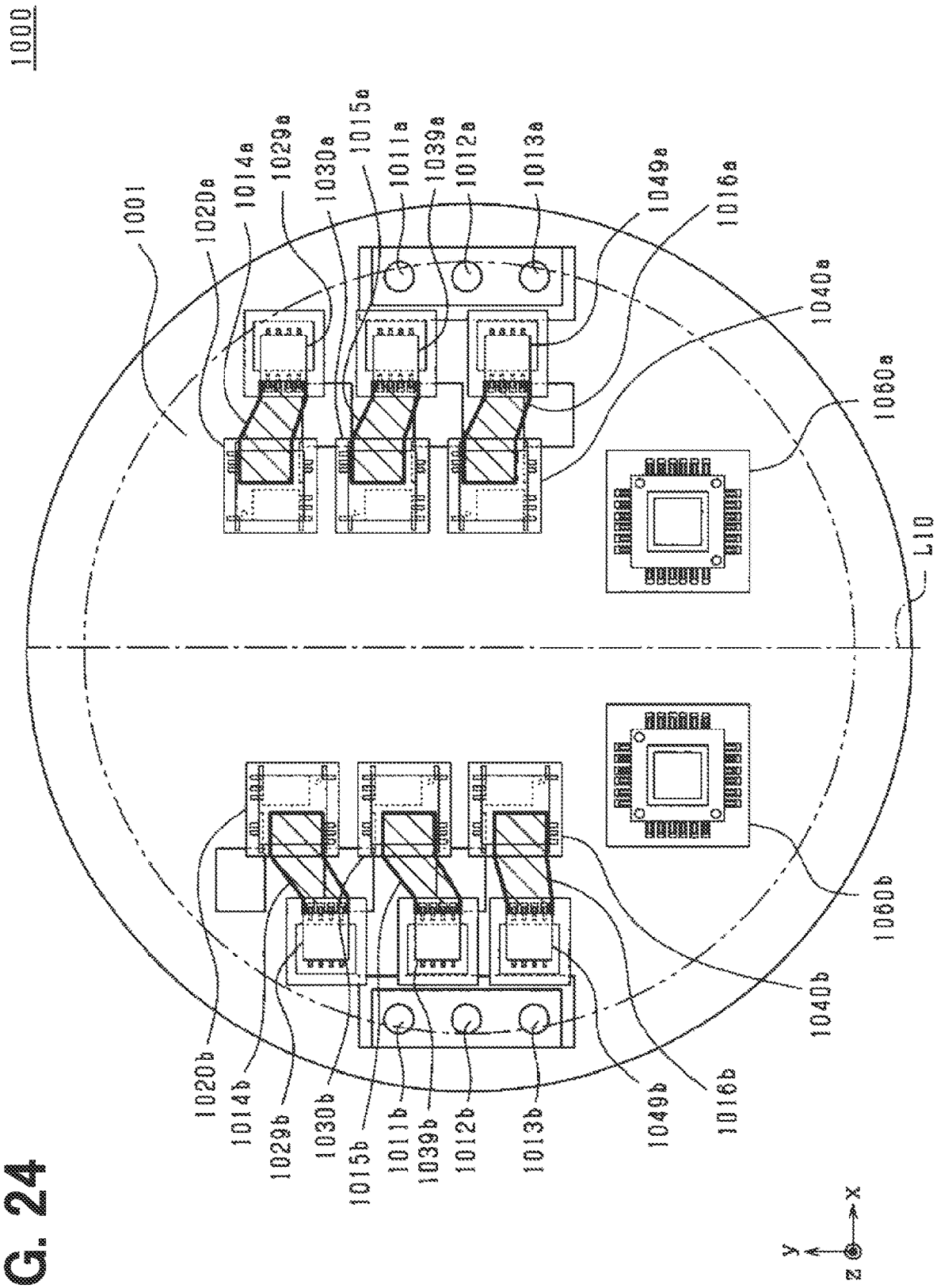
FIG. 24 is a plan view showing a state in which the electric connection wiring is removed in the electronic device according to the seventh embodiment.
Figure 25:
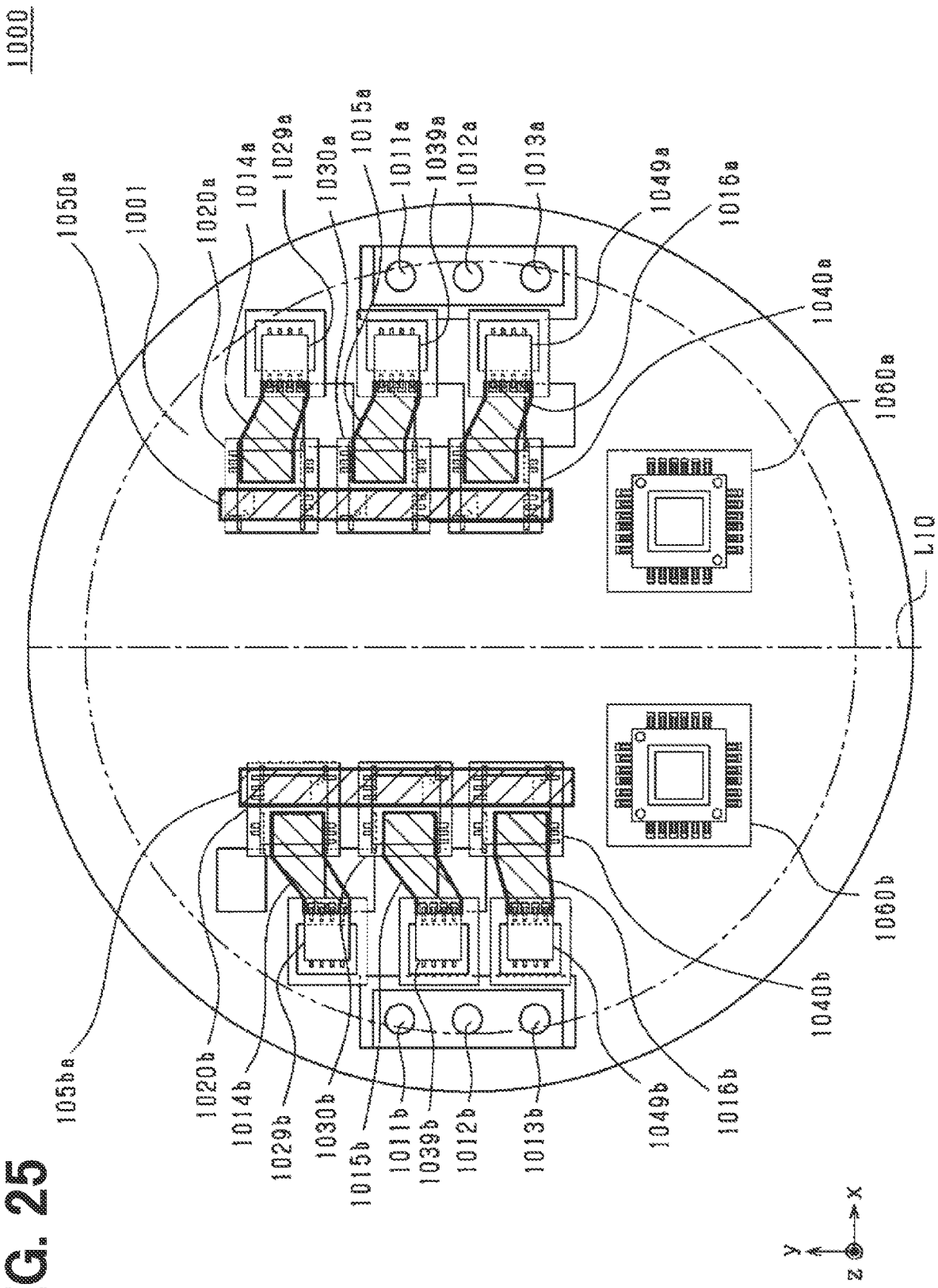
FIG. 25 is a plan view showing a state in which an electric connection wiring is arranged in the electronic device shown in FIG. 24.

In the electronic device 1000 shown in FIGS. 24 and 25, there are two sets of the electric connection wiring, the motor connection wiring, and the semiconductor module so as to be substantially axisymmetric with respect to the center line L10 extending along the y direction of the wiring board 1001 and passing through the almost center of the x direction.

On the positive side of the axis from the center line L10 of the wiring board 1001, the first motor output terminal 1011a, the second motor output terminal 1012a, the third motor output terminal 1013a, the first motor connection wiring 1014a, and the second motor connection wiring 1015a, the third motor connection wiring 1016a, the first semiconductor module 1020a, the second semiconductor module 1030a, the third semiconductor module 1040a, the semiconductor modules 1029a, 1039a, 1049a, the electric connection wiring 1050a, and the integrated circuit 1060a are arranged. The integrated circuit 1060a switches and controls the first semiconductor module 1020a, the second semiconductor module 1030a, and the third semiconductor module 1040a.

On the negative side of the x-axis from the center line L10 of the wiring board 1001, the first motor output terminal 1011b, the second motor output terminal 1012b, the third motor output terminal 1013b, the first motor connection wiring 1014b, the second motor connection wiring 1015b, the third motor connection wiring 1016b, the first semiconductor module 1020b, the second semiconductor module 1030b, the third semiconductor module 1040b, the semiconductor modules 1029b, 1039b, 1049b, the electric connection wiring 1050b, and the integrated circuit 1060b are disposed. The integrated circuit 1060b switches and controls the first semiconductor module 1020b, the second semiconductor module 1030b, and the third semiconductor module 1040b.

Other configurations on the negative direction side of the x-axis from the center line L10 of the wiring board 1001 are almost equivalent to those in which each configuration on the positive direction side of the x-axis indicated by the subscript "a" is inverted with respect to the center line L10. Therefore, the description will be omitted by replacing the subscript "a" with the subscript "b". On the wiring board 1001, the semiconductor modules such as the first semiconductor modules 1020a and 1020b and the calculation units such as integrated circuits 1060a and 1060b that control the operation of the electric motor are mounted on the same board. By arranging the drive circuit provided by the semiconductor module and the control circuit of the calculation unit on the same board, in addition to the effect of minimizing the size of the product, the noise suppression effect by shortening the arrangement of the wiring of the high frequency signal line can be obtained. The configuration that functions as the calculation unit may be mounted on the same substrate as the first semiconductor modules 1020a, 1020b, and the like, and may be mounted on the same surface as the mounting surface of the first semiconductor modules 1020a, 1020b, and the like. Alternatively, It may be mounted on the back surface thereof. Specifically, as shown in FIGS. 24 and 25, the integrated circuits 1060a and 1060b that function as sub calculation units may be mounted on the same surface as the mounting surface of the first semiconductor modules 1020a and 1020b, and the microcomputer functioning as the main calculation unit may be mounted on the back surface thereof.

As shown in FIG. 24, in the electronic device 1000, a pair of electric connection wirings 1050a and 1050b are arranged on both sides of the center line L10 of the wiring board 1001. A pair of first motor output terminals 1011a, 1011b, a pair of second motor output terminals 1012a, 1012b, and a pair of third motor output terminals 1013a, 1013b are arranged on the peripheral side of the wiring board 1002 in the positive direction or the negative direction of the x-axis. The first motor connection wiring 1014a, 1014b, the second motor connection wiring 1015a, 1015b, and the third motor connection wiring 1016a, 1016b extending substantially linearly in the x direction are arranged between the electric connection wiring 1050a and 1050b and the first motor output terminal 1011a and 1011b, the second motor output terminal 1012a and 1012b, and the third motor output terminal 1013a and 1013b, respectively.

In the electronic device 1000, the first semiconductor modules 1020a and 1020b, the second semiconductor modules 1030a and 1030b, and the third semiconductor modules 1040a and 1040b are semiconductor modules in which the electrodes of the two semiconductor elements are exposed from the resin mold on the lower surfaces thereof (i.e., the surface on the positive direction side of the z-axis shown in FIGS. 24 and 25). In the seventh embodiment, one of the two exposed electrodes of the two semiconductor elements is bonded to the first motor connection wiring 1014a, 1014b, the second motor connection wiring 1015a, 1015b, and the third motor connection wiring 1016a, 1016b. The other is bonded to the electric connection wirings 1050a and 1050b.

As an example of the semiconductor modules that can be used as the first semiconductor modules 1020a and 1020b, the second semiconductor modules 1030a and 1030b, and the third semiconductor modules 1040a and 1040b, the semiconductor module 1200 is shown in FIGS. 26 to 29.

As shown in FIGS. 26 to 29, a semiconductor module 1200 includes a first semiconductor element 1233 and a second semiconductor element 1243, a resin mold 1220 for integrally sealing the first semiconductor element 1233 and the second semiconductor element 1243, conductive members 1201-1205, and conductive members 1211, 1212, 1231, 1241. An x-axis direction and a y-axis direction shown in FIGS. 26 to 29 are sides of the semiconductor module 1200, and an xy-plane direction is a plane direction of the semiconductor module 1200. The z-axis direction is a vertical direction orthogonal to the plane direction.

Figure 26:
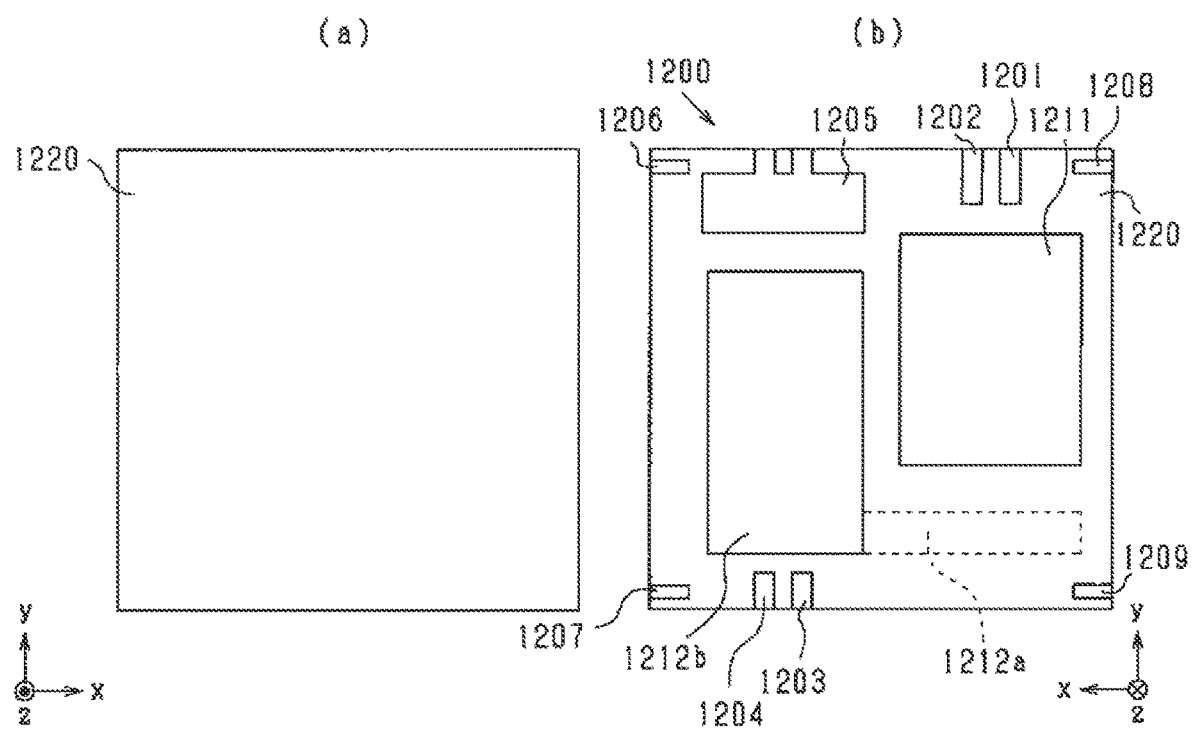
FIG. 26 is a plan view of a semiconductor module provided in the electronic device shown in FIG. 24.
Figure 27:
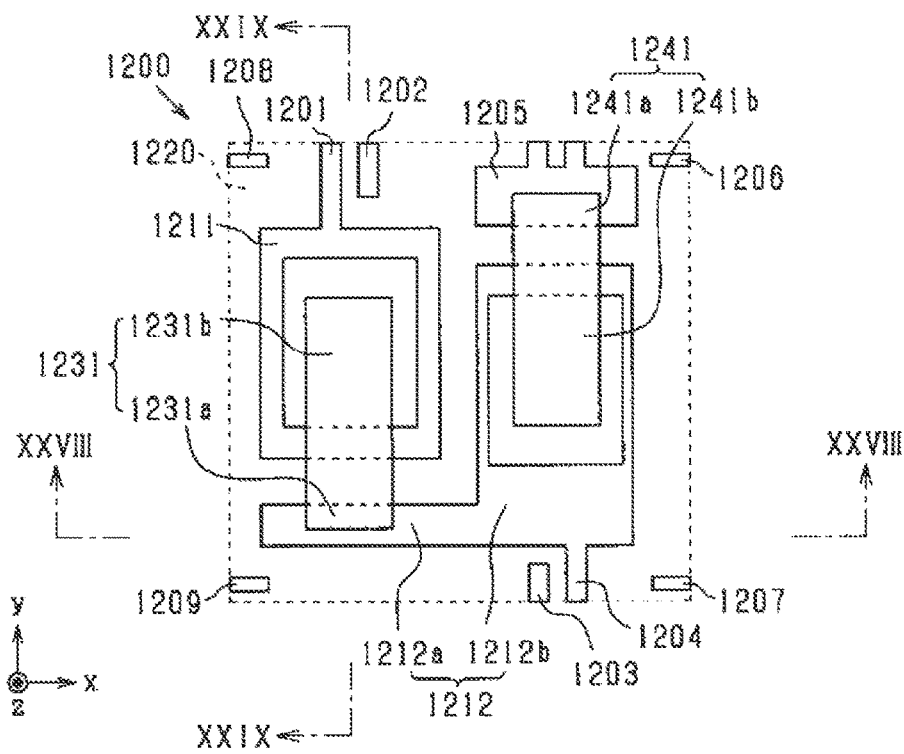
FIG. 27 is a plan view showing a state in which the resin mold is not arranged in the semiconductor module shown in FIG. 26.
Figure 28:
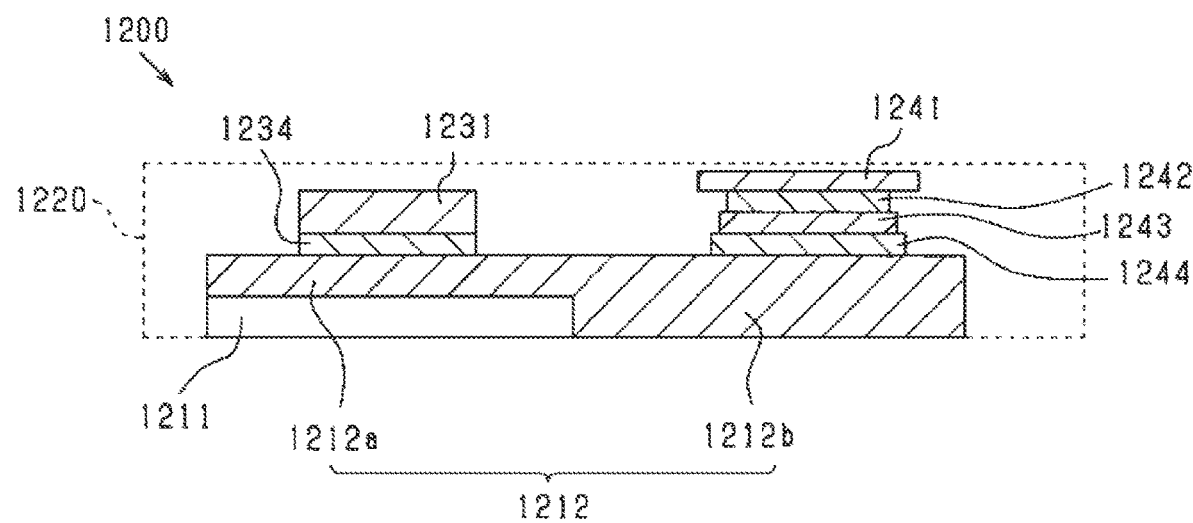
FIG. 28 is a cross-sectional view taken along a line XXVIII-XXVIII of FIG. 27.
Figure 29:
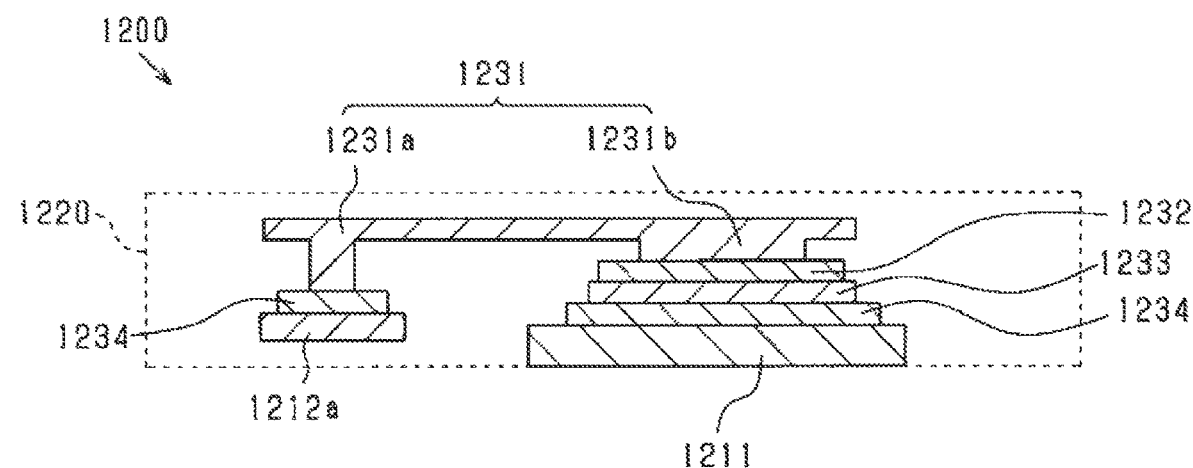
FIG. 29 is a cross-sectional view taken along line XXIX-XXIX of FIG. 27.

(a) of FIG. 26 is a top view of the semiconductor module 1200, and (b) of FIG. 26 is a bottom view of the semiconductor module 1200. FIG. 27 is a top view of each configuration in the resin mold 1220 of the semiconductor module 1200, and FIGS. 28 and 29 are cross-sectional views of each configuration in the resin mold 1220 of the semiconductor module 1200. In FIGS. 27 to 29, the position where the resin mold 1220 is provided is shown by a broken line.

As shown in FIGS. 26 to 29, in the resin mold 1220, the second semiconductor element 1243 is integrally sealed while being arranged side by side in the x direction along a direction rotated by 180 degrees with respect to the first semiconductor element 1233 around the vertical direction (i.e., the z direction). The first semiconductor element 1233 and the second semiconductor element 1243 are semiconductor elements having the same structure, shape, size, and the like, and have a substantially rectangular shape when viewed from the top.

On the first semiconductor element 1233 side, the conductive member 1231, the bonding member 1232, the first semiconductor element 1233, the bonding member 1234, and the conductive member 1211 are arranged in this order from above. On the second semiconductor element 1243 side, the conductive member 1241, the bonding member 1242, the second semiconductor element 1243, the bonding member 1244, and the conductive member 1212 are arranged in this order from above. Corner pins 1206-1209 are arranged in the vicinity of the four corners of the resin mold 1220.

When the semiconductor module 1200 is viewed from the lower surface, the entire lower surfaces of the conductive members 1201 to 1205 and the conductive member 1211 are exposed from the resin mold 1220.

In the semiconductor module 1200, as shown in (b) of FIG. 26, the conductive members 1201 to 1205 that function as the gate terminal, the source terminal, or the drain terminal are exposed on the lower surface side (i.e., the negative direction of the z-axis) of the resin mold 1220, and do not protrude in the lateral y direction.

The conductive member 1212 includes a low step portion 1212a that is not exposed from the resin mold 1220 and a high step portion 1212b that is exposed from the resin mold 1220. The high step portion 1212b is a substantially rectangular portion arranged below and around the second semiconductor element 1243. The low step portion 1212a is an elongated rectangular portion extending from the end of the high step portion 1212b to the side where the first semiconductor element 1233 is arranged (i.e, the negative direction side of the x-axis).

The conductive member 1231 has a substantially rectangular shape when viewed from above, and includes an extending portion 1231a and a pad portion 1231b. The pad portion 1231b is located on the upper surface side of the first semiconductor element 1233, and is bonded to the upper surface side (i.e., the source electrode side) of the first semiconductor element 1233 via the bonding member 1232. The extending portion 1231a extends from the pad portion 1231b in the negative direction of the y-axis and extends above the low step portion 1212a of the conductive member 1212. The lower end surface of the extending portion 1231a is bonded to the upper surface of the low step portion 1212a via the bonding member 1234. The drain electrode side, which is the lower surface side of the second semiconductor element 1243, and the source electrode side, which is the upper surface side of the first semiconductor element 1233, are electrically connected via the conductive member 1231 and the conductive member 1212.

Like the conductive member 1231, the conductive member 1241 has a substantially rectangular shape when viewed from above, and includes an extending portion 1241a and a pad portion 1241b. The pad portion 1241b is located on the upper surface side of the second semiconductor element 1243, and is bonded to the upper surface side (i.e., the source electrode side) of the second semiconductor element 1243 via the bonding member 1242. The extending portion 1241a extends from the pad portion 1241b in the positive direction of the y-axis and extends above the conductive member 1205. The lower end surface of the extending portion 1241a is bonded to the upper surface of the conductive member 1205 via the bonding member 1244.

The conductive member 1201 is connected to the conductive member 1211 that functions as a drain pad of the first semiconductor element 1233, and functions as a drain terminal of the first semiconductor element 1233. The conductive member 1202 is electrically connected to the gate electrode of the first semiconductor element 1233 and functions as a gate terminal of the first semiconductor element 1233. The conductive member 1203 is electrically connected to the gate electrode of the second semiconductor element 1243 and functions as a gate terminal of the second semiconductor element 1243. The corner pins 1206 to 1209 function as a non-potential terminal that is not connected to any of the electrodes of the first semiconductor element 1233 and the second semiconductor element 1243.

The conductive member 1204 is connected to the conductive member 1212 that functions as a drain pad of the second semiconductor element 1243. Since the conductive member 1212 is electrically connected to the drain electrode of the second semiconductor element 1243 and the source electrode of the first semiconductor element 1233, the conductive member 1204 functions as a source terminal of the first semiconductor element 1233 and a drain terminal of the second semiconductor element 1243. The conductive member 1205 is electrically connected to the conductive member 1241 that functions as a source pad of the second semiconductor element 1243, and functions as a drain terminal of the second semiconductor element 1243.

As shown in FIGS. 26 to 29, a low step portion 1212a is provided at a position facing the conductive members 1201, 1202 functioning as a gate terminal and a drain terminal in the y direction via the first semiconductor element 1233. Then, on the lower surface side of the semiconductor module 1200, the low step portion 1212a is covered with the resin mold 1220, so that there is a region where nothing is exposed on the surface of the resin mold 1220. This area corresponds to the common wiring area.

The common wiring region is a strip-shaped region that extends substantially straight from one opposite side to the other on the surface of the resin mold 1220 on which the conductive member 1211 is exposed. In the common wiring region, the conductive member 1211 exists, and no conductive member other than the conductive member 1201 having the same potential as the conductive member 1211 exists. Therefore, the semiconductor modules 1200 are applied as the first semiconductor modules 1020a and 1020b, the second semiconductor modules 1030a and 1030b, and the third semiconductor modules 1040a and 1040b shown in FIGS. 24 and 25, and three semiconductor modules 1200 are arranged side by side in the same direction in the y direction so as to be substantially orthogonal to the long side facing the y direction on both sides of the center line L10, so that the common wiring region extending straight along the y direction in a strip shape is secured in the three semiconductor modules 1200. The common wiring region is a substantially rectangular region extending in the y direction on the center line L10 side of the conductive member 1202.

In the common wiring region, only the conductive member 1211 and the conductive member 1201 having the same potential as the conductive member 1211 are exposed from the resin mold 1220. Therefore, by arranging the common wiring connected to the three conductive members 1211 included in the three semiconductor modules arranged on both sides of the center line L10 in the common wiring region, the three conductive members 1211 are electrically connected to each other. The wiring width of the common wiring (i.e., the width in the x direction orthogonal to the y direction, which is the wiring direction) is wider than the wiring width (i.e., the width in the x direction) of the conductive members 1201 to 1203, and the width of the common wiring region in the x direction is secured sufficiently to arrange the common wiring. The conductive member 1211 corresponds to a common wiring electrode.

That is, in the semiconductor module 1200, when the common wiring is connected to the common wiring electrode (i.e., the conductive member 1211), each configuration (i.e., a plurality of semiconductor elements, a plurality of conductive members, and the like) constituting the semiconductor module 1200 is arranged so that the common wiring is not electrically connected to the non-common wiring electrode (i.e., the conductive members 1201 to 1205, 1212), and the common wiring is arranged from one side to the other opposite side on the surface of the resin mold on which the common wiring electrode is exposed. Therefore, as shown in FIGS. 24 and 25, the semiconductor modules 1200 arranged on both sides of the center line L10 can be electrically connected to each other on the mounting surface side of the semiconductor module 1200. As a result, the wiring space on the side of the semiconductor module 1200 can be reduced, which can contribute to the downsizing of the wiring board 1001. Further, in order to connect three semiconductor elements, it is possible to omit the wiring taken out to the side of the semiconductor element. As a result, the wiring area is reduced, the wiring resistance is reduced, and heat generation due to wiring can be suppressed.

The semiconductor module 1200 may include a plurality of terminals for transmitting and receiving drive signals of transistors (more specifically, IGBTs) formed in the semiconductor elements 1233 and 1243 inside the semiconductor module 1200. When mounting the semiconductor module 1200 with solder, even if one of the terminals related to transmission and reception of transistor drive signals is disconnected due to thermal stress, the presence of other terminals that are not disconnected prevents the electrical connection failure. Further, the terminals related to the transmission/reception of the transistor drive signal may be preferably terminals other than the corner pins 1206 to 1209. The corner pins 1206 to 1209 may be preferably used for applications other than terminals related to the main functions of the semiconductor module 1200 such as large current paths and drive signals. Specifically, it can be suitably used as a non-potential terminal, a dedicated connection terminal for a noise protection element, or a terminal dedicated to a protection element.

MODIFICATIONS EXAMPLES

In FIGS. 24 and 25, the first semiconductor module 1020*a*, the second semiconductor module 1030*a*, and the third semiconductor module 1040*a* are arranged linearly in the y direction at substantially the same position in the x direction, and similarly, the first semiconductor module 1020*b*, the second semiconductor module 1030*b* and the third semiconductor module 1040*b* are also arranged linearly in the y direction at substantially the same position in the x direction, and these features have been described as an example, but the present embodiment may not be limited to this.

Figure 30:
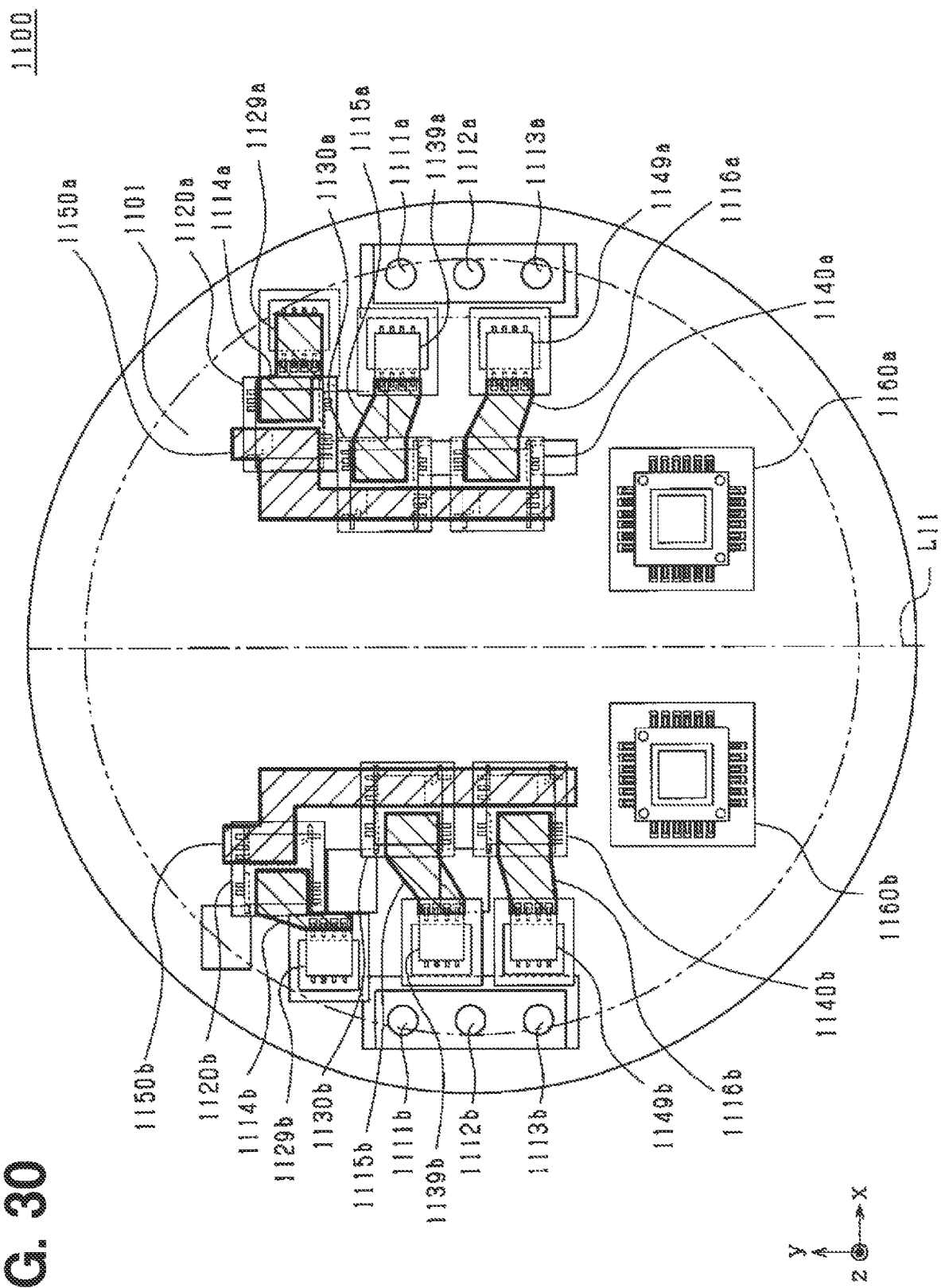
FIG. 30 is a plan view of an electronic device according to a modified example.

FIG. 30 shows an electronic device 1100 as an example of another electronic device provided with a plurality of sets of the electric connection wiring, the motor connection wiring, and the semiconductor module arranged between them. In the electronic device 1100 shown in FIG. 30, similar to the electronic device 1000, there are two sets of the electric connection wiring, the motor connection wiring, and the semiconductor module so as to be substantially axisymmetric with respect to the center line L11 extending along the y direction of the wiring board 1101 and passing through the almost center of the x direction.

The electronic device 1100 is different from the electronic device 1000 in the positions where the first semiconductor modules 1120*a*, 1120*b*, the second semiconductor modules 1130*a*, 1130*b*, the semiconductor modules 1129*b*, 1139*b*, and the semiconductor module 1139*a* are arranged. Further, due to the difference in the position of each semiconductor module, the shapes of the electric connection wirings 1150*a* and 1150*b*, the first motor connection wirings 1114*a* and 1114*b*, and the second motor connection wiring 1115*a* are different from those of the electronic device 1000. Since the other configurations of the electronic device 1100 are the same as those of the electronic device 1000, the description will be omitted by replacing the reference numbers in the 1000s with the 1100s.

In the electronic device 1100, the positions of the second semiconductor module 1130*a* and the third semiconductor module 1140*a* are substantially the same in the x direction, but the position of the first semiconductor module 1120*a* is displaced from the positions of the second semiconductor module 1130*a* and the third semiconductor module 1140*a* toward the peripheral edge side of the wiring board 1101 (i.e., the positive direction side of the x-axis). In order to connect the first semiconductor module 1120*a*, the second semiconductor module 1130*a*, and the third semiconductor module 1140*a*, the shape of the electric connection wiring 1150*a* protrudes toward the peripheral edge of the wiring board 1101 at the position of the first semiconductor module 1120*a*. In that respect, it differs from the electric connection wiring 1050*a*.

Further, although the positions of the second semiconductor module 1130*b* and the third semiconductor module 1140*b* are substantially the same in the x direction, the position of the first semiconductor module 1120*b* is shifted toward the peripheral edge side (i.e., the negative direction side of the x-axis) of the wiring board 1101 from the second semiconductor module 1130*b* and the third semiconductor module 1140*b*. In order to connect the first semiconductor module 1120*b*, the second semiconductor module 1130*b*, and the third semiconductor module 1140*b*, the shape of the electric connection wiring 1150*b* protrudes toward the peripheral edge of the wiring board 1101 at the position of the first semiconductor module 1120*b*. In that respect, it differs from the electric connection wiring 1050*b*.

Even if the first to third semiconductor modules connected by the electric connection wiring are not arranged linearly as in the electronic device 1100, the shape of the electric connection wiring is deformed according to the positions of the first to third semiconductor modules, so that the first to third semiconductor modules can be electrically connected.

Figure 31:
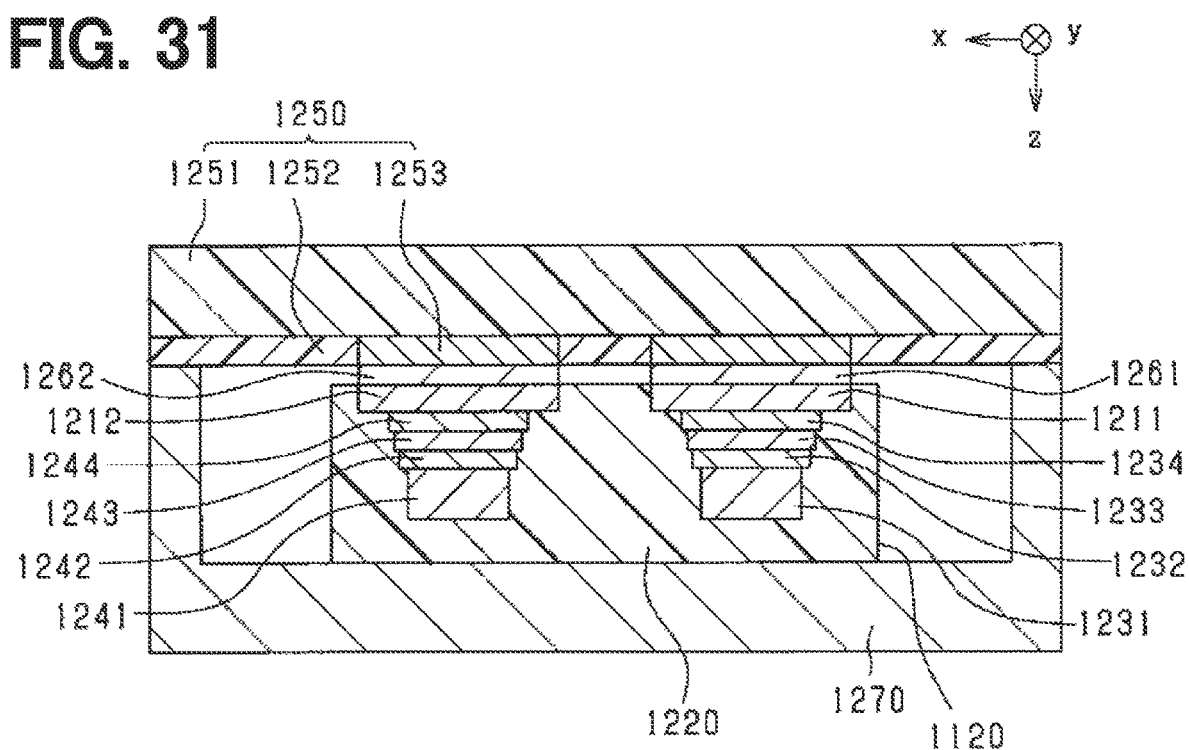
FIG. 31 is a diagram showing a mounting example of the semiconductor module shown in FIGS. 26 to 29.

The electronic devices 1000 and 1100 may further include a metal housing on the side facing the wiring board via the first to third semiconductor modules. For example, as shown in FIG. 31, it may be configured as an electronic device including a semiconductor module 1200, a wiring board 1250, and a housing 1270. The semiconductor module 1200 is arranged such that the module 1200 is mounted on the wiring board 1250 and is disposed in a housing 1270 with an opening on an upper side (i.e., the negative direction side of the z-axis) shown in FIG. 31, and an upper surface side of the module 160 (i.e., the positive direction side of the z-axis)

shown in FIG. 26 faces the lower side. The upper surface of the housing 1270 is covered with a wiring board 1250.

The wiring board 1250 includes a base material portion 1251, a wiring portion 1253, and a resist portion 1252 provided around the wiring portion 1253. A wiring portion 1253 and a resist portion 1252 are provided on the surface of the base material portion 1251 on the positive direction side of the z-axis, and a wiring pattern is formed. A bonding member 1262 is provided in contact with the upper surface of the conductive wiring portion 1253, and the semiconductor module 1200 is bonded to the wiring board 1250 via the bonding member 1262. More specifically, the conductive members 1211 and 1212 are bonded to and fixed to the wiring portion 1253 via the bonding member 1262. The bonding member 1262 is made of, for example, a solder material. The resist portion 1252 is made of a resist resin material such as an epoxy resin. The housing 1270 is made of a metal such as aluminum.

As shown in FIG. 31, the anti-mounting surface of the semiconductor module 1200 facing the wiring board 1250 is a surface in the positive direction of the z-axis and is covered with a resin mold 1220 made of a high heat radiation resin material, and the conductive member is not exposed thereon. The surface of the resin mold 1220 facing the wiring board 1250 is in contact with the housing 1270. The depth of the housing 1270 (i.e., the height in the z direction of the inner wall surface) substantially coincides with the total thickness (i.e., the length in the z direction) of the semiconductor module 1200 and the bonding members 1261 and 1262.

Since the resin mold 1220 is made of a high heat radiation resin material, heat generated by the semiconductor module 1200 and the wiring board 1250 can be discharged via the resin mold 1220. Further, since the resin mold 1220 is in contact with the housing 1270, heat generated in the semiconductor module 1200 and the wiring board 1250 can be efficiently radiated to the housing 1270 via the resin mold 1220.

Figure 32:
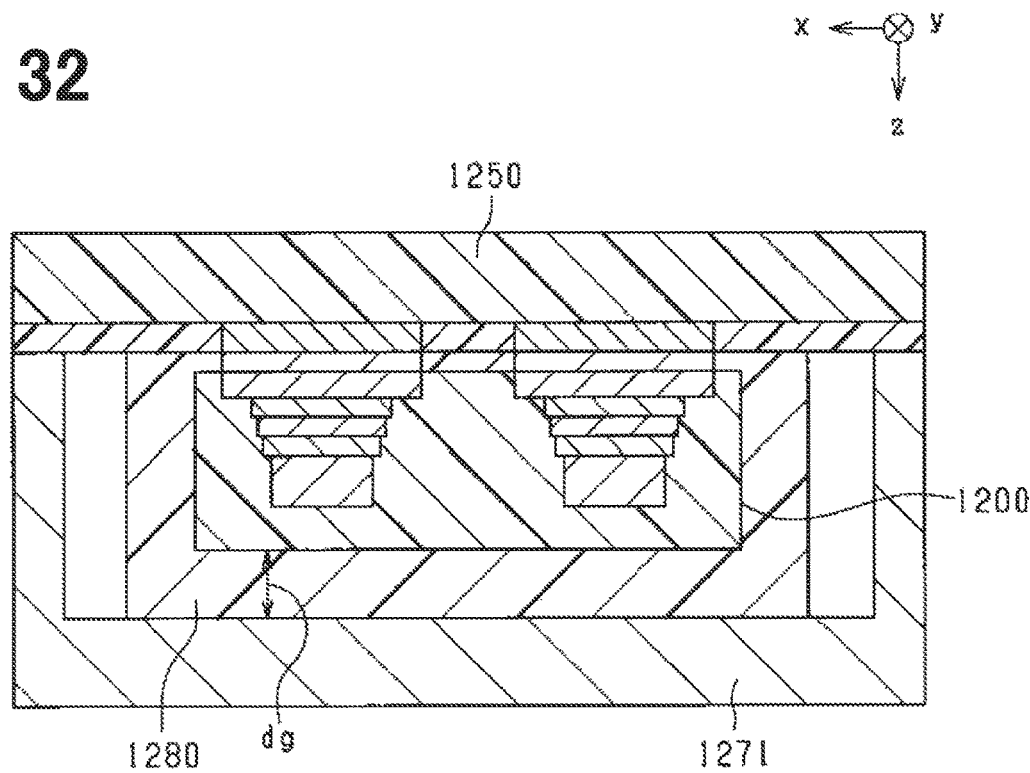
FIG. 32 is a diagram showing a mounting example of the semiconductor module shown in FIGS. 26 to 29.

FIG. 32 shows an electronic device 183 as another example of a state in which the semiconductor module 1200 is mounted on the wiring board 1250. Similar to FIG. 31, the semiconductor module 1200 is arranged such that the module 1200 is mounted on the wiring board 1250 and is disposed in a housing 1271 with an opening on an upper side (i.e., the negative direction side of the z-axis) shown in FIG. 32, and an upper surface side of the module 1200 (i.e., the positive direction side of the z-axis) shown in FIG. 26 faces the lower side. The upper surface of the housing 1271 is covered with a wiring board 1250.

In FIG. 32, in the housing 1271, the semiconductor module 1200 is housed in the housing 1271 in a state where the heat radiation member 1280 covers the sides (in the x direction and the y direction) and the lower side (in the positive direction of the z axis). The housing 1271 is configured in the same manner as the housing 1270 except that the depth is different. The depth of the housing 1271 is substantially the same as the total value obtained by adding the thickness dg of the heat radiation member 1280 to the thickness of the semiconductor module 1200 and the bonding members 1261 and 1262. it is possible to secure the heat radiation path to the housing 1271 by adjusting the thickness dg of the heat radiation member 1280 that fills the space between the housing 1271 and the semiconductor module 1200 even if the difference between the thickness of the semiconductor module 1200 and the bonding members 1261 and 1262 and the depth of the housing 1271 varies due to design tolerances.

The heat radiation member 1280 is made of a gel-like material such as a resin material or a silicon material, or a high heat radiating material obtained by mixing an adhesive with a filler for improving heat radiating property. As the filler used for the high heat radiation material, for example, a composite oxide material having high thermal conductivity such as alumina is selected. By adjusting the type of filler and the filling rate, the thermal conductivity of the heat radiation member 1280 can be adjusted.

It may be preferable that the heat radiation member 1280 is adjusted to have a thermal conductivity equal to or higher than that of the resin mold 1220. For example, when the thermal conductivity of the resin mold 1220 is defined as km and the thermal conductivity of the heat radiation member 1280 is defined as kg, it may be preferable that km≥2 W/(m·K), and km≥3 W/(m·K). Further, it is sufficient that kg≥km, and it may be preferable that kg>km. Conventionally, in a semiconductor module in which an electrode is exposed on the non-mounting surface, it may not be necessary to increase the thermal conductivity of the resin mold since the heat is radiated from the exposed electrode. Thus, the thermal conductivity may be as low as less than 1 W/(m·K). On the other hand, by using the resin mold 1220 having a high thermal conductivity as in the present embodiment, even if the electrodes of the semiconductor module 1200 are covered with the resin mold 1220, the heat generated by the semiconductor module 1200 and the like is radiated in the housings 1270 and 1271 efficiently. Further, by increasing the thermal conductivity km and kg to be higher than the thermal conductivity of the configuration on the wiring substrate 1250 side (for example, the thermal conductivity of the resist portion 1252), the efficiency is higher and the heat can be radiated to the housing 1270, 1271 side. The thermal conductivity of the housing 1270, 1271 made of aluminum is about 100 to 300 W/(m·K), which is remarkably high with respect to km, and kg.

Further, since the non-mounting surface of the semiconductor module 1200 is covered with the resin mold 1220 and the conductive member functioning as an electrode is not exposed, the thickness dg of the heat radiation member 1280 can be reduced, compared with the semiconductor module in which the electrode is exposed on the non-mounting surface. The resin mold 1220 has higher insulating properties than the heat radiation member 1280, and the thickness required for ensuring insulation is small. Therefore, the distance between the lower surface of the electrode on the non-mounting surface side of the semiconductor module 1200 (i.e., the conductive members 1231, 1241 in this embodiment) and the upper surface of the housing 1271 can be shortened, compared with the semiconductor module in which the electrode is exposed on the non-mounting surface. As a result, according to the semiconductor module 1200, the mounting portion can be made smaller than before.

In FIGS. 31 and 32, the mounting state of the semiconductor module 1200 according to the seventh embodiment has been described. Alternatively, among the semiconductor modules described in each of the above embodiments, the semiconductor module in which the non-mounting surface is covered with the resin mold may be replaced with the semiconductor module 1200 shown in FIGS. 31, and 32.

As shown in FIGS. 3 and 4, the plurality of semiconductor elements included in the semiconductor module may be semiconductor elements having the same size and shape as each other, or different semiconductor elements as shown in FIGS. 26 to 29.

The plurality of semiconductor elements may be arranged substantially in parallel with the adjacent semiconductor elements in the same direction as the adjacent semiconductor elements. Alternatively, the plurality of semiconductor elements may be arranged substantially point-symmetrically with the adjacent semiconductor elements in the opposite direction to the adjacent semiconductor elements. Further, the semiconductor module may include a bonding conductive member for bonding a first electrode (for example, a source electrode) of the first semiconductor element and a second electrode (for example, a drain electrode) of the second semiconductor element arranged adjacent to the first semiconductor element among a plurality of semiconductor elements.

Further, a plurality of semiconductor elements may be stacked via a bonding conductive member. For example, as briefly described in FIG. 8, the two semiconductor elements functioning as the upper arm and the lower arm of each phase of the inverter circuit may be accommodated in the semiconductor module in a state where they are stacked in the thickness direction of the wiring board. For example, the first to third semiconductor modules may be configured as the semiconductor modules 1300 shown in FIGS. 33 to 36 when the two semiconductor elements functioning as the upper arm and the lower arm of the inverter circuit are included. The semiconductor module 1300 includes an upper semiconductor element 1360 and a lower semiconductor element 1370, a resin mold 1330 that integrally seals the upper semiconductor element 1360 and the lower semiconductor element 13700, and external terminals 1301 to 1304 and 1311 to 1314. An x-axis direction and a y-axis direction shown in FIGS. 33 to 36 are sides of the semiconductor module 1300, and an xy-plane direction is a plane direction of the semiconductor module 1300. The z-axis direction is a vertical direction orthogonal to the plane direction.

Figure 33:
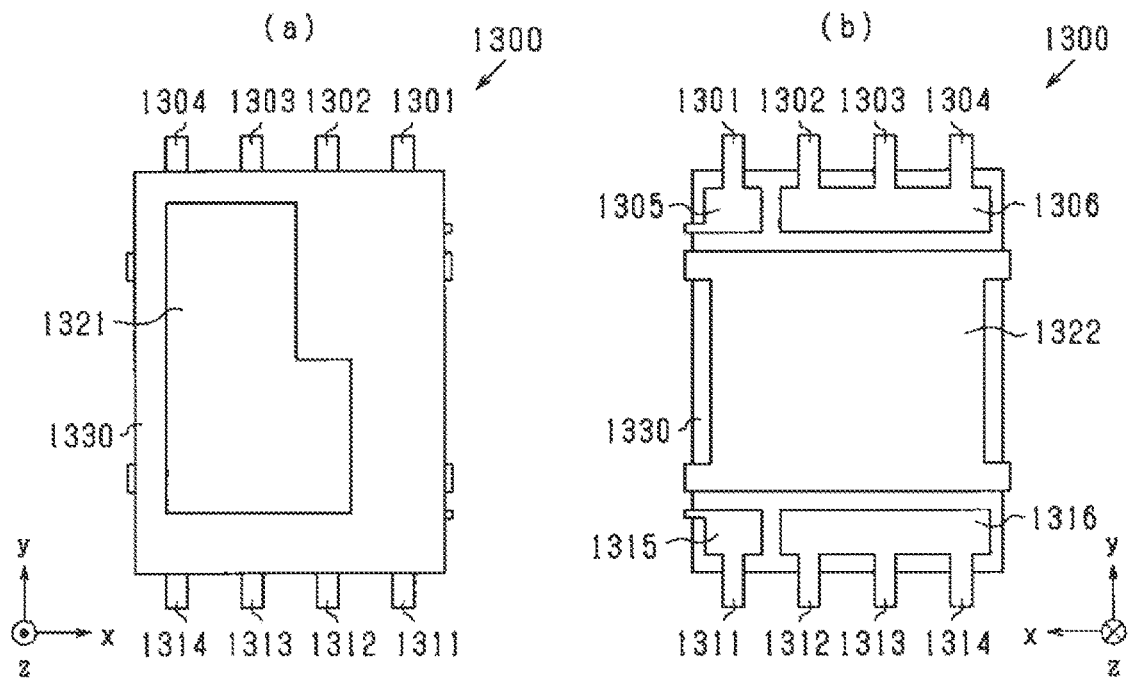
FIG. 33 is a plan view showing a semiconductor module according to a modified example.
Figure 34:
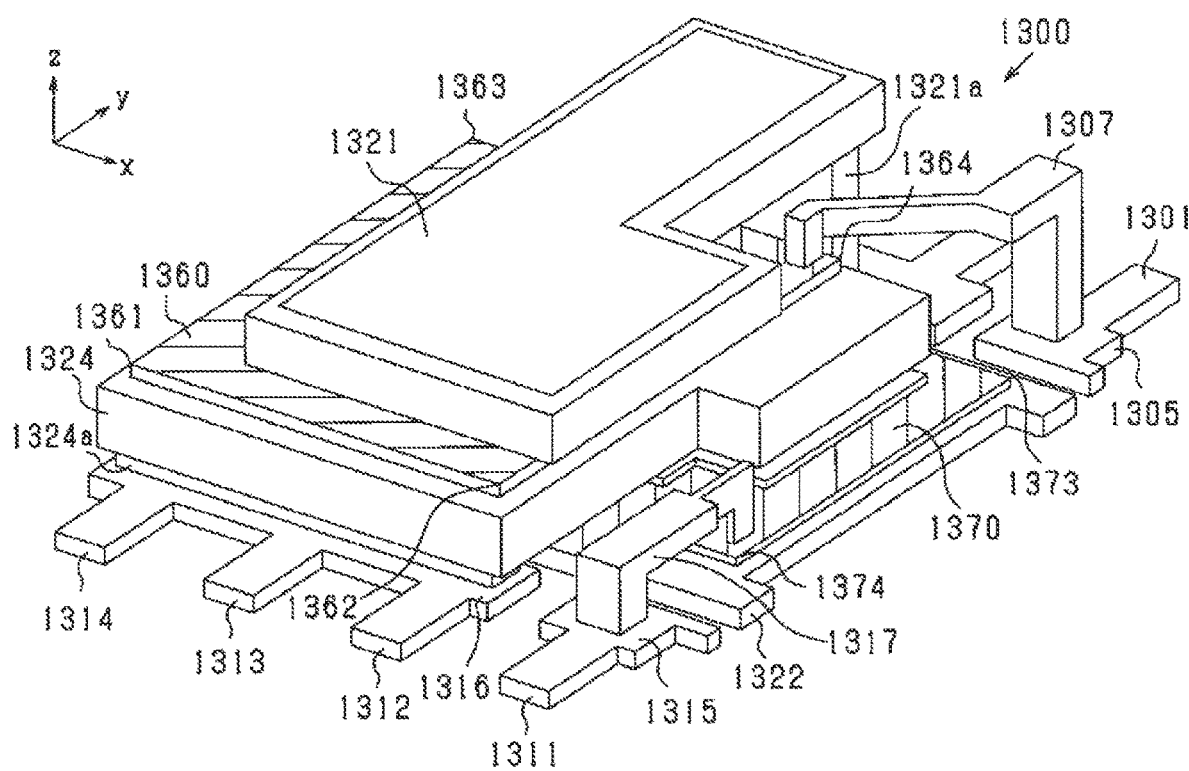
FIG. 34 is a perspective view showing a state in which the resin mold is not arranged in the semiconductor module shown in FIG. 33.
Figure 35:
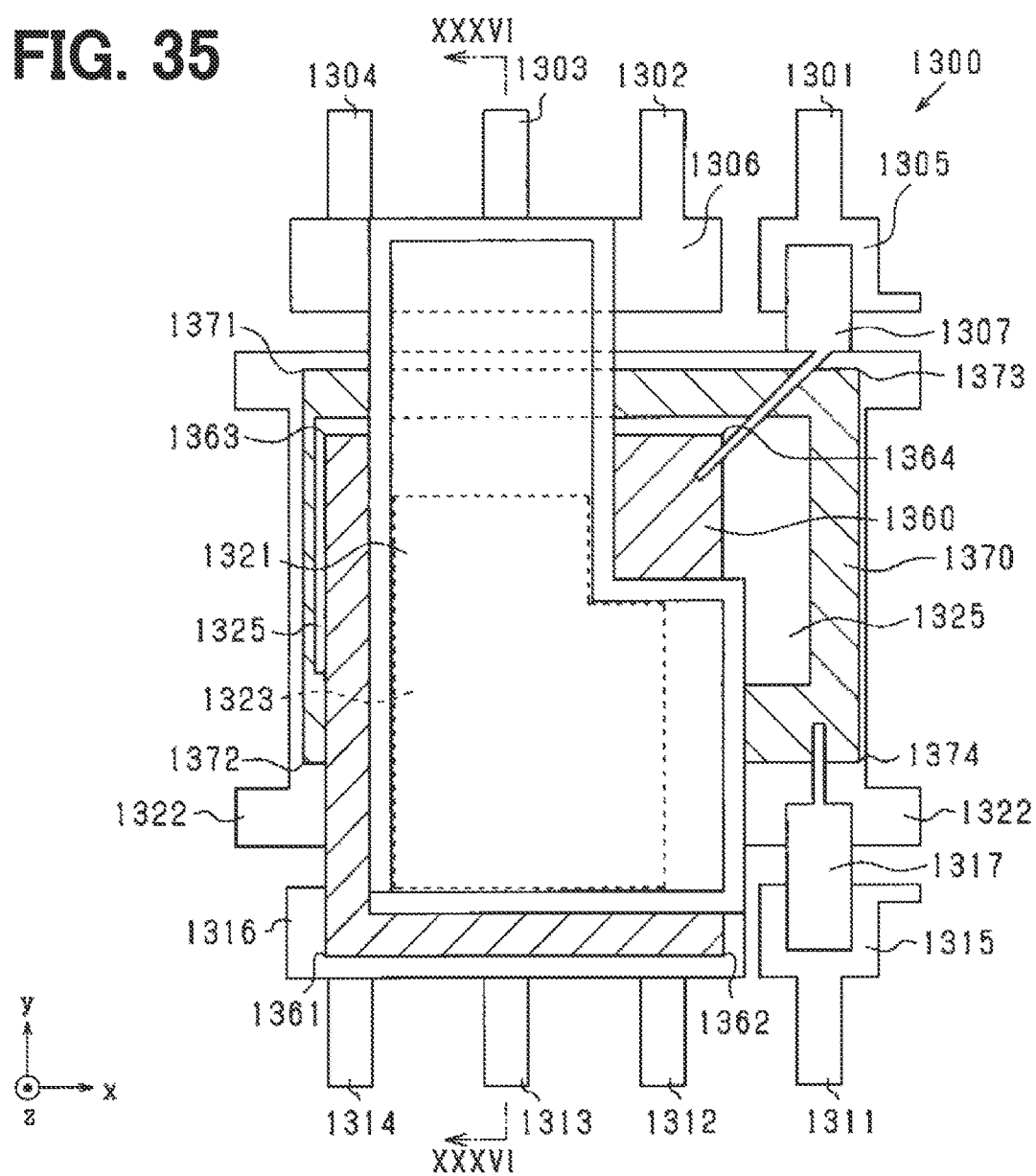
FIG. 35 is a plan view showing a state in which the resin mold is not arranged in the semiconductor module shown in FIG. 33.
Figure 36:
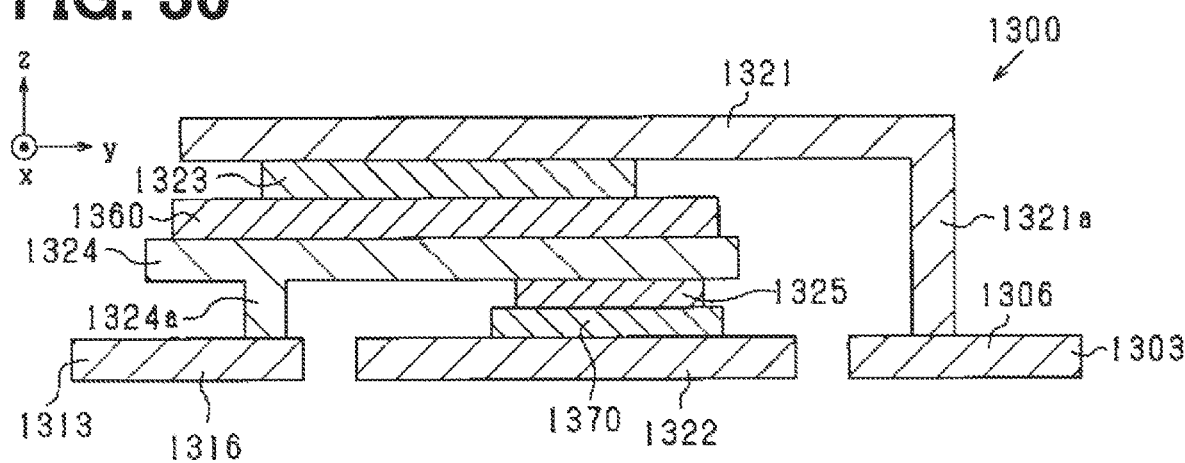
FIG. 36 is a cross-sectional view taken along a line XXXVI-XXXVI line of FIG. 35.

As shown in FIG. 33, the semiconductor module 1300 has an appearance in which eight external terminals 1301 to 1304 and 1311 to 1314 protrude in the y-axis direction from the resin mold 1330 having a substantially rectangular shape when viewed from the top. The external terminals 1301 to 1304 are placed in a stated order from a positive direction to a negative direction of the x-axis in a positive direction (i.e., the first direction) of the y-axis, which is the side of the resin mold 1330, and extend in the y-axis direction as a longitudinal direction. The external terminals 1311 to 1314 are placed in a stated order from a positive direction to a negative direction of the x-axis in a negative direction of the y-axis, which is a second direction opposed to the first direction across the resin mold 1330, and extend in the y-axis direction as the longitudinal direction As shown in FIGS. 33 to 36, the upper semiconductor element 1360 and the lower semiconductor element 1370 are integrally sealed in the resin mold 1330 in a state of being stacked on each other in the z-axis direction. The upper semiconductor element 1360 and the lower semiconductor element 1370 are semiconductor elements having the same structure, shape, size, and the like, and have a substantially rectangular shape when viewed from the top. When the upper semiconductor element 1360 and the lower semiconductor element 1370 are vertically stacked in the same direction without being displaced from each other in the plane direction, the corner 1361 and the corner 1371, the corner 1362 and the corner 1372, the corner 1363 and the corner 1373, and the corner 1364 and the corner 1374 are approximately the same position in the plane direction.

The upper semiconductor element 1360 and the lower semiconductor element 1370 are vertical insulated gate semiconductor elements having an element structure as shown in FIG. 5. More specifically, it is a power MOSFET.

The upper semiconductor element 1360 and the lower semiconductor element 1370 are stacked with the source electrodes 71 facing upward (positive direction in the z-axis) and the drain electrodes facing downward (negative direction in the z-axis), and the upper semiconductor element 1360 is placed on an upper side and the lower semiconductor element 1370 is placed on a lower side. As shown in FIGS. 33 to 36, the upper semiconductor element 1360 is disposed so that a longitudinal direction of the upper semiconductor element 1360 is the y-axis direction when viewed from the top, and the lower semiconductor element 1370 is disposed so that a longitudinal direction of the lower semiconductor element 1370 is the x-axis direction when viewed from the top. In other words, when viewed from the top, the upper semiconductor element 1360 is disposed in an orientation of being rotated by substantially 90 degrees counterclockwise about the vertical direction as an axis with respect to the lower semiconductor element 1370.

As shown in FIGS. 33 to 36, the semiconductor module 1300 includes a first conductive member 1321, a second conductive member 1323, an upper semiconductor element 1360, a third conductive member 1324, a fourth conductive member 1325, a lower semiconductor element 1370, and an electrode pad 1322 stacked in a stated order from the top. The semiconductor module 1300 further includes conductive bonding plates 1305, 1306, 1315, and 1316 at the same position as that of the electrode pads 1322 in the vertical direction. The bonding plate 1305 is formed integrally with the external terminal 1301. The bonding plate 1306 is formed integrally with the external terminals 1302 to 1304. The bonding plate 1315 is formed integrally with the external terminal 1311. The bonding plate 1316 is formed integrally with the external terminals 1312 to 1314. The external terminals 1301 to 1304 and 1311 to 1314, the bonding plates 1305, 1306, 1315, and 1316, and the electrode pad 1322 are formed in a lead frame. The semiconductor module 1300 further includes conductive gate connection members 1307 and 1317.

The second conductive member 1323 corresponds to a source electrode formed on the upper surface side of the upper semiconductor element 1360. The second conductive member 1323 has a shape in which one of four corners of a rectangular shape is notched when viewed from the top, and a gate pad of the upper semiconductor element 1360 is provided in the notched portion. The upper surface of the second conductive member 1323 is bonded to the lower surface of the first conductive member 1321 through solder. The gate pad of the upper semiconductor element 1360 and the gate pad of the lower semiconductor element 1370 are provided at positions such that they are substantially the same position when each is viewed from above. More specifically, the gate pad of the upper semiconductor element 1360 is provided in the vicinity of the corner 1364, and the gate pad of the lower semiconductor element 1370 is provided in the vicinity of the corner 1374.

The first conductive member 1321 has a substantially L-shaped shape when viewed from the top, and extends to a position above the bonding plate 1306 in the positive direction of the y-axis. The first conductive member 1321 has a connection portion 1321*a* extending downward to a position reaching the bonding plate 1306 at a position above the bonding plate 1306. A lower surface of the connection portion 1321*a* is bonded to an upper surface of the bonding plate 1306 through solder. As a result, the source electrode of the upper semiconductor element 1360 is electrically connected to the external terminals 1302 to 1304.

The lower surface side of the upper semiconductor element 1360 is the drain electrode side, and is bonded to an upper surface of the third conductive member 1324 through solder. The fourth conductive member 1325 corresponds to a source electrode formed on the upper surface side of the lower semiconductor element 1370. The fourth conductive member 1325 is bonded to the third conductive member 1324 through solder.

The third conductive member 1324 has a substantially L-shaped shape when viewed from the top, and extends to a position above the bonding plate 1316 in the negative direction of the y-axis. The third conductive member 1324 has a connection portion 1324a extending downward to a position reaching the bonding plate 1316 at a position above the bonding plate 1316. A lower surface of the connection portion 1324a is bonded to an upper surface of the bonding plate 1316 through solder. As a result, the drain electrode of the upper semiconductor element 1360 and the source electrode of the lower semiconductor element 1370 are electrically connected to the external terminals 1312 to 1314. Although the first conductive member 1321 and the third conductive member 1324 are so-called clips, wire bonding, a wire ribbon, or the like may be used in addition to the clips.

The second conductive member 1323 and the fourth conductive member 1325 are source electrodes of the upper semiconductor element 1360 and the lower semiconductor element 1370, respectively, and have the same shape and size. Similar to a positional relationship between the upper semiconductor element 1360 and the lower semiconductor element 1370, the second conductive member 1323 is disposed in an orientation of being rotated by substantially 90° counterclockwise about the vertical direction as the axis with respect to the fourth conductive member 1325. With the above placement, the position of the gate pad of the upper semiconductor element 1360 is a position at an corner of the positive direction of the x-axis and the positive direction of the y-axis, whereas the position of the gate pad of the lower semiconductor element 1370 is a position at an corner of the positive direction of the x-axis and the negative direction of the y-axis.

The lower surface side of the lower semiconductor element 1370 is a drain electrode, and is bonded to the electrode pad 1322 through solder. As shown in (b) of FIG. 33, the electrode pad 1322 is exposed to a lower surface of the resin mold 1330, and is electrically connected to the drain electrode of the lower semiconductor element 1370. The drain electrode of the lower semiconductor element 1370 is not electrically connected to any of the external terminals 1301 to 1304 and 1311 to 1314.

The first conductive member 1321, the second conductive member 1323, the third conductive member 1324, and the fourth conductive member 1325 are thicker than the electrode pad 1322. Since each conductive member is thick and has a weight corresponding to the thickness, it is possible to suppress the positional deviation of the upper semiconductor element 1360 and the lower semiconductor element 1370 that are stacked in contact with any of the conductive members. That is, since each conductive member is thicker than the electrode pad 1322, it is possible to suppress the positional deviation of each configuration inside the resin mold 1330 of the semiconductor module 1300.

The gate connection member 1307 includes a columnar portion extending in the vertical direction on an upper surface of the bonding plate 1305, and a beam portion extending from the columnar portion to the gate pad on the upper surface of the upper semiconductor element 1360 in an oblique direction which is a negative direction of the x-axis and the y-axis. The lower surface of the columnar portion is bonded to the upper surface of the bonding plate 1305 through solder. The beam portion is electrically connected to the gate electrode in the upper semiconductor element 1360 through the gate pad. As a result, the gate electrode of the upper semiconductor element 1360 is electrically connected to the external terminal 1301.

The gate connection member 1317 includes a columnar portion extending in the vertical direction on an upper surface of the bonding plate 1315, and a beam portion extending from the columnar portion in the positive direction of the y-axis to the gate pad on the upper surface of the lower semiconductor element 1370. The lower surface of the columnar portion is bonded to the upper surface of the bonding plate 1315 through solder. The beam portion is electrically connected to the gate electrode in the lower semiconductor element 1370 through the gate pad. As a result, the gate electrode of the lower semiconductor element 1370 is electrically connected to the external terminal 1311. The gate connection members 1307 and 1317 are so-called gate clips, but wire bonding, wire ribbon, or the like may be used in addition to the clips.

The external terminal 1301 is a first gate terminal electrically connected to the gate electrode of the upper semiconductor element 1360. The external terminal 1311 is a second gate terminal electrically connected to the gate electrode 75 of the lower semiconductor element 1370. The external terminals 1302 to 1304 are a first source terminal electrically connected to the source electrode of the upper semiconductor element 1360. The external terminals 1312 to 1314 are a second source terminal electrically connected to the source electrode of the lower semiconductor element 1370 and are also a first drain terminal electrically connected to the drain electrode of the upper semiconductor element 1360.

According to the embodiments described above, the following effects can be obtained.

The electronic devices 100, 200, 300, 400, 500, 600, 610, 700, 800, 900 are applied to the electric motor, and includes: a wiring board (for example, the wiring board 101); an electric connection wiring (for example, an electrical connection wiring 150) arranged substantially in the center of the wiring board and connected to a power supply; a plurality of motor connection wirings (for example, a first motor connection wiring 114, a second motor connection wiring 115 and a third motor connection wiring 116) arranged on the peripheral side of the electric connection wiring of the wiring board and connected to the electric motor; and a plurality of semiconductor modules (for example, a first semiconductor module 120, a second semiconductor module 130, and a third semiconductor module 140) arranged corresponding to each of the plurality of motor connection wirings.

The plurality of semiconductor modules include a plurality of semiconductor elements (for example, semiconductor elements 123b and 124b) and a resin mold (for example, a resin mold 125) for integrally sealing the plurality of semiconductor elements. Therefore, in the semiconductor elements arranged on the wiring board, the wiring for connecting to each other can be simplified.

Further, the plurality of semiconductor modules are arranged on the electric connection wiring or at a position on the peripheral side of the electric connection wiring and on the central side of the motor connection wiring. At least a part of the electrodes of the plurality of semiconductor modules are mounted on the electric connection wiring. Further, by mounting at least a part of electrodes of a plurality of semiconductor modules on the electric connection wiring, at least a part of the semiconductor modules and the electric connection wiring can be arranged so as to overlap each other, and the arrangement area of the wiring around the semiconductor module can be reduced. Therefore, it is possible to reduce the arrangement areas of the wiring from the plurality of motor connection wirings to the electric connection wiring and the wiring arranged around the semiconductor module.

In the above electronic device, the semiconductor module and the calculation unit that controls the operation of the electric motor may be mounted on the same substrate on the wiring board. By arranging the drive circuit provided by the semiconductor module and the control circuit of the calculation unit on the same board, in addition to the effect of minimizing the size of the product, the noise suppression effect by shortening the arrangement of the wiring of the high frequency signal line can be obtained.

In the above electronic device, the wiring board may be a multi-layer board having a wiring layer in the inner layer of the board. By arranging the wiring constituting the power supply path on the positive electrode side on the substrate surface, for example, and arranging the wiring constituting the power supply path on the negative electrode side in the inner layer of the substrate, it is not necessary to arrange the power supply path on the positive electrode side and the power supply path on the negative electrode side on the same layer of the wiring board, so that the size of the board can be minimized.

The above-mentioned electronic device may have the following configurations. For example, in a plurality of semiconductor modules such as an electronic device 100, it may be preferable that a protruding direction of the external terminals (for example, external terminals 121 and 122) electrically connected to the plurality of semiconductor elements and protruding from the resin mold is substantially arranged in parallel to the wiring direction of the plurality of the motor connection wirings.

Further, for example, a plurality of semiconductor modules such as electronic devices 100, 200 and the like may include a plurality of semiconductor elements arranged substantially parallel to or substantially perpendicular to the wiring direction of the plurality of motor connection wirings. Alternatively, like the electronic device 300, it may be preferable that the plurality of semiconductor modules include a plurality of semiconductor elements stacked and overlapped in the thickness direction of the wiring board.

Further, as in the electronic devices 200 and 300, the electric connection wiring may extend substantially linearly, and it may be preferable that at least one of a plurality of semiconductor modules is arranged on the electric connection wiring.

The electronic devices 100, 200, 300, 400, 500, 600, 610, 700, 800, 900 can be configured to be applicable to an inverter circuit or an H-bridge circuit. For example, a plurality of semiconductor modules such as electronic devices 100, 200, 300, 500, 600, 610, 700, 800, 900 may be applicable to an inverter circuit as semiconductor modules including an upper arm and a lower arm of each phase of the inverter circuit. Further, for example, as in the electronic device 400, the plurality of semiconductor modules may be applied to the inverter circuit as a semiconductor module including the entire upper arm or the entire lower arm of each phase of the inverter circuit.

A plurality of semiconductor modules applied to an inverter circuit as a semiconductor module including an upper arm and a lower arm of each phase of the inverter circuit may be, for example, a semiconductor module including a semiconductor element as a lower arm and a semiconductor element as a lower arm, which are stacked and overlapped in the thickness direction of a wiring substrate, such as the semiconductor module 1300.

Further, as shown in the electronic devices 600, 610, 1000, and 1100, the wiring board may be provided with a plurality of three-phase inverter circuits to which the semiconductor module is applied as the upper arm and the lower arm of each phase.

Further, as shown in the wiring board 1250, the wiring board may include a wiring portion 1253 in which the semiconductor module is arranged and a resist portion 1252 provided around the wiring portion 1253. In this case, the resin mold 1220 mounted on the wiring board 1250 may preferably have a higher thermal conductivity than the resist portion 1252. The heat radiation of the wiring board 1250 and the semiconductor module 1200 can be promoted through the resin mold 1220.

Further, as shown in the semiconductor module 1200, the surface of the semiconductor module 1200 facing the wiring board 1250 may be covered with the resin mold 1220. It can be suitably used when it is arranged between the wiring board 1250 and the housings 1270 and 1271 arranged on the side facing the wiring board 1250, as in the semiconductor module 1200. Specifically, by arranging the resin mold and the housing so as to be in contact with each other, the heat generated in the semiconductor module or the wiring board can be radiated to the housing side via the resin mold. Further, the resin mold may be configured to be in contact with the housing via a heat radiation member arranged between the resin mold and the housing. In this case, the thermal conductivity of the heat radiation member may be preferably equal to or higher than the thermal conductivity of the resin mold.

Each of the above electronic devices can be suitably used for mounting on the electric power steering system 80, and can contribute to minimizing the size and promoting heat radiation in the drive circuit and the like.

Further, the semiconductor module may be provided with corner pins 1206-1209 which are non-potential terminals at least a part of the four corners of the resin mold which is substantially rectangular when viewed in a plan view. Further, the semiconductor module may preferably include a plurality of terminals other than corner pins as terminals used for transmitting and receiving drive signals of semiconductor elements. Even if one of the plurality of terminals is disconnected, it is possible to prevent the drive signal from being unable to be transmitted/received due to the presence of the other terminals that are not disconnected. The corner pin may be preferably used for applications other than terminals related to the main function of the semiconductor module.

In the embodiments described above, a trench gate type MOSFET in which an n-channel is provided by application of a gate voltage is exemplified as a device structure of the semiconductor device, but the semiconductor device structure is not limited to the above example. For example, the semiconductor element structure may be a planar gate type, a p-channel type in which p-type and n-type are substituted in FIG. 5, an insulated gate bipolar transistor (IGBT) or a reverse conduction IGBT (RC-IGBT). When the semiconductor device is an IGBT, the emitter electrode corresponds to a first electrode, and the collector electrode corresponds to a second electrode. An external terminal electrically connected to the emitter electrode corresponds to a first terminal, and an external terminal electrically connected to the collector electrode corresponds to a second terminal.

Further, in the drive circuit shown in FIG. 6, as each switch, a voltage-controlled semiconductor switching element such as an IGBT may be used instead of the MOSFET. When an IGBT not provided with a freewheeling diode is used as each switch, it may be preferable to arrange a freewheel diode for each switch. Specifically, for example, a freewheeling diode may be connected in anti-parallel to each of the switches, or a reverse conduction IGBT (RC-IGBT) in which the freewheeling diode is formed in the same semiconductor substrate as the semiconductor substrate of IGBT or the like may be used as each of the switches.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic device for an electric motor, the electronic device comprising:
   a wiring board;
   an electric connection wiring arranged substantially in a center of the wiring board and connected to a power supply;
   a plurality of motor connection wirings arranged on a peripheral side of the wiring board with respect to the electric connection wiring and connected to the electric motor; and
   a plurality of semiconductor modules having a plurality of semiconductor elements and a resin mold for integrally sealing the plurality of semiconductor elements, wherein:
   each of the plurality of semiconductor modules are arranged at a position on the electric connection wiring or on the peripheral side of the electric connection wiring and on a center side of a respective motor connection wiring of the plurality of motor connection wirings;
   at least a part of electrodes of the plurality of semiconductor modules is mounted on the electric connection wiring;
   the wiring board includes a wiring portion in which the plurality of semiconductor modules are arranged and a resist portion provided around the wiring portion; and
   the resin mold has a higher thermal conductivity than the resist portion, and
   wherein the electronic device further comprises:
   a housing disposed on a side opposing the wiring board via the plurality of semiconductor modules sandwiched therebetween, wherein:
   heat generated in the plurality of semiconductor modules or the wiring board is radiated to the housing via the resin mold.

2. The electronic device according to claim 1, wherein: the plurality of semiconductor modules and a calculation unit for controlling an operation of the electric motor are mounted on a same substrate of the wiring board.

3. The electronic device according to claim 1, wherein: the wiring board is a multi-layer board having a wiring layer in an inner layer of the wiring board.

4. The electronic device according to claim 1, wherein: in the plurality of semiconductor modules, a protruding direction of an external terminal electrically connected to the plurality of semiconductor elements protruding from the resin mold is arranged substantially parallel to a wiring direction of the plurality of motor connection wirings.

5. The electronic device according to claim 1, wherein: the plurality of semiconductor modules include the plurality of semiconductor elements arranged substantially parallel to or substantially perpendicular to a wiring direction of the plurality of motor connection wirings.

6. The electronic device according to claim 1, wherein: the plurality of semiconductor modules include the plurality of semiconductor elements stacked and overlapped in a thickness direction of the wiring board.

7. The electronic device according to claim 1, wherein: the electric connection wiring extends substantially linearly; and
   at least one of the plurality of semiconductor modules is arranged on the electric connection wiring.

8. The electronic device according to claim 1, wherein: the electronic device is applied to an inverter circuit or an H-bridge circuit.

9. The electronic device according to claim 1, wherein: at least one of the plurality of semiconductor modules includes a corner pin as a non-potential terminal at least a part of four corners of the resin mold which has a substantially rectangular shape when viewed in a plan view.

10. The electronic device according to claim 9, wherein: the plurality of semiconductor modules include a plurality of terminals other than the corner pin as terminals for transmitting and receiving a drive signal of the semiconductor elements.

11. The electronic device according to claim 9, wherein: the corner pin is used for an application other than a terminal related to a main function of the plurality of semiconductor modules.

12. The electronic device according to claim 1, wherein: the plurality of semiconductor modules are applied to an inverter circuit as a semiconductor module including an upper arm and a lower arm of each phase of the inverter circuit.

13. The electronic device according to claim 12, wherein: the plurality of semiconductor modules applied to the inverter circuit as the semiconductor module including the upper arm and the lower arm of each phase of the inverter circuit include a semiconductor element as the upper arm and a semiconductor element as the lower arm which are stacked and overlapped in a thickness direction of the wiring board.

14. The electronic device according to claim 13, wherein: the wiring board is provided with a plurality of three-phase inverter circuits to which the plurality of semiconductor modules are applied as an upper arm and a lower arm of each phase.

15. The electronic device according to claim 1, wherein: the plurality of semiconductor modules are applied to an inverter circuit as a semiconductor module including an entire upper arm or an entire lower arm of each phase of the inverter circuit.

16. The electronic device according to claim 1, wherein: a surface of one of the plurality of semiconductor modules facing the wiring board is covered with the resin mold.

17. The electronic device according to claim 1, wherein:
the resin mold is in contact with the housing via a heat radiation member arranged between the resin mold and the housing; and
the heat radiation member has a thermal conductivity equal to or higher than a thermal conductivity of the resin mold.

18. The electronic device according to claim 1, wherein:
the electronic device is mounted on an electric power steering system.

* * * * *